(12) United States Patent
Suzuki

(10) Patent No.: US 9,641,784 B2
(45) Date of Patent: May 2, 2017

(54) IMAGING DEVICE

(71) Applicant: RENESAS ELECTRONICS CORPORATION, Tokyo (JP)

(72) Inventor: Atsushi Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/946,545

(22) Filed: Nov. 19, 2015

(65) Prior Publication Data

US 2016/0165163 A1    Jun. 9, 2016

(30) Foreign Application Priority Data

Dec. 3, 2014    (JP) .................................. 2014-244925

(51) Int. Cl.
*H04N 5/378* (2011.01)
*H04N 5/369* (2011.01)
*H04N 5/363* (2011.01)
*H04N 5/3745* (2011.01)
*H01L 27/146* (2006.01)

(52) U.S. Cl.
CPC ....... *H04N 5/378* (2013.01); *H01L 27/14609* (2013.01); *H01L 27/14641* (2013.01); *H04N 5/363* (2013.01); *H04N 5/3698* (2013.01); *H04N 5/37457* (2013.01)

(58) Field of Classification Search
CPC ......... H01L 27/14609; H01L 27/14643; H01L 27/14603; H01L 27/14612; H01L 27/14641; H01L 27/14605; H01L 27/14812; H01L 27/14806; H04N 5/37452; H04N 5/37457; H04N 5/3559; H04N 5/3745; H04N 5/347; H04N 5/374
See application file for complete search history.

(56) References Cited

U.S. PATENT DOCUMENTS

| | | | |
|---|---|---|---|
| 7,518,143 B2* | 4/2009 | Sugawa | H01L 27/14603 257/233 |
| 7,550,793 B2* | 6/2009 | Itano | H01L 27/14603 257/239 |
| 7,990,449 B2* | 8/2011 | Fossum | H01L 27/14609 348/294 |
| 8,120,016 B2* | 2/2012 | Sugawa | H01L 27/14603 257/192 |
| 8,184,191 B2* | 5/2012 | Sugawa | H04N 3/1568 257/290 |
| 8,441,565 B2* | 5/2013 | Suzuki | H01L 27/14609 348/230.1 |

(Continued)

FOREIGN PATENT DOCUMENTS

JP    2010212769 A    9/2010

*Primary Examiner* — Michael Osinski
(74) *Attorney, Agent, or Firm* — McDermott Will & Emery LLP

(57) ABSTRACT

An object of the present invention is to reduce capacitance of a charge accumulation part (floating diffusion) of each pixel unit. In an imaging device, in addition to a plurality of first switching transistors for coupling a plurality of coupling wires extending in the column direction, a second switching transistor is provided between each of the coupling wires and a floating diffusion in each pixel unit. Preferably, the gate of the first switching transistor and the gate of the second switching transistor are electrically coupled to each other.

15 Claims, 29 Drawing Sheets

(56) References Cited

U.S. PATENT DOCUMENTS

| | | | |
|---|---|---|---|
| 9,123,610 B2* | 9/2015 | Hashimoto | H01L 27/14603 |
| 9,343,500 B2* | 5/2016 | Mabuchi | H04N 5/363 |
| 9,357,148 B2* | 5/2016 | Itonaga | H01L 27/14603 |
| 2003/0214591 A1* | 11/2003 | Kakumoto | H04N 5/378 348/243 |
| 2005/0218436 A1* | 10/2005 | Yamaguchi | H01L 27/14609 257/292 |
| 2006/0158542 A1* | 7/2006 | Mizuno | G01J 1/46 348/308 |
| 2007/0035649 A1* | 2/2007 | McKee | H01L 27/14609 348/308 |
| 2007/0046796 A1* | 3/2007 | McKee | H01L 27/14603 348/294 |
| 2009/0045319 A1* | 2/2009 | Sugawa | H01L 27/14609 250/208.1 |
| 2009/0295973 A1* | 12/2009 | Oshikubo | H04N 5/3559 348/311 |
| 2010/0039545 A1* | 2/2010 | Ishiwata | H01L 27/14603 348/308 |
| 2010/0118167 A1* | 5/2010 | Johnson | H04N 5/3745 348/294 |
| 2010/0134664 A1* | 6/2010 | Kuroda | H04N 5/3741 348/280 |
| 2010/0225795 A1* | 9/2010 | Suzuki | H01L 27/14609 348/300 |
| 2011/0084197 A1* | 4/2011 | Sugawa | H04N 5/378 250/208.1 |
| 2011/0234873 A1* | 9/2011 | Yamakawa | H01L 27/14603 348/300 |
| 2012/0132787 A1* | 5/2012 | Mabuchi | H04N 5/363 250/208.1 |
| 2012/0312964 A1* | 12/2012 | Yamashita | H04N 5/37457 250/208.1 |
| 2013/0049082 A1* | 2/2013 | Kato | H04N 5/3745 257/292 |
| 2013/0215305 A1* | 8/2013 | Yamashita | H04N 5/37457 348/301 |
| 2013/0264468 A1* | 10/2013 | Kobayashi | H01L 27/14812 250/208.1 |
| 2016/0104732 A1* | 4/2016 | Kobayashi | H01L 27/14612 250/208.1 |

* cited by examiner

IMAGING DEVICE

CROSS REFERENCE TO RELATED APPLICATION

The disclosure of Japanese Patent Application No. 2014-244925 filed on Dec. 3, 2014 including the specification, drawings and abstract is incorporated herein by reference in its entirety.

The present invention relates to an imaging device and, for example, is preferably used for a CMOS (Complementary Metal-Oxide Semiconductor) image sensor.

BACKGROUND

As a technique for widening a dynamic range while maintaining high picture quality in a CMOS image sensor, for example, the technique described in Japanese Unexamined Patent Application Publication No. 2010-212769 (patent literature 1) is known.

In the technique of the literature, floating diffusions (charge accumulation parts) in adjacent pixel units are coupled via a coupling transistor. By switching the coupling transistor to an on state or an off state according to an exposure amount, the capacitance of the charge accumulation parts is changed.

Patent Literature 1: JP 2010-212769

SUMMARY

In the technique described in the above-described Japanese Unexamined Patent Application Publication No. 2010-212769 (patent literature 1), a coupling wire for coupling adjacent pixel units is always coupled to a floating diffusion. Therefore, since the capacitance of the coupling wire is added to the capacitance of the floating diffusion, there is a problem that ISO speed cannot be sufficiently increased at the time of low-luminous-intensity imaging.

Other problems and novel characteristics will become apparent from the description of the specification and attached drawings.

In an imaging device according to an embodiment, in addition to a plurality of first switching transistors for coupling a plurality of coupling wires extending in the column direction, a second switching transistor is provided between each of the coupling wires and a floating diffusion in each pixel unit. Preferably, the gate of the first switching transistor and the gate of the second switching transistor are electrically coupled to each other.

According to the embodiment, the capacitance of a charge accumulation part (floating diffusion) in each pixel unit can be reduced.

DETAILED DESCRIPTION

Figure 1:
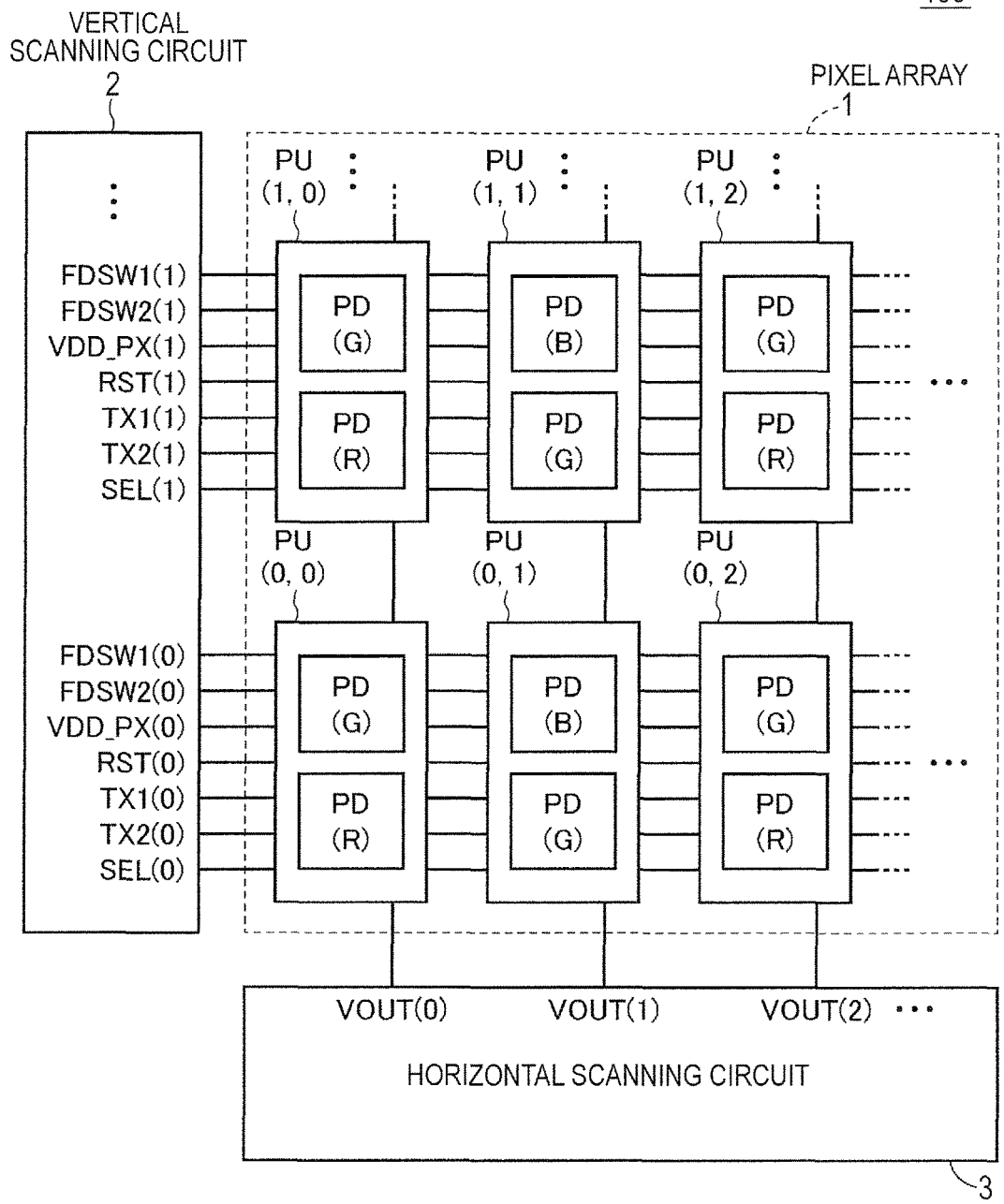
FIG. 1 is a block diagram illustrating the configuration of an imaging device according to a first embodiment.

Hereinbelow, embodiments will be described specifically with reference to the drawings. The same reference numeral is designated to the same or corresponding part and its description will not be repeated.

First Embodiment

General Configuration of Imaging Device

FIG. 1 is a block diagram illustrating the configuration of an imaging device according to a first embodiment. With reference to FIG. 1, an imaging device 100 includes a pixel array 1, a vertical scanning circuit 2, a horizontal scanning circuit 3, a plurality of control signal lines FDSW1, FDSW2, RST, TX1, TX2, and SEL, a plurality of power supply lines VDD_PX, and a plurality of output signal lines VOUT.

The pixel array 1 includes a plurality of pixel units PU arranged in a matrix and operates using the pixel unit PU as a unit. A pixel unit in the n-th row (n≥0) and the x-th column (x≥0) is described as a PU (n, x). Each pixel unit PU includes at least one photodiode PD (photoelectric conversion element) arranged in the column direction. FIG. 1 illustrates the case where each pixel unit PU includes two photodiodes arranged in the column direction.

The control signal lines FDSW1, FDSW2, RST, TX1, TX2, and SEL and the power supply line VDD_PX extend in the row direction of the pixel array 1 and are provided for each of the rows of the pixel array 1 and commonly used by a plurality of pixel units arranged in the row direction. In the present specification, for example, a control signal line coupled to the pixel unit PU in the n-th row is indicated by adding (n) to the end of the reference numeral. The vertical scanning circuit 2 controls operation of reading from each of the pixels by outputting a control signal to each of the control signal lines FDSW1, FDSW2, RST, TX1, TX2, and SEL.

The output signal line VOUT extends in the column direction of the pixel array 1 and is provided for each of the columns of the pixel array 1 and provided commonly to a plurality of pixel units arranged in the column direction. In the present specification, for example, an output signal line VOUT(x) coupled to the pixel unit PU in the x-th column is written as VOUT(x). The output signal line VOUT is coupled to the horizontal canning circuit 3 and amplification and A/D (Analog to Digital) conversion is performed on a signal read from each of the pixels by the horizontal scanning circuit 3.

In the case of using the imaging device 100 for a color image, a color filter is provided on the photoreception plane of the photodiode PD. As illustrated in FIG. 1, in the array of a color filter of a general Bayer method, color filters of green (G) having a high ratio of contributing to a luminance signal are arranged in a checkered pattern. In the remaining parts, color filters of red (R) and blue (B) are arranged in a checkered pattern.

Configuration of Pixel Unit

Figure 2:
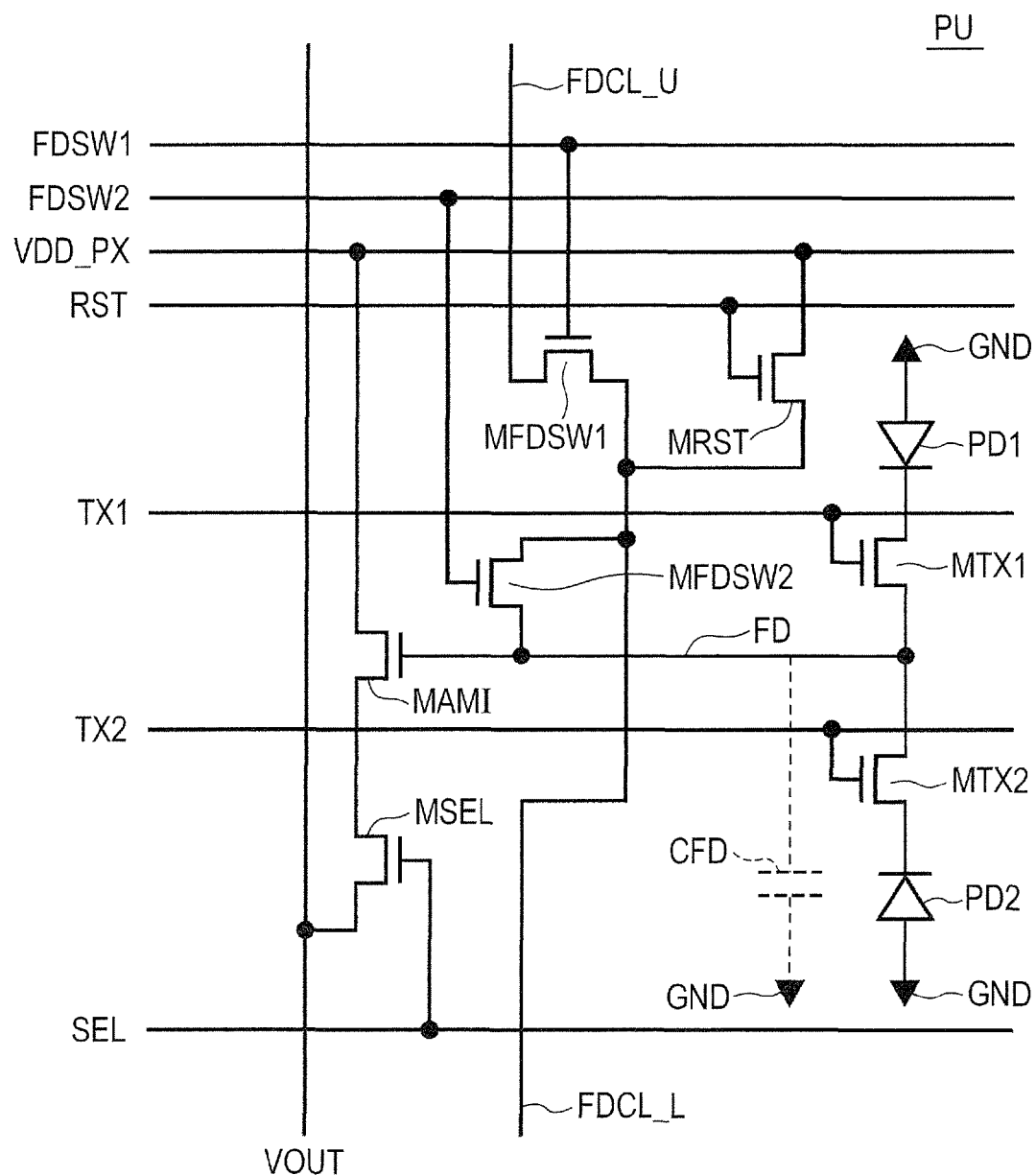
FIG. 2 is an equivalent circuit diagram illustrating a pixel unit in FIG. 1.

FIG. 2 is an equivalent circuit diagram illustrating a pixel unit in FIG. 1. FIG. 2 illustrates one pixel unit PU coupled to the control signal lines FDSW1, FDSW2, RST, TX1, TX2, and SEL and the output signal line VOUT in FIG. 1.

The pixel unit PU includes two photodiodes PD1 and PD2, two transfer transistors MTX1 and MTX2, a reset transistor MRST, an amplification transistor MAMI, and a selection transistor MSEL. The pixel unit PU further includes a floating diffusion FD (also called a charge accumulation part), floating diffusion coupling lines FDCL_U and FDCL_L (also described as FD coupling lines), and floating diffusion switching transistors MFDSW1 and MFDSW2 (also described as FD switching transistors). The FD coupling lines FDCL_U and FDCL_L are commonly shared by upper and lower pixel units PU in the column direction.

The photodiodes PD1 and PD2 are constructed as PN junction diodes and generate charges (electrons) in accordance with light received. The generated charges are accumulated in an impurity region of the N type in the PN junction diode. An impurity region of the P type as the anode of the photodiode PD is grounded.

The floating diffusion FD is an N-type impurity region and its impurity density is higher than that of the N-type impurity region (also called as an N layer) of the photodiodes PD1 and PD2. The floating diffusion FD is coupled to the cathodes (N layers) of the photodiodes PD1 and PD2 via the transfer transistors MTX1 and MTX2, respectively, constructed as NMOS (N-channel Metal-Oxide Semiconductor) transistors. The gates of the transfer transistors MTX1 and MTX2 are coupled to the control signal lines TX1 and TX2, respectively.

The floating diffusion FD is further coupled to the FD coupling line FDCL_L or FDCL_U via the FD switching transistor MFDSW2 (in the case of FIG. 2, it is coupled to the FD coupling line FDCL_L). The FD coupling line FDCL_L is provided between the floating diffusion FD and a floating diffusion in a pixel unit PU adjacent on the lower side in the column direction, and the FD coupling line FDCL_U is provided between the floating diffusion FD and a floating diffusion FD in a pixel unit PU adjacent on the upper side in the column direction. The adjacent FD coupling lines FDCL_U and FDCL_L are coupled to each other via the FD switching transistor MFDSW1. The FD switching transistors MFDSW1 and MFDSW2 are coupled to the control signal lines FDSW1 and FDSW2, respectively.

The reset transistor MRST is coupled between the FD coupling line FDCL_L or FDCL_U and the power supply line VDD_PX. In the case of FIG. 2, it is coupled between the FD coupling line FDCL_L to which the FD switching transistor MFDSW2 is coupled and the power supply line VDD_PX. The gate of the reset transistor MRST is coupled to the control signal line RST.

The amplification transistor MAMI is configured as an NMOS transistor and functions as a source follower circuit. The gate of the amplification transistor MAMI is coupled to the floating diffusion FD and the drain is coupled to the power supply line VDD_PX. The source of the amplification transistor MAMI is coupled to the output signal line VOUT via the selection transistor MSEL configured as an NMOS transistor. The gate of the selection transistor MSEL is coupled to the control signal line SEL.

The above configuration is characterized by a point that the FD switching transistor MFDSW2 is provided between the floating diffusion FD and the FD coupling line FDCL_L. By the point, capacitance CFD of the floating diffusion FD can be isolated from the capacitance of the FD coupling line FDCL_L. Further, it is characterized by a point that the reset transistor MRST is coupled to the FD coupling line FDCL_L in place of the floating diffusion FD. By the point, the capacitance of the floating diffusion FD can be reduced only by the amount of the source region of the reset transistor MRST.

Operation of Pixel Unit

Figure 3A:
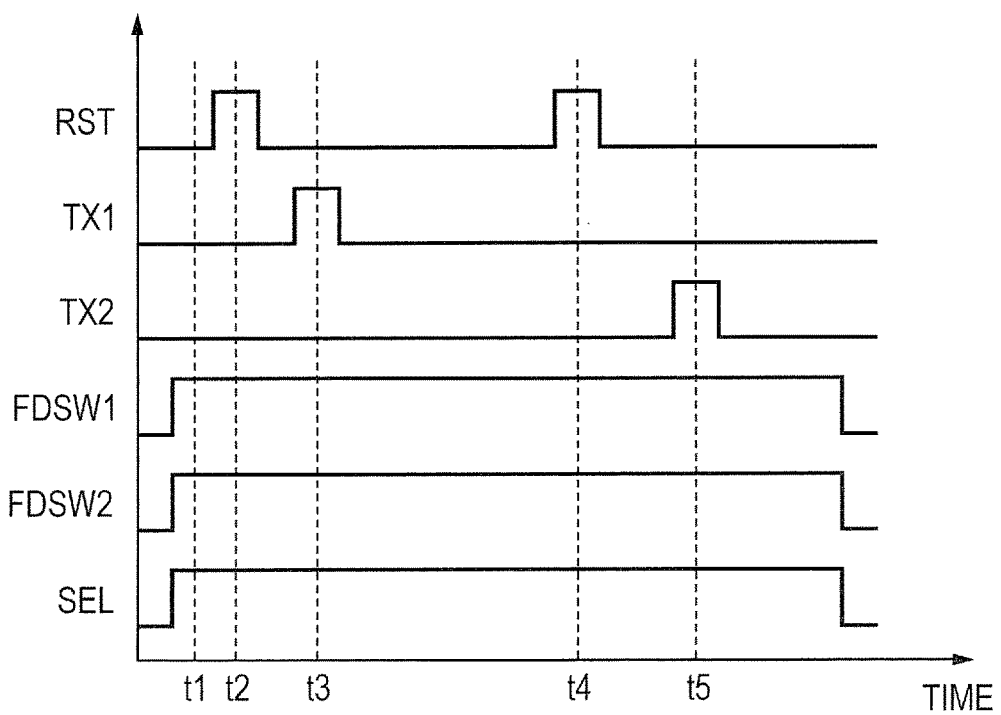
FIGS. 3A and 3B are timing charts illustrating a reading operation of the pixel unit of FIG. 2.
Figure 3B:
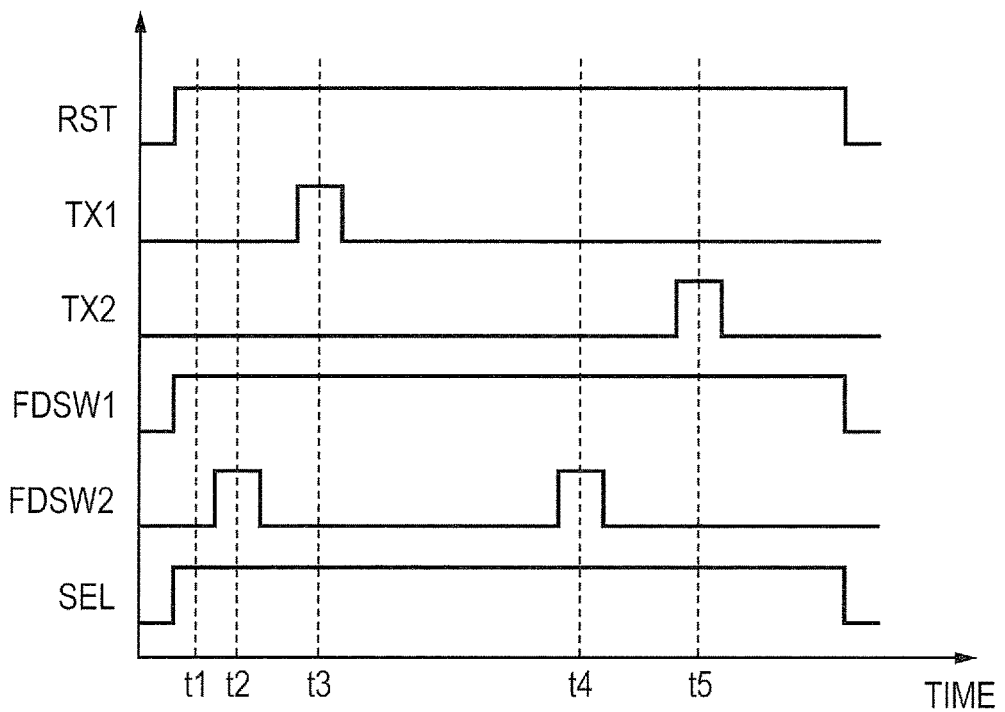

FIGS. 3A and 3B are timing charts illustrating a reading operation of the pixel unit of FIG. 2. In the case of the first embodiment, the reading operation is performed in two kinds of operation modes; an FDSW2-on mode and an FDSW2-off mode.

In the FDSW2-on mode illustrated in FIG. 3A, by setting the FD switching transistor MFDSW2 to the on state, signal reading is performed in a state where the floating diffusion FD and the FD coupling line FDCL_L are coupled. By the operation, the capacitance of the FD coupling line FDCL_L is added to the capacitance CFD of the floating diffusion FD, so that imaging with low ISO speed becomes possible at relatively low luminous intensity. In this sense, the FDSW2-on mode is also called a high-luminous-intensity imaging mode.

When the FD switching transistor MFDSW1 is set to the on state, the capacitance of the FD coupling line FDCL_U is also added to the capacitance CFD of the floating diffusion FD. Consequently, imaging at lower ISO speed becomes possible. By setting the FD switching transistor MFDSW1 of the adjacent pixel unit PU to the on state, the capacitance of the FD coupling line FDCL added to the capacitance of the floating diffusion FD can be further increased.

On the other hand, in the FDSW2-off mode illustrated in FIG. 3B, by setting the FD switching transistor MFDSW2 to the off state, the floating diffusion FD is disconnected from the FD coupling line FDCL_L. It can realize imaging at high ISO speed when illuminous intensity is low. In this case, the amplification factor of an amplifier at the first stage can be made high, so that noise reduction effect can be also expected. The FDSW2-off mode is also called a low-luminous-intensity imaging mode.

Hereinbelow, the operations of the pixel unit in the operation modes will be described in time order. In FIGS. 3A and 3B, voltage waveforms of the control signal lines RST, TX1, TX2, FDSW1, FDSW2, and SEL are illustrated in order from the top.

1. Case in FDSW2-on Mode, that is, High-luminous-Intensity Imaging Mode

With reference to FIGS. 2 and 3A, the reading operation in the FDSW2-on mode will be described.

At time t1, the vertical scanning circuit 2 sets the voltage of the control signal lines FDSW1 and FDSW2 to the H level, thereby coupling the capacitance of the FD coupling lines FDCL_L and FDCL_U to the capacitance of the floating diffusion FD. At time t1, the vertical scanning circuit 2 further sets the voltage of the control signal line SEL to the high level (H level), thereby selecting a pixel unit PU in a row as a signal reading object. The voltage of the control signal lines FDSW1, FDSW2, and SEL is always set to the H level in the reading operation.

At the next time t2, the vertical scanning circuit 2 sets the voltage of the control signal line RST to the H level, thereby resetting the voltage of the floating diffusion FD and the FD coupling lines FDCL_L and FDCL_U (to be equal to the power supply voltage VDD). By the operation, the reset level (dark-time level) of the potential of the floating diffusion FD is determined. The potential at the dark-time level is output to the horizontal scanning circuit 3 via the output signal line VOUT of each column.

The vertical scanning circuit 2 resets the voltage of the control signal line RST to the L level and, after that, sets the voltage of the control signal line TX1 to the H level, thereby transferring electrons accumulated in the photodiode PD1 to the floating diffusion FD. Consequently, the potential of the floating diffusion FD changes in proportion to the number of electrons accumulated in the photodiode PD1, thereby changing from the reset level to the signal level of the photodiode PD1 (PD signal level). After the transfer, the voltage of the control signal line TX1 is reset to the L level. The PD signal level is output to the horizontal scanning circuit 3 via the output signal line VOUT.

At the following time t4, to read a signal of the photodiode PD2, the vertical scanning circuit 2 sets the voltage of the control signal line RST to the H level, thereby resetting the voltage of the floating diffusion FD and the FD coupling lines FDCL_L and FDCL_U. In such a manner, the reset level of the potential of the floating diffusion FD is determined.

The vertical scanning circuit 2 resets the voltage of the control signal line RST to the L level and, at the following time t5, sets the voltage of the control signal line TX2 to the H level, thereby transferring electrons accumulated in the photodiode PD2 to the floating diffusion FD. Consequently, the potential of the floating diffusion FD changes from the reset level to the signal level of the photodiode PD2. After the transfer, the voltage of the control signal line TX2 is reset to the L level. The PD signal level is output to the horizontal scanning circuit 3 via the output signal line VOUT row by row.

2. Case in FDSW2-Off Mode, that is, Low-luminous-Intensity Imaging Mode

With reference to FIGS. 2 and 3B, the operation in the FDSW2-off mode will be described.

At time t1, the vertical scanning circuit 2 sets the voltage of the control signal lines FDSW1 and RST to the H level, thereby setting the voltage of the FD coupling lines FDCL_L and FDCL_U to the power supply voltage VDD level. At time t1, the vertical scanning circuit 2 further sets the voltage of the control signal line SEL to the high level (H level), thereby selecting a pixel unit PU (that is, a row in the pixel array) as a signal reading object. The voltage of the control signal lines FDSW1, FDSW2, and SEL is always set to the H level in the reading operation.

At the next time t2, the vertical scanning circuit 2 sets the voltage of the control signal line FDSW2 to the H level, thereby resetting the voltage of the floating diffusion FD (to be equal to the power supply voltage VDD). By the operation, the reset level (dark-time level) of the potential of the floating diffusion FD is determined. The potential at the dark-time level is output to the horizontal scanning circuit 3 via the output signal line VOUT row by row.

The vertical scanning circuit 2 resets the voltage of the control signal line FDSW2 to the L level and, after that, sets the voltage of the control signal line TX1 to the H level at the following time t3, thereby transferring electrons accumulated in the photodiode PD1 to the floating diffusion FD. Consequently, the potential of the floating diffusion FD changes from the reset level to the signal level of the photodiode PD1 (PD signal level). After the transfer, the voltage of the control signal line TX1 is reset to the L level. The PD signal level is output to the horizontal scanning circuit 3 via the output signal line VOUT row by row.

At the following time t4, to read a signal of the photodiode PD2, the vertical scanning circuit 2 sets the voltage of the control signal line FDSW2 to the H level, thereby resetting the voltage of the floating diffusion FD. In such a manner, the reset level of the potential of the floating diffusion FD is determined.

The vertical scanning circuit 2 resets the voltage of the control signal line FDSW2 to the L level and, at the following time t5, sets the voltage of the control signal line TX2 to the H level, thereby transferring electrons accumulated in the photodiode PD2 to the floating diffusion FD. Consequently, the potential of the floating diffusion FD changes from the reset level to the signal level of the photodiode PD2. After the transfer, the voltage of the control signal line TX2 is reset to the L level. The PD signal level is output to the horizontal scanning circuit 3 via the output signal line VOUT row by row.

The characteristic of the FDSW2-off mode in comparison to the FDSW2-on mode is as follows. In the FDSW2-on mode, to reset the floating diffusion FD, the voltage of the control signal line RST is switched from the low level (L level) to the H level. On the other side, in the FDSW2-off mode, the voltage of the control signal line RST is always set to the H level. By switching the voltage of the control signal line FDSW2 in place of the control signal line RST from the L level to the H level, the floating diffusion FD is reset. That is, in the FDSW2-off mode, the role of resetting the floating diffusion FD is played by the FD switching transistor MFDSW2, not the reset transistor MRST.

Layout of Pixel Unit

Figure 4:
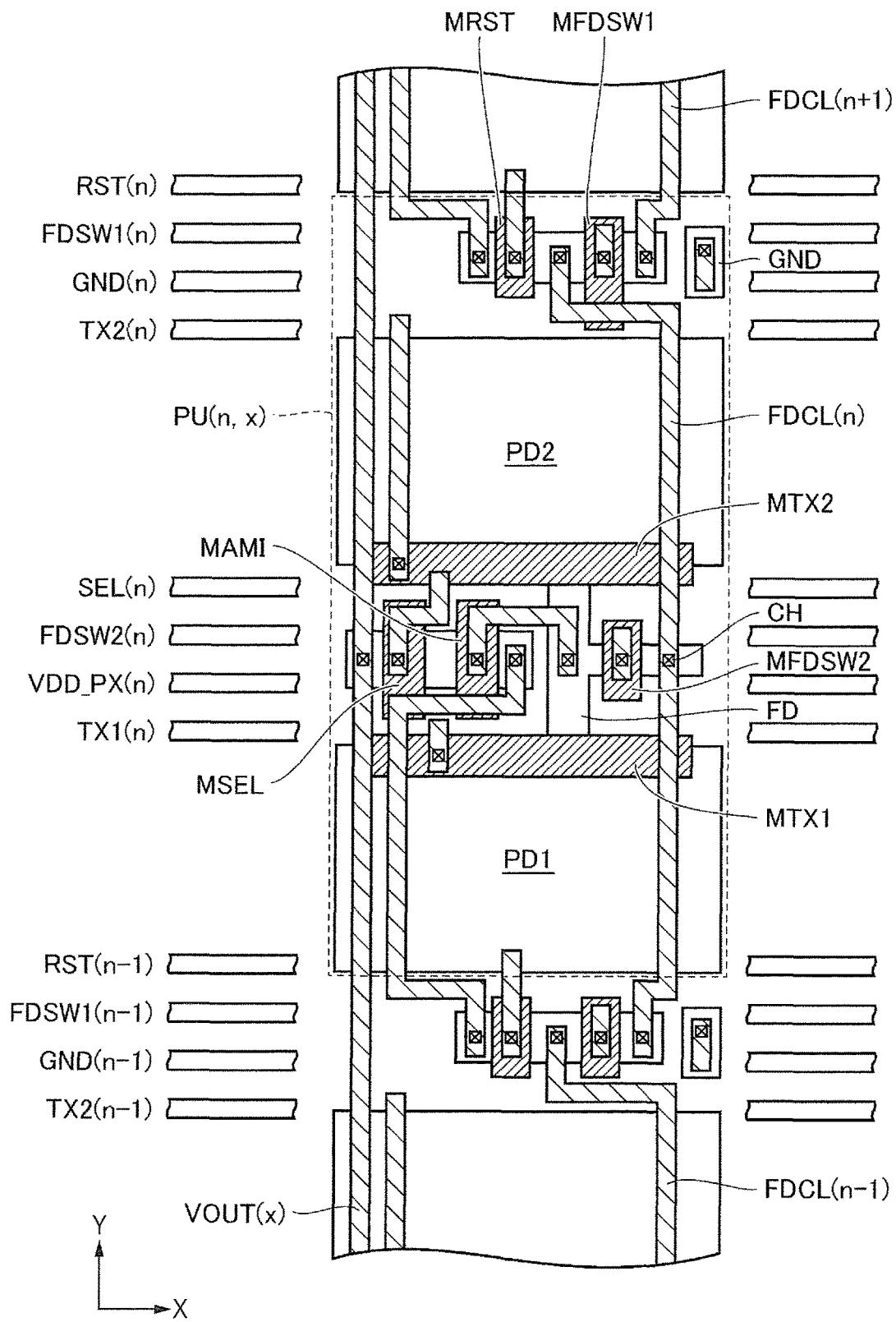
FIG. 4 is a plan view schematically illustrating a layout of a pixel unit from a substrate to a first metal wiring layer in the first embodiment.
Figure 5:
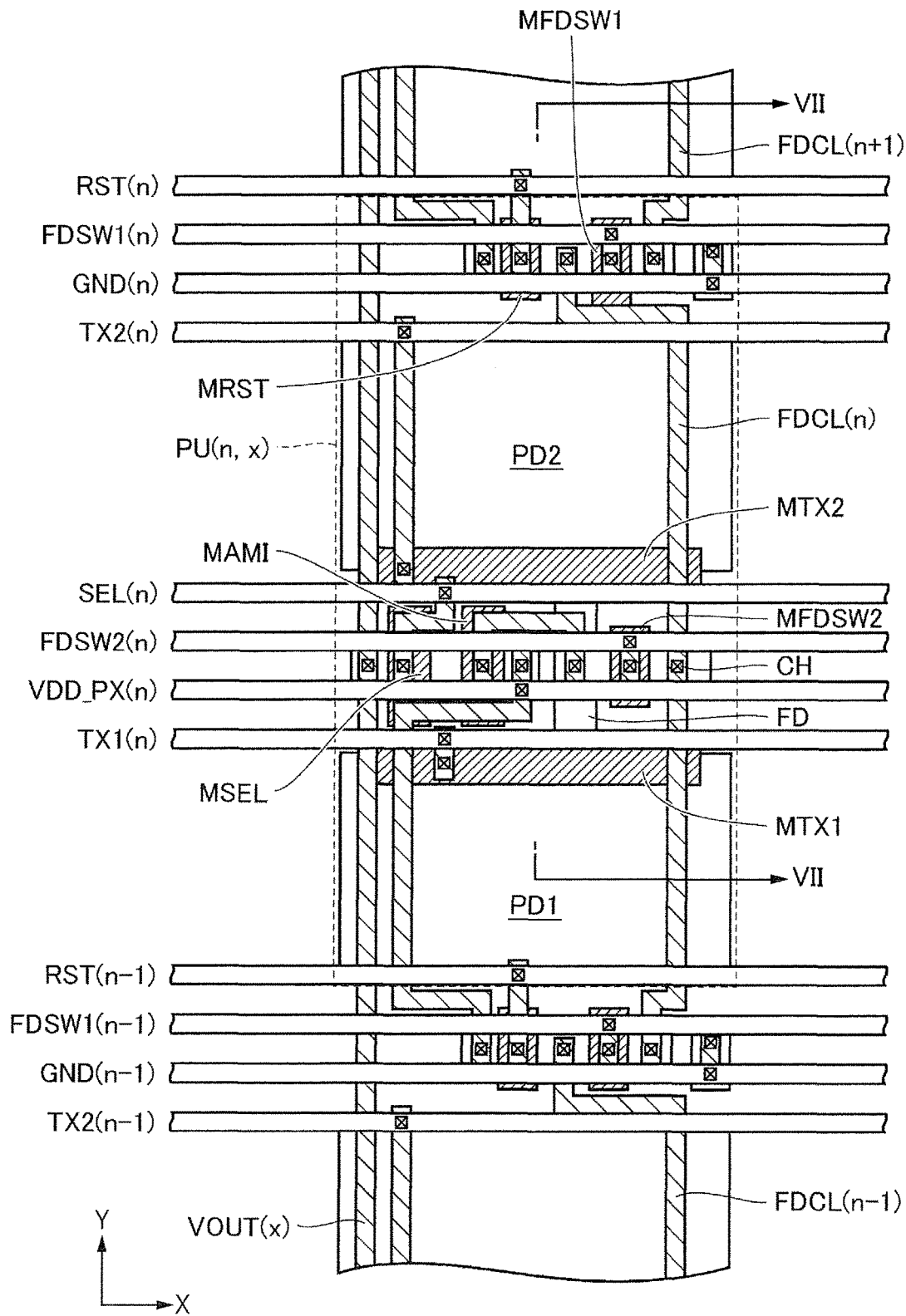
FIG. 5 is a plan view schematically illustrating a layout of a pixel unit from a substrate to a second metal wiring layer in the first embodiment.
Figure 6:
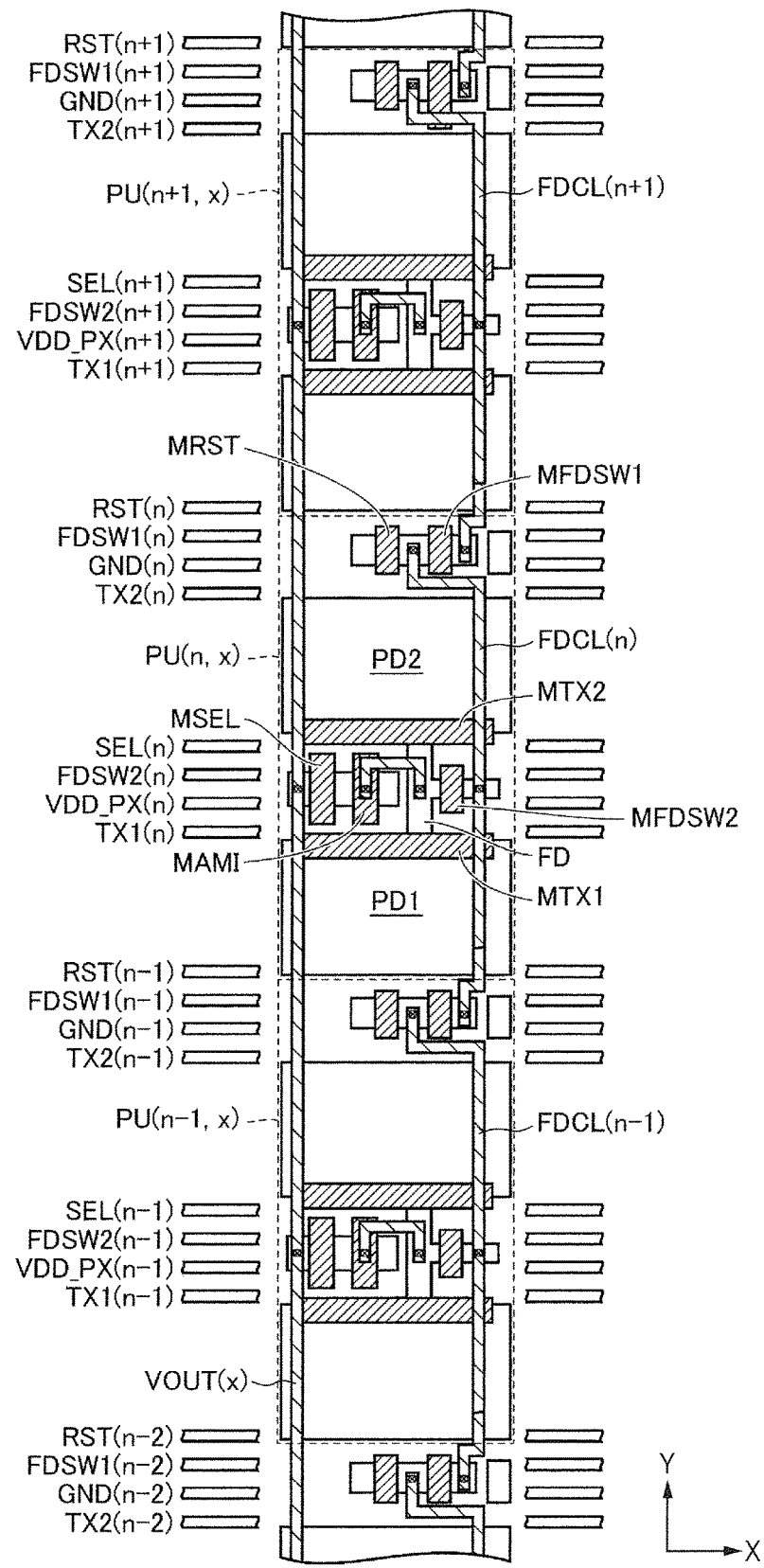
FIG. 6 is a plan view schematically illustrating a layout from a substrate to a first metal wiring layer of three pixel units adjacent in the column direction in the first embodiment.

FIG. 4 is a plan view schematically illustrating a layout of a pixel unit from a substrate to a first metal wiring layer in the first embodiment. In FIG. 4, only a schematic layout of the second metal wiring layer over the first metal wiring layer is illustrated. FIG. 5 is a plan view schematically illustrating a layout of a pixel unit from a substrate to a second metal wiring layer in the first embodiment. FIG. 6 is a plan view schematically illustrating a layout from a substrate to a first metal wiring layer of three pixel units adjacent in the column direction in the first embodiment. In FIG. 6, to facilitate graphic explanation, a part of the first metal wiring layer is not illustrated.

In FIGS. 4 to 6, the row direction of the pixel array is set as an X-axis direction, and the column direction is set as a Y-axis direction. In the case of discriminating upper and lower directions of the drawing sheet in the Y-axis direction, positive and negative signs are designated as +Y direction and −Y direction. The upper and lower directions are discriminated similarly also in the X-axis direction. Reference numerals expressing the NMOS transistors illustrated in FIG. 2 are designated to gate electrodes. To facilitate graphic explanation, the gate electrode layer and the first metal wiring layer are hatched.

Referring to FIGS. 4 to 6, the phototransistors PD1 and PD2 constructing the pixel unit PU(n, x) are arranged so as to be lined in the Y-axis direction. Between the phototransistors PD1 and PD2, an N-type impurity region is formed as a floating diffusion FD. A gate electrode for the transfer transistor MTX1 is formed so as to cover a channel region between the floating diffusion FD and the phototransistor PD1. Similarly, a gate electrode for the transfer transistor MTX2 is formed so as to cover a channel region between the floating diffusion FD and the phototransistor PD2.

The FD switching transistor MFDSW2 is arranged adjacent to the floating diffusion FD in the +X direction. The first impurity region of the FD switching transistor MFDSW2 is shared with the floating diffusion FD. A second impurity region in the FD switching transistor MFDSW2 is coupled to the FD coupling line FDCL(n) formed by the first metal wiring layer via a contact hole CH.

The amplification transistor MAMI and the selection transistor MSEL are arranged in order adjacent to the floating diffusion FD in the −X direction. The first impurity region in the amplification transistor MAMI and the first impurity region in the selection transistor MSEL are commonly used. The gate electrode of the amplification transistor MAMI is coupled to the floating diffusion FD via wiring of the first metal wiring layer. The second impurity region of the selection transistor MSEL is coupled to the output signal line VOUT(x) formed by the first metal wiring layer via the contact hole CH.

On the side opposite to the floating diffusion FD while sandwiching the phototransistor PD2 (that is, between the phototransistor PD2 of the pixel unit PU(n, x) and the phototransistor PD1 of the pixel unit PU(n+1, x)), the FD switching transistor MFDSW1 and the reset transistor MRST are arranged so as to be lined in the X-axis direction. The FD switching transistor MFDSW1 is arranged on the +X direction side. The first impurity region in the FD switching transistor MFDSW1 and the first impurity region in the reset transistor MRST are made common, and the FD coupling line FDCL(n) is coupled to the common impurity region via the contact hole CH. The second impurity region in the FD switching transistor MFDSW1 is coupled to the second impurity region in the FD switching transistor MFDSW2 provided for the pixel unit PU(n+1, x) adjacent in the +Y direction and the first impurity region in the FD switching transistor MFDSW1 via the FD coupling line FDCL(n+1). The second impurity region in the reset transistor MRST is coupled to the second impurity region in the amplification transistor MAMI provided for the pixel unit PU(n+1, x) adjacent in the +Y direction via a metal wire formed by the first metal wiring layer.

The control signal lines FDSW1(n), FDSW2(n), RST(n), TX1(n), TX2(n), and SEL(n), the power supply line VDD_PX(n), and a grounding wire GND(n) are formed by using a second metal wiring layer. The control signal lines FDSW1(n) and FDSW2(n) are coupled to the gate electrode of the FD switching transistor MFDSW1 and the gate electrode of the FD switching transistor MFSDW2, respectively, via a metal line formed by the first metal wiring layer. The control signal line RST(n) is coupled to the gate electrode of the reset transistor MRST via the metal line formed by the first metal wiring layer. The control signal lines TX1(n) and TX2(n) are coupled to the gate electrodes of the transfer transistors MTX1 and MTX2, respectively, via a metal line formed by the first metal wiring layer. The control signal line SEL(n) is coupled to the gate electrode of the selection transistor MSEL via a metal line formed by the first metal wiring layer.

The second impurity region in the reset transistor MRST provided for the pixel unit PU(n, x) is coupled to the second impurity region of the amplification transistor MAMI provided for the pixel unit PU(n+1, x) via a power supply line formed by the first metal wiring layer. This power supply line and the power supply line VDD_PX(n) are coupled via the contact hole CH. The grounding wire GND(n) is coupled to a P-type impurity region provided for the substrate via a metal line formed by the first metal wiring layer.

Figure 7:
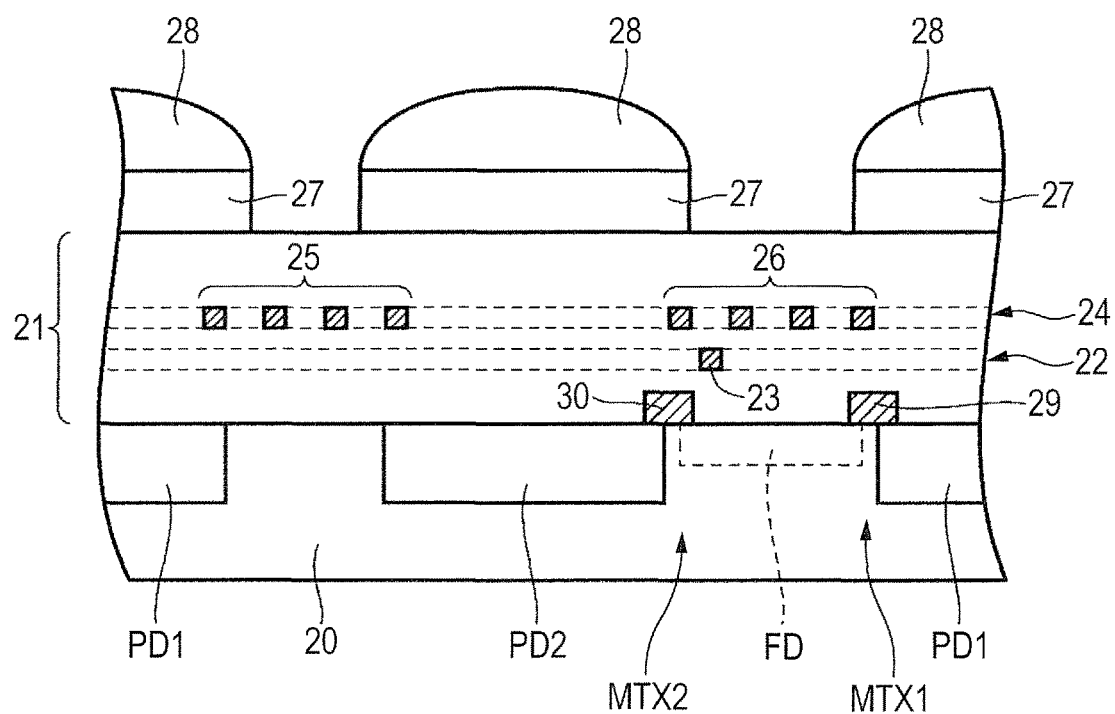
FIG. 7 is a cross section taken along line VII-VII in FIG. 5.

FIG. 7 is a cross section taken along line VII-VII in FIG. 5.

Referring to FIG. 7, in a semiconductor substrate 20, the photodiodes PD1 and PD2, the floating diffusion FD, and impurity regions (the source region and the drain region) of a not-illustrated transistor are formed.

An interlayer insulating layer 21 is formed on the semiconductor substrate 20, and a plurality of color filters 27 are formed on the interlayer insulating layer 21. Further, a plurality of micro lenses 28 are formed on the plurality of color filters 27. The color filters 27 and the micro lenses 28 are formed above the corresponding photodiode PD1 or PD2.

In the interlayer insulating layer 21, gate electrodes 29 and 30, a first metal wiring layer 22, and a second metal wiring layer 24 are formed in order from the side of the substrate 20. Between the gate electrodes 29 and 30 and a channel region, a not-illustrated gate insulating film is formed. A metal wire (such as 23) formed in the first metal wiring layer 22 is coupled to the floating diffusion FD or an impurity region or a gate electrode of a transistor via the contact hole CH which is not illustrated. Metal wires 25 and 26 formed in the second metal wiring layer 24 correspond to the control signal lines FDSW1(n), FDSW2(n), RST(n), TX1(n), TX2(n), SEL(n), power supply line VDD_PX(n), and the grounding wire GND(n). The metal wires 25 and 26 are coupled to a metal wire formed in the first metal wiring layer via the contact hole CH.

Effect of First Embodiment

In the imaging device of the first embodiment, the FD switching transistor MFDSW2 is formed between the floating diffusion FD and the FD coupling line FDCL. Further, the reset transistor MRST is provided between the power supply node VDD and the FD coupling line FDCL, not between the power supply node VDD and the floating diffusion FD. As a result, the capacitance CFD of the floating diffusion FD and the capacitance of the FD coupling line FDCL can be isolated, and the capacitance of the source region of the reset transistor MRST can be reduced from the capacitance CFD of the floating diffusion FD. Therefore, the conversion gain from a charge signal from the photodiode PD to a voltage signal can be increased, so that noise included in the voltage signal can be reduced.

Modification of First Embodiment

The FD switching transistor MFDSW1 does not always have to be provided for each pixel unit PU. Generally, a plurality of switching transistors MFDSW1 are provided in correspondence to at least a part of the plurality of pixel units PU provided for each of the columns. In this case, the plurality of FD coupling lines FDCL extending in the column direction are coupled by the switching transistor MFDSW1. The FD switching transistor MFDSW2 provided for each pixel unit PU is coupled between any of the plurality of FD coupling lines provided in the same column and the floating diffusion FD.

In the case of the above configuration, the reset transistor MRST does not always have to be provided for each pixel unit PU but may be provided in correspondence with each of the plurality of FD coupling lines FDCL.

Second Embodiment

In a second embodiment, during a reading period by exposure of once, both of a read signal in the FDSW2-on mode (high-luminous-intensity imaging mode) in the first embodiment and a read signal in the FDSW2-off mode (low-luminous-intensity imaging mode) are detected. Therefore, there is an advantage that it is unnecessary to set an operation mode in accordance with illuminous intensity of light from a subject in advance.

Configuration of Pixel Array

Figure 8:
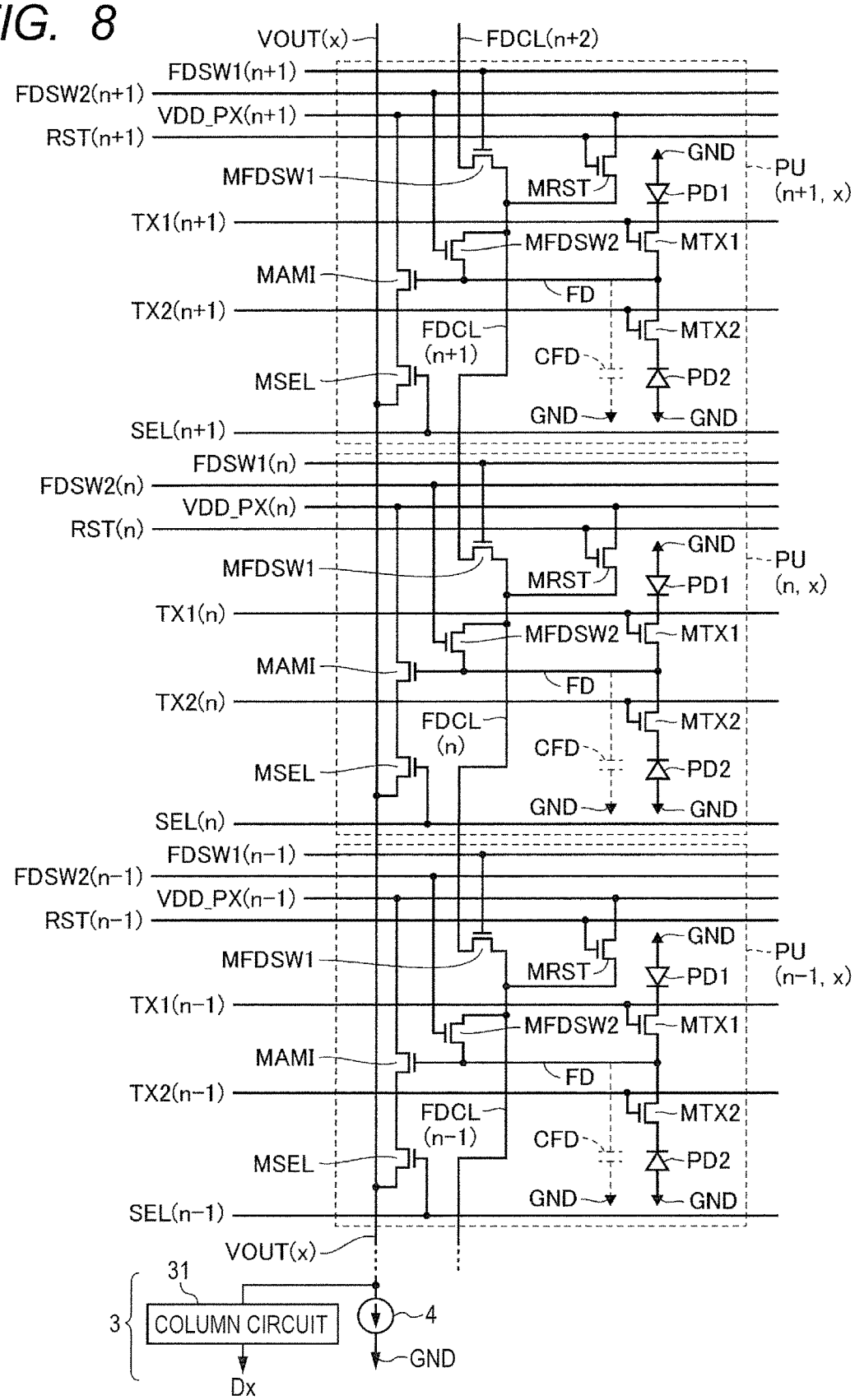
FIG. 8 is a circuit diagram illustrating the configuration of the x-th column in a pixel array in an imaging device according to a second embodiment.

FIG. 8 is a circuit diagram illustrating the configuration of the x-th column in a pixel array in an imaging device according to a second embodiment. In FIG. 8, a circuit diagram of three pixel units PU(n−1, x), PU(n, x), and PU(n+1, x) adjacent in the column direction is representatively illustrated. Since the circuit configuration of each of the pixel units is the same as that in the case of the first embodiment, its description will not be repeated. In FIG. 8, an FD coupling line coupled to the floating diffusion FD provided for the PU(n, x) in the n-th row via the FD switching transistor MFDSW2 is written as FDCL(n).

In the imaging device of FIG. 8, a further detailed configuration of the horizontal scanning circuit 3 is illustrated. Concretely, the horizontal scanning circuit 3 is provided for each of the columns of the pixel array 1, and includes a constant current circuit 4 and a column circuit 31 coupled to the output signal line VOUT(x). The output signal line VOUT(x) of each column is coupled to the grounding node GND via the constant current circuit 4.

Configuration of Column Circuit

Figure 9:
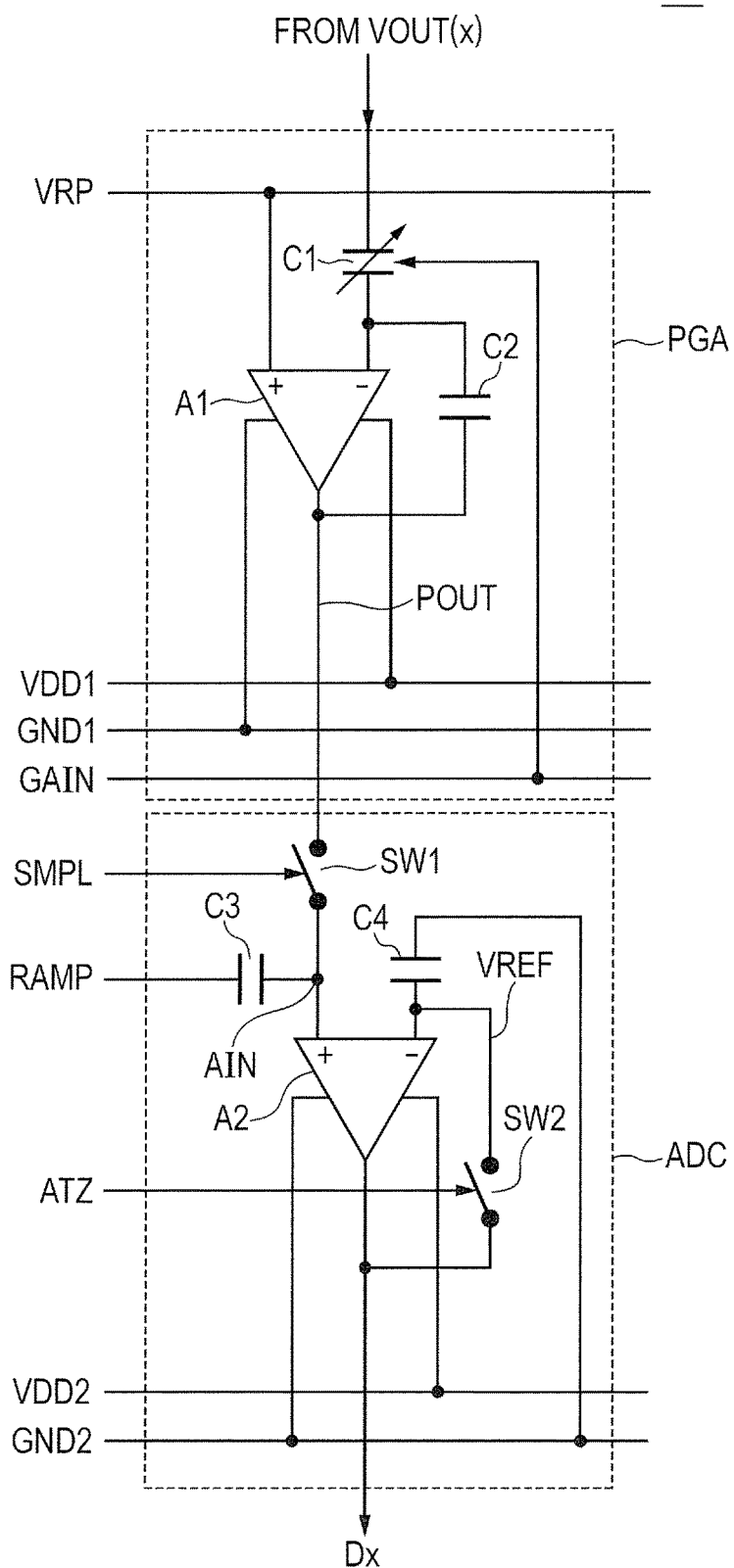
FIG. 9 is a circuit diagram illustrating the configuration of a column circuit in FIG. 8.

FIG. 9 is a circuit diagram illustrating the configuration of the column circuit in FIG. 8.

The column circuit 31 converts an analog signal output from the pixel unit PU(n, x) via the output signal line VOUT(x) to a digital signal Dx and outputs the digital signal Dx. The column circuit 31 has a programmable gain amplifier PGA and an A/D (Analog to Digital) converting circuit ADC. The A/D converting circuit ADC is a single slope integration type A/D converting circuit.

1. Configuration and Operation of Programmable Gain Amplifier PGA

The programmable gain amplifier PGA includes an input capacitance C1, a feedback capacitance C2, and a differential amplifier A1. To the differential amplifier A1, the power supply voltage VDD1 and the power supply voltage GND1 are applied. To the positive input terminal of the differential amplifier A1, a PGA reference voltage VRP is applied. One end of the input capacitance C1 is coupled to the output signal line VOUT, and the other end of the input capacitance C1 is coupled to the negative input terminal of the differential amplifier A1.

The gain of the differential amplifier A1 is determined by the ratio between the value of the input capacitance C1 and the value of the feedback capacitance C2. An output signal of the pixel unit PU applied to one end of the input capacitance C1 is amplified by the differential amplifier A1 and is output as a PGA output signal POUT to the A/D converting circuit ADC. Gain adjustment of the differential amplifier A1 can be performed by changing the value of the feedback capacitance C2 with the PGA gain setting signal GAIN in place of changing the value of the input capacitance C1 with the PGA gain setting signal GAIN. The setting gain of the differential amplifier A1 is generally set by a not-illustrated DSP (Digital Signal Processor) coupled to the post stage of the column circuit 31 on the basis of data of a 1-frame period (refer to FIG. 5 which will be described later) which is output before.

2. Configuration and Operation of A/D Converting Circuit ADC

The A/D converting circuit ADC includes capacitances C3 and C4, a comparator A2, and switches SW1 and SW2. To the comparator A2, power supply voltages VDD2 and the GND2 are applied.

To a positive input terminal AIN of the comparator A2, the PGA output signal POUT is applied via the switch SW1. The conduction state of the switch SW1 is controlled by a sampling signal SMPL. To the positive input terminal AIN of the comparator A2, further, one end of the capacitance C3 is coupled. To the other end of the capacitance C3, a ramp signal RAMP is applied.

One end of the capacitance C4 is coupled to the negative input terminal of the comparator A2, and the power supply voltage GND2 is applied to the other end of the capacitance C4. To the negative input terminal of the comparator A2, further, an output of the comparator A2 is applied via the switch SW2. The conduction state of the switch SW2 is controlled by an auto zero signal ATZ. By setting the switch SW2 to the conduction state by the auto zero signal ATZ and setting reference voltage in the negative input terminal of the comparator A2 before applying a PGA output signal POUT to the positive input terminal AIN of the comparator A2, offset of the A/D converting circuit ADC is removed.

After removal of the offset of the A/D converting circuit ADC, the switch SW1 is set to the conduction state for a predetermined time, and charges corresponding to the voltage of the PGA output terminal POUT are stored in one end of the capacitance C3 coupled to the positive input terminal AIN of the comparator A2. In this period, the voltage of the ramp signal RAMP applied to the other end of the capacitance C3 is maintained at a predetermined level. After that, the switch SW1 is set to a non-conduction state, and the PGA output signal POUT is shifted to a high potential side by the ramp signal RAMP and is further swept at a predetermine gradient. When the voltage of the PGA output signal POUT shifted to the high potential side by the ramp signal RAMP and reference voltage which is set in the negative input terminal of the comparator A2 match, the logic level of the output signal Dx of the A/D converting circuit ADC is inverted.

By the above process, the A/D converting circuit ADC converts the PGA output signal POUT to a pulse waveform. The pulse waveform is generated since the time when the PGA output signal POUT is shifted to the high potential side by the ramp signal RAMP to the time when the PGA output signal POUT shifted to the high potential side matches the reference voltage.

The time in which the pulse waveform is generated is measured by a counter which is not illustrated in FIG. 9. By holding the count value, a signal output from the pixel unit PU is converted to a digital signal.

Rolling Shutter Method

Figure 10:
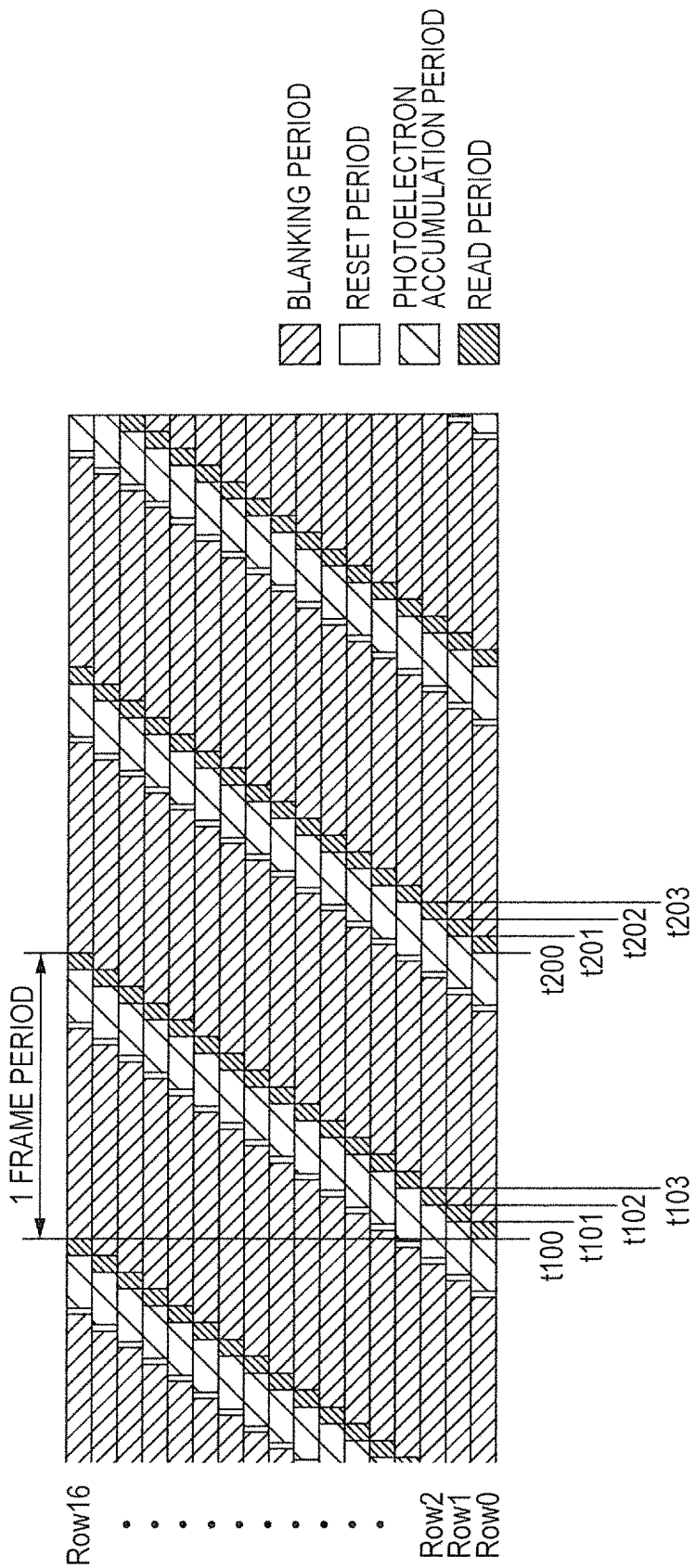
FIG. 10 is a timing chart for explaining reading operation by a rolling shutter method.

FIG. 10 is a timing chart for explaining reading operation by a rolling shutter method.

The timing chart of FIG. 10 illustrates the case of reading data of each of pixel units PU by the rolling shutter method with one exposure. To simplify explanation, it is assumed that, in the pixel array 1 illustrated in FIG. 1, (N+1) pixel units arranged per row are arranged in total 17 rows from the zero-th row (Row0) to the 16th row (Row16) are arranged.

As illustrated in FIG. 10, one frame period is a period since data read start time of the pixel units PU arranged in the zero-th row to data read completion time of the pixel units PU arranged in the 16th row. In each of the rows, prior to the pixel unit PU read period, a reset period and a photoelectron accumulation period corresponding to exposure time of the photoelectric converting elements (photodiodes) PD1 and PD2 arranged in each row are set.

Details of Reading Operation

Figure 11:
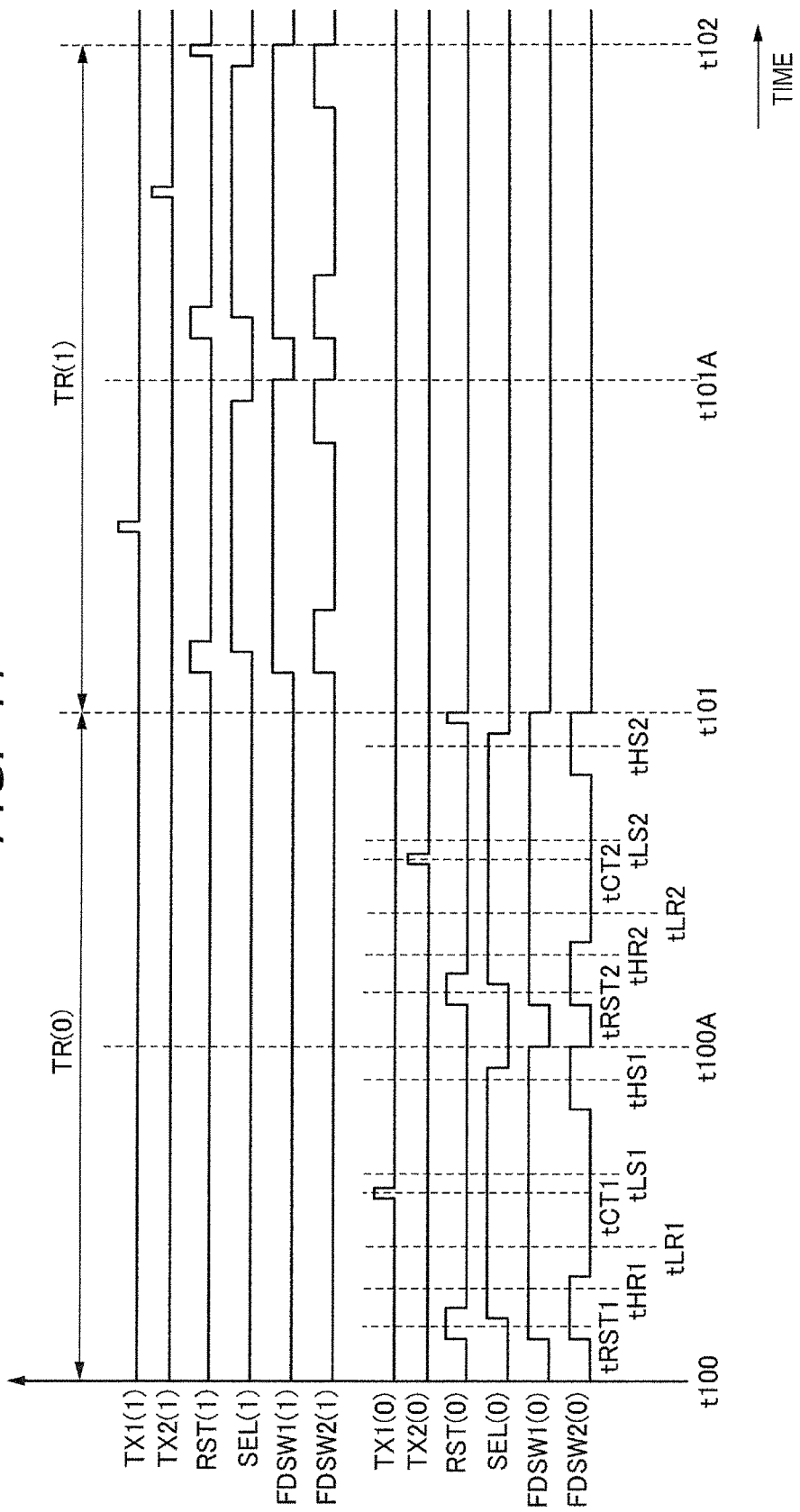
FIG. 11 is a timing chart illustrating reading operation of each pixel unit in each read period in FIG. 10.

FIG. 11 is a timing chart illustrating reading operation of each pixel unit in each read period in FIG. 10.

In the read periods started after completion of the photoelectron accumulation period in FIG. 10, in response to control signals output from the vertical scanning circuit 2 to the control signal lines TX1, TX2, RST, SEL, FDSW1, and FDSW2, the accumulated charges in the photodiodes PD1 and PD2 of the pixel units PU in the rows are read.

Concretely, in a read period TR(0) in FIG. 11, the vertical scanning circuit 2 reads data simultaneously from N+1 pieces of pixel units PU(0,0) to PU(0,N) arranged in the zeroth row (Row0) by control signals output to control signal lines TX1(0), TX2(0), RST(0), SEL(0), FDSW1(0), and FDSW2(0). The output data of the pixel units PU arranged in the zeroth row in the pixel array 1 is input to corresponding column circuits 31 via the output signal lines VOUT coupled to the pixel units PU. Similarly, in each of read periods TR(1) to TR(16), data of the pixel units PU arranged from the first row to the 16th row is read.

Hereinbelow, referring to FIGS. 8 and 11, the procedure of reading data from the pixel units PU arranged in the zeroth row in the pixel array 1 will be described. The read period TR(0) (from time t100 to time t101) is divided into the first half (t100 to t100A) and the latter half (t100A to t101). In the first half of the read period TR(0), charges accumulated in the photodiodes PD1 of the pixel units PU in the zeroth row are read. In the latter half of the read period TR(0), charges accumulated in the photodiodes PD2 of the pixel units PU in the zeroth row are read.

1. Reset of Floating Diffusion FD and FD Coupling Line FDCL

Between the time t100 and time rRST1, the vertical scanning circuit 2 changes the voltage of the control signal lines FDSW1(0), FDSW2(0), and RST(0) from the L level to the H level, thereby setting the FD switching transistors MFDSW1 and MFDSW2 and the reset transistor MRST in each of the pixel units PU in the zeroth row to the on state. As a result, the floating diffusion FD provided in each of the pixel units PU in the zeroth row and the FD coupling lines FDCL(0) and FDCL(1) of each column are reset. That is, the voltages in those parts become equal to the power supply voltage VDD, and the charges (electrons) accumulated in those parts are released. Since the control signal lines TX1(0), TX2(0), and SEL(0) are at the L level at this time, the transfer transistors MTX1 and MTX2 and the selection transistor MSEL of the pixel unit PU(0,x) are in the off state. In the example illustrated in FIG. 11, all of the voltages of the control signal lines other than the zeroth row are set to the L level.

2. Reading of Reset Level for High Luminous Intensity

By changing the voltage of the control signal line RST(0) from the H level to the L level between the time tRST1 and the next time tHR1, the vertical scanning circuit 2 cancels reset by setting the reset transistor MRST provided for each of the pixel units PU in the zeroth row to the off state. As a result, charges which become a cause of the reset noise are accumulated in the capacitance CFD of the floating diffusion FD and the capacitances of the FD coupling lines FDCL(0) and FDCL(1). Hereinbelow, the reset noise will be called "reset noise for high luminous intensity".

By further changing the voltage of the control signal line SEL(0) from the L level to the H level between the time tRST1 and the next time tHR1, the vertical scanning circuit 2 sets the selection transistor MSEL provided for each of the pixel units PU in the zeroth row to the on state (that is, the zeroth line of the pixel array 1 becomes a selection state). As a result, the reset noise for high luminous intensity is amplified by the amplification transistor MAMI, and the amplified noise is output to the column circuit 31 via the selection transistor MSEL and the output signal line VOUT.

At the next time tHR1, the programmable gain amplifier PGA included in the column circuit 31 amplifies the reset noise for high luminous intensity output from the amplification transistor MAMI and outputs the reset level for high luminous intensity generated by the amplification as the PGA output signal POUT.

3. Reading of Reset Level for Low Luminous Intensity

By changing the voltage of the control signal line FDSW2 (0) from the H level to the L level between the time tHR1 and the next time tLR1, the vertical scanning circuit 2 sets the FD switching transistor MFDSW2 provided for each of the pixel units PU in the zeroth row to the off state. As a result, the capacitance of the FD coupling lines FDCL(0) and FDCL(1) is isolated from the capacitance CFD of the floating diffusion FD. The reset noise caused only by the floating diffusion will be called "reset noise for low luminous intensity". Since the voltage of the control signal line SEL(0) is maintained at the H level, the reset noise for low luminous intensity is amplified by the amplification transistor MAMI. The amplified reset noise for low luminous intensity is input to the column circuit 31 via the selection transistor MSEL and the output signal line VOUT.

At the next time tLR1, the programmable gain amplifier PGA included in the column circuit 31 amplifies the reset noise for low luminous intensity output from the amplification transistor MAMI and outputs the reset level for low luminous intensity generated by the amplification as the PGA output signal POUT.

4. Photo-Charge Transfer

At the next time tCT1, the vertical scanning circuit 2 outputs a one-shot pulse which becomes the H level for only a predetermined period to the control signal line TX1(0). At this time, the voltage of other control signal lines coupled to the pixel units PU in the zeroth row maintains the value at the time tLR. Therefore, in the period that the voltage of the control signal line TX1(0) is at the H level, the photo-charges (electrons) accumulated in the photodiode PD1 are transferred to the floating diffusion FD. In the case of low-luminous-intensity imaging, all of the transferred photo-charges are held in the floating diffusion FD. On the other hand, in the case of high-luminous-intensity imaging, the transferred photo-charges can exceed the upper limit of the amount of charges which can be accumulated in the floating diffusion FD. In this case, a part of the photo-charges overflows from the floating diffusion FD and is held in the capacitance of the FD coupling line FDCL.

5. Reading of Signal Level for Low Luminous Intensity

After outputting the one-shot pulse to the control signal line TX1(0) at the time tCT1, the floating diffusion FD mixes the charges as a cause of the reset noise for low luminous intensity and the charges transferred from the photodiode PD1 and holds the mixture. The voltage of the floating diffusion FD at this time (hereinbelow, called "a mixture signal for low luminous intensity") is amplified by the amplification transistor MAMI. The amplified mixture signal for low luminous intensity is supplied to the column circuit 31 via the selection transistor MSEL and the output signal line VOUT.

At the next time tLS1, the programmable gain amplifier PGA included in the column circuit 31 amplifies the mixture signal for low luminous intensity output from the amplification transistor MAMI and outputs the signal level for low luminous intensity generated by the amplification as the PGA output signal POUT. In high-luminous-intensity imaging, there is a case that the signal level for low luminous intensity reaches a saturation voltage.

6. Reading of Signal Level for High Luminous Intensity

By changing the voltage of the control signal line FDSW2 (0) from the L level to the H level from the time tLS1 to the next time tHS1, the vertical scanning circuit 2 sets the FD switching transistor MFDSW2 provided for each of the pixel units PU in the zeroth row to the on state. As a result, the floating diffusion FD and the FD coupling lines FDCL(0) and FDCL(1) are coupled. Consequently, the charges held in the floating diffusion FD (including the charges causing the reset noise and the charges transferred from the photodiode PD1) and the charges held in the FD coupling lines FDCL(0) and FDCL(1) (including the charges causing the reset noise and the charges overflowed from the floating diffusion FD) are mixed. The mixed charges are held in the entire of the floating diffusion FD and the FD coupling lines FDCL(0) and FDCL(1). The voltage of the floating diffusion FD and the FD coupling lines FDCL(0) and FDCL(1) at this time (hereinbelow, called "mixture signal for high luminous intensity") is amplified by the amplification transistor MAMI. The amplified mixture signal for high luminous intensity is input to the column circuit 31 via the selection transistor MSEL and the output signal line VOUT.

At the next time tLR1, the programmable gain amplifier PGA included in the column circuit 31 amplifies the mixture signal for high luminous intensity output from the amplification transistor MAMI and outputs the signal level for high luminous intensity generated by the amplification as the PGA output signal POUT.

7. End of First Half of Read Period TR(0)

After completion of the reading of the signal level for high luminous intensity, the vertical scanning circuit 2 changes the voltage of the control signal line SEL(0) from the H level to the L level, thereby setting the selection transistor MSEL provided for each of the pixel units PU in the zeroth row to the off state (that is, selection of the zeroth row in the pixel array 1 is finished). At time t100A, the vertical scanning circuit 2 changes the voltage of the control signal lines FDSW1(0) and FDSW2(0) from the H level to the L level, thereby completing the first half of the read period TR(0).

8. Latter Half of Read Period TR(0)

The voltage changes in the control signals TX1(0), TX2 (0), RST(0), SEL(0), FDSW1(0), and FDSW2(0) in the latter half of the read period TR(0) from the time t100A to the time t101 are the same as those in the first half except for the following two points. In FIG. 11, the times tRST1, tHR1, tLR1, tCT1, tLS1, and tHS1 in the first half correspond to the times tRST2, tHR2, tLR2, tCT2, tLS2, and tHS2 in the latter half, respectively.

First, at time tCT2, the vertical scanning circuit 2 outputs the one-shot pulse which becomes the H level only for a predetermined period to the control signal line TX2(0) in place of the control signal line TX1(0). As a result, in the period in which the voltage of the control signal line TX2(0) is at the H level, the photo-charges (electrons) accumulated in the photodiode PD2 are transferred to the floating diffusion FD. As described above, in the case of high-luminous-intensity imaging, there is the possibility that a part of the photo-charges overflows from the floating diffusion FD and is held in the capacitance of the FD coupling line FDCL.

Further, between the time tHS2 to the time t101, the vertical scanning circuit 2 changes the voltage of the control signal line SEL(0) from the H level to the L level and, after that, changes the voltage of the control signal line RST(0) from the L level to the H level. By the operation, the voltage of the floating diffusion FD provided for the pixel units PU in the zeroth row and the voltage of the FD coupling lines FDCL(0) and FDCL(1) in each column are reset (that is, become equal to the power supply voltage VDD). The vertical scanning circuit 2 resets the voltage of the control signal line RST(0) to the L level at the time t101.

9. Modification of Read Period TR(0)

In the read period TR(0), the voltage of the control signal lines FDSW1(1) and RST(1) may be changed in a manner similar to the voltage of the control signal lines FDSW1(0) and RST(0) in the zeroth row. In this case, in addition to the FD coupling lines FDCL(0) and FDCL(1), the FD coupling line FDCL(2) is also coupled to the floating diffusion FD. As a result, the charges causing reset noise and the charges accumulated in the photodiodes PD1 and PD2 are distributed to the three FD coupling lines FDCL(0) to FDCL(2).

Similarly, in the read period TR(0), the voltage of each of the control signal lines FDSW1(1) to FDSW1(16) may be changed in a manner similar to the voltage of the control signal line FDSW1(0), and the voltage of each of the control signal lines RST(1) to RST(16) may be changed in a manner similar to the voltage of the control signal line RST(0). In this case, the charges causing reset noise and the charges accumulated in the photodiodes PD1 and PD2 are distributed to seventeen FD coupling lines FDCL(0) to FDCL(16).

Figure 12:
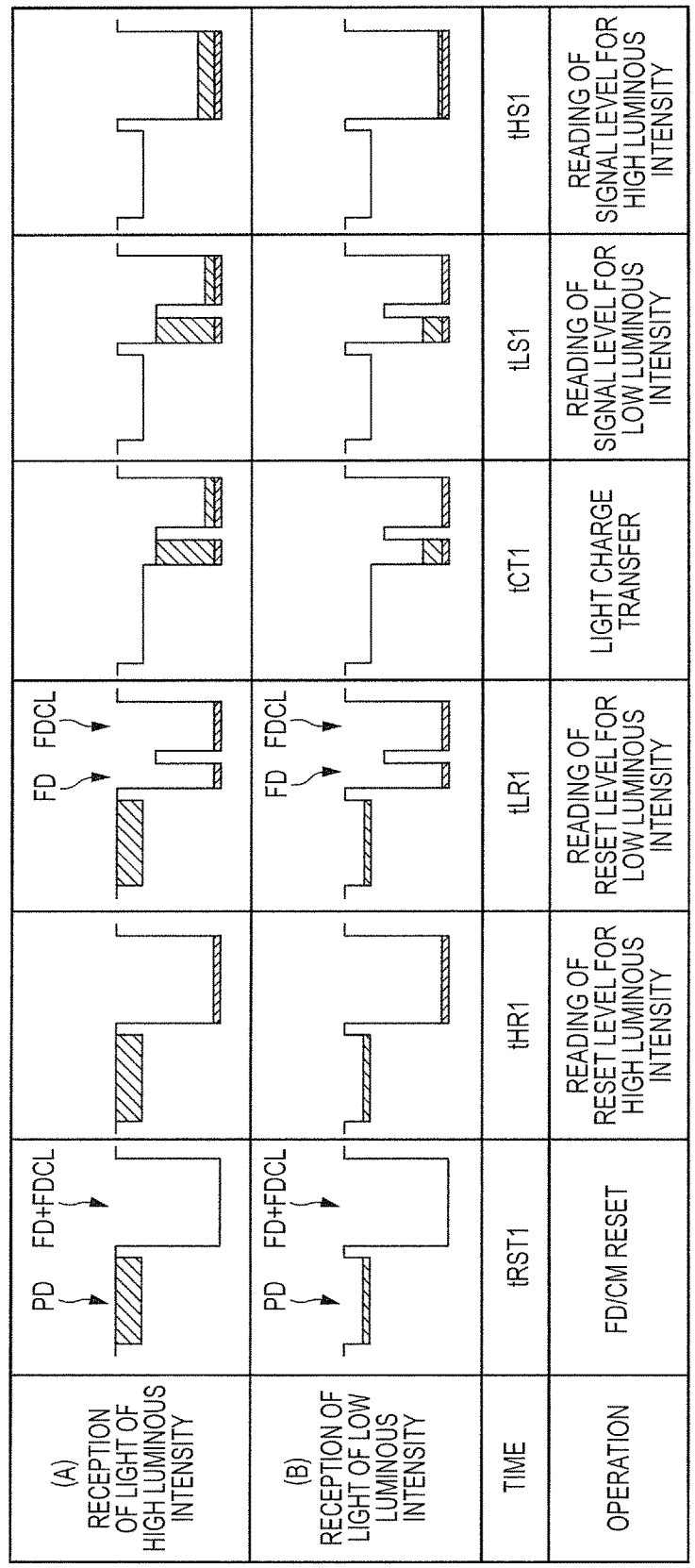
FIG. 12 is a potential diagram at each of times illustrated in FIG. 11.

FIG. 12 is a potential diagram at each of times illustrated in FIG. 11. (A) in FIG. 12 is a potential diagram in the case of receiving light having high luminous intensity in reality. (B) in FIG. 12 is a potential diagram in the case of receiving light having low luminous intensity in reality. In FIG. 12, light having low luminous intensity means light having luminous intensity to the degree that the amount of photo-charges generated in the photodiode PD1 is within the floating diffusion capacitance CFD. Light having high luminous intensity means light having luminous intensity to the degree that the amount of photo-charges generated by the photodiode PD1 overflows from the floating diffusion capacitance CFD. Although FIG. 12 illustrates the case of the first half of the read period TR(0) in FIG. 11, the case of the latter half is the same. Further, the other read periods are also similar to the period.

After completion of the photoelectron accumulation period, at time tRST1, the reset transistor MRST and the FD switching transistors MFDSW1 and MFDSW2 provided for each of the pixel units PU in the zeroth row to be read are in the on state. Consequently, the floating diffusion FD and the FD coupling lines FDCL(0) and FDCL(1) provided for each of the pixel units PU in the zeroth row are reset. That is, the accumulated charges (electrons) in those parts are released.

After that, when the reset transistor MRST becomes the off state, at time tHR1, the reset level for high luminous intensity is read. Via the FD switching transistors MFDSW1 and MFDSW2 which are in the on state, the floating diffusion FD and the FD coupling lines FDCL(0) and FDCL(1) are coupled.

After that, when the FD switching transistor MFDSW2 becomes the off state, at time tLR1, the reset level for low luminous intensity is read. The floating diffusion FD and the FD coupling lines FDCL(0) and FDCL(1) are not coupled.

When the transfer transistor MTX1 becomes the on state at time tCT1, the photo-charges accumulated in the photodiode PD1 are transferred to the floating diffusion FD. In the case of receiving light having high luminous intensity as illustrated in FIG. 12A, the charges overflowed from the floating diffusion FD are accumulated in the FD coupling lines FDCL(0) and FDCL(1).

At time tLS1, reading of the signal level for low luminous intensity is performed. The voltage of the floating diffusion FD is amplified by the amplification transistor MAMI and the amplified voltage is output to the column circuit 31 via the selection transistor MSEL and the output signal line VOUT. In the case of receiving light having high luminous intensity as illustrated in (A) in FIG. 12, the signal level for low luminous intensity is saturated.

After the FD switching transistor MFDSW2 becomes the on state, reading of the signal level for high luminous intensity is performed at time tHS. When the FD switching transistor MFDSW1 becomes the on state, the charges in the floating diffusion FD and the charges in the FD coupling lines FDCL(0) and FDCL(1) are mixed. As a result, the capacitance CFL of the floating diffusion FD and the capacitance of the FD coupling lines FDCL(0) and FDCL(1) are coupled in parallel. The voltage by the combined capacitance is amplified by the amplification transistor MAMI and the amplified voltage is output to the column circuit 31 via the selection transistor MSEL and the output signal line VOUT.

Signal Waveform of Column Circuit

Figure 13:
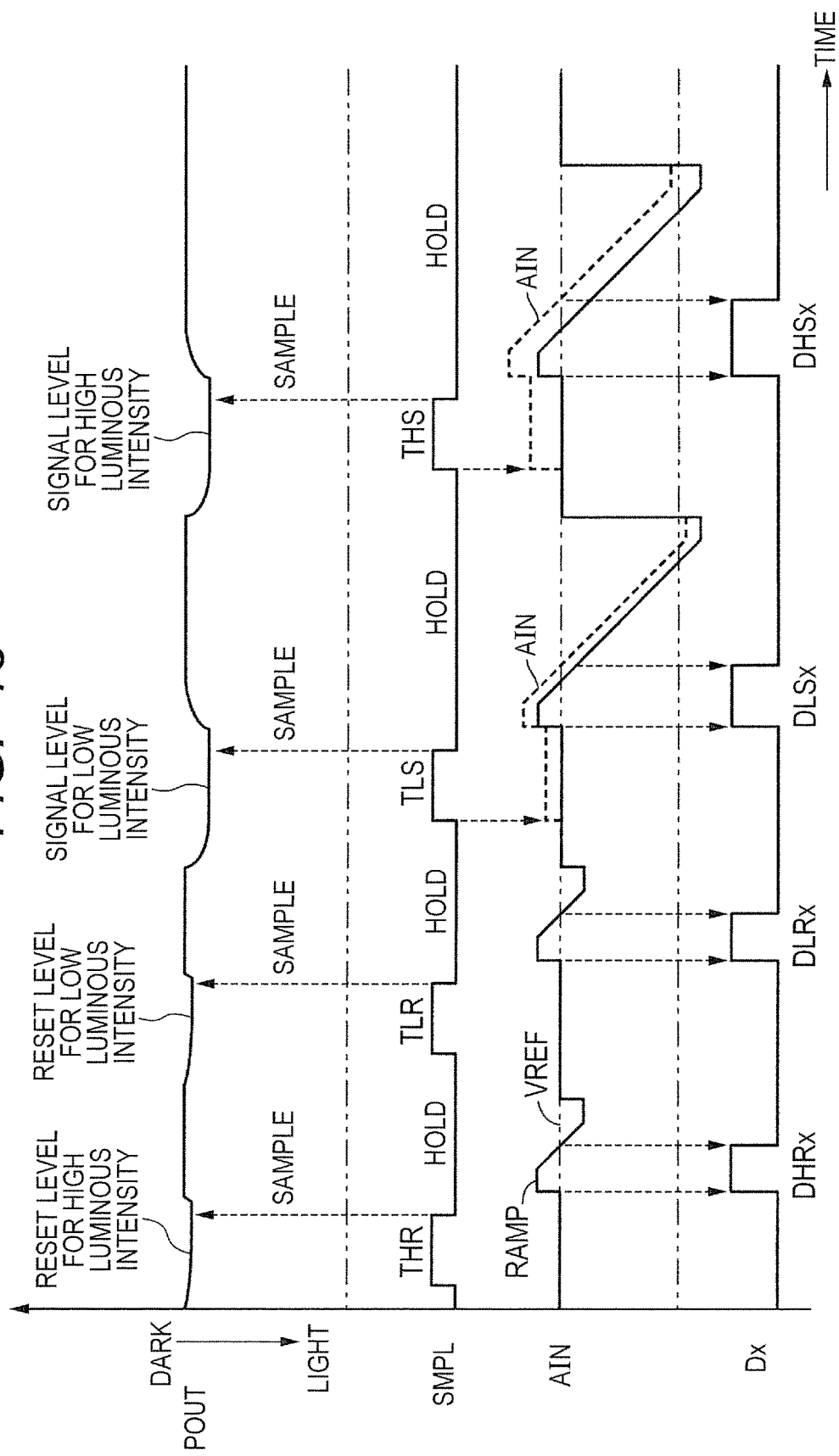
FIG. 13 is a timing chart for explaining signal waveforms of the column circuit.

FIG. 13 is a timing chart for explaining signal waveforms of the column circuit. In FIG. 13, the horizontal axis expresses time and, on the vertical axis, in order from the top, the output signal POUT of the programmable gain amplifier PGA in FIG. 9, a sampling signal SMPL input to the A/D converting circuit ADC, potential of the positive input terminal AIN of the comparator A2, and an output signal Dx of the A/D converting circuit ADC are schematically illustrated. The output signal POUT illustrates that the higher the potential is, the darker light of imaging is.

Referring to FIGS. 9 and 13, the reset level for high luminous intensity, the reset level for low luminous intensity, the signal level for low luminous intensity, and the signal level for high luminous intensity output from the programmable gain amplifier PGA are supplied as the sampling signals SMPL to the A/D converting circuit ADC, thereby holding charges in the capacitance C3 coupled to the positive input terminal AIN of the comparator A2.

In a hold period after completion of each of the sampling periods (THR, TLR, TLS, and THS), the potential of the positive input terminal AIN of the comparator A2 is once shifted to the high potential side by being superimposed with the ramp signal RAMP having a predetermined gradient and decreases with a predetermined gradient. The potential of the positive input terminal AIN at this time is compared with the reference voltage VREF. In FIG. 13, the solid line indicates the ramp signal RAMP, the alternate long and two dashes line indicates the reference voltage VREF, and the broken line indicates the PGA output signal POUT. Since it is assumed that the high-luminous-intensity reset level and the low-luminous-intensity reset level have values slightly higher than the value of the reference voltage VREF, broken lines indicating the reset levels are not illustrated to avoid complication of the waveform chart.

The A/D converting circuit ADC outputs a digital reset signal DHRx for high luminous intensity having a time width from time when the ramp signal RAMP starts rising to time when the reset level for high luminous intensity shifted by the ramp signal RAMP becomes lower than the reference voltage VREF during the hold period of the reset level for high luminous intensity. "x" at the end of the signal name "DHRx" indicates the x-th column in the pixel array 1. Similarly, the A/D converting circuit ADC outputs a digital reset signal DLRx for low luminous intensity during the hold period of the reset level for low luminous intensity, outputs a digital signal DLSx for low luminous intensity during a hold period of the signal level for low luminous intensity, and outputs a digital signal DHSx for high luminous intensity during the hold period of the signal level for high luminous intensity. In FIGS. 8 and 9, these digital signals are collectively written as Dx.

A not-illustrated digital signal processing circuit coupled to the column circuit 31 in each column illustrated in FIG. 8 calculates the difference between the digital signal DLSx for low luminous intensity and the digital reset signal DLRx for low luminous intensity, thereby extracting a signal component for low luminous intensity from which reset noise and low-frequency noise are removed. Similarly, the digital signal processing circuit calculates the difference between the digital signal DHSx for high luminous intensity and the digital reset signal DHRx for high luminous intensity, thereby extracting a signal component for high luminous intensity.

Effect of Second Embodiment

In the second embodiment, during the read period by the rolling shutter method with one exposure, both the reset level for high luminous intensity and the high-luminous-intensity signal level obtained by setting each of the FD switching transistors MFDSW2 to the on state and the reset level for low luminous intensity and the low-luminous-intensity signal level obtained by setting each of the FD switching transistors MFDSW2 to the off state can be detected. Therefore, there is an advantage that it is unnecessary to set the operation mode (high-luminous-intensity imaging mode or low-luminous-intensity imaging mode) in accordance with the luminous intensity from the subject in advance as performed in the first embodiment.

Modification of Second Embodiment

Figure 14:
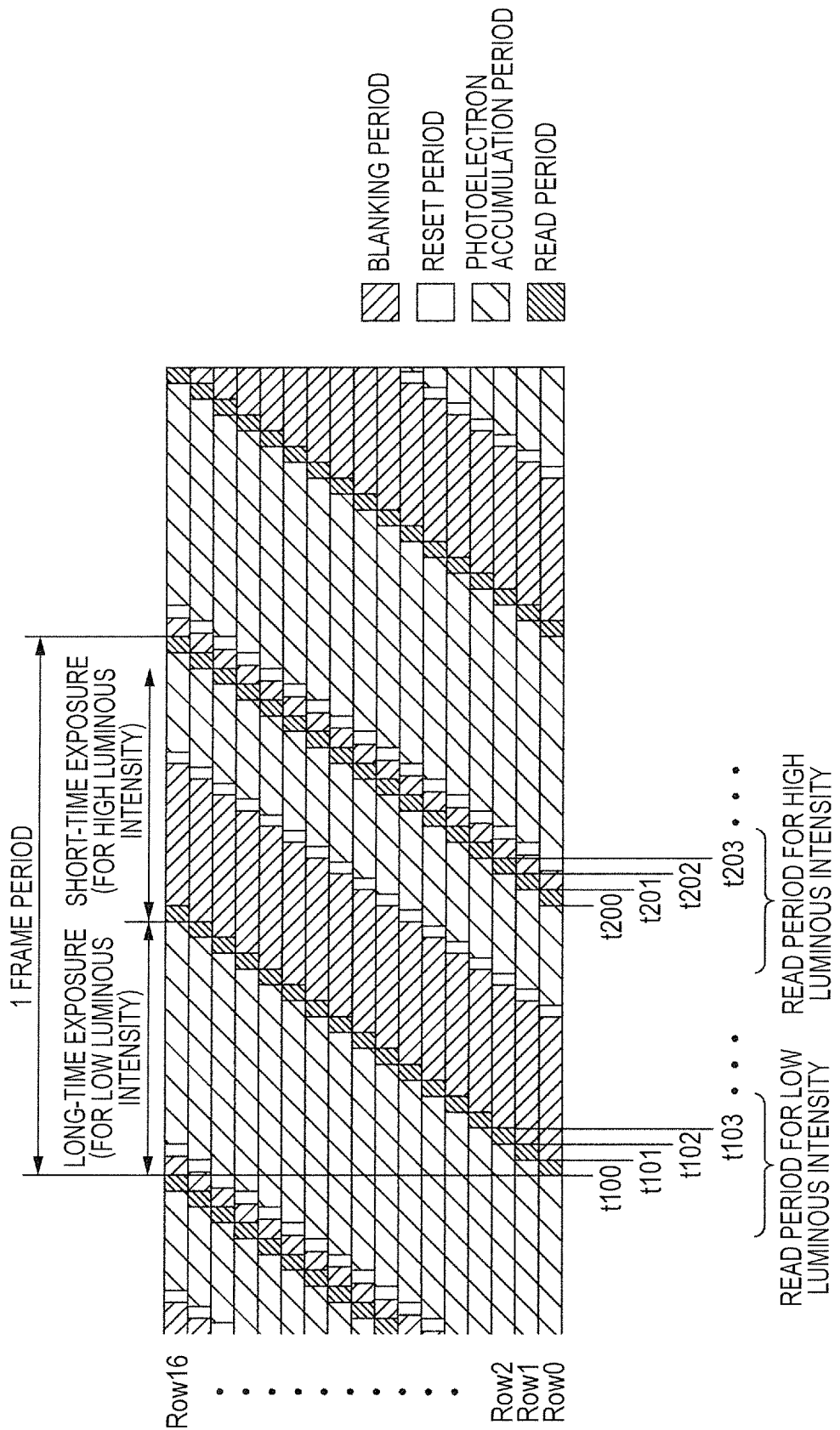
FIG. 14 is a timing chart in the case of performing reading by a rolling shutter method with twice-exposure.

FIG. 14 is a timing chart in the case of performing reading by a rolling shutter method with twice-exposure.

Different from the rolling shutter method with one exposure illustrated in FIG. 10, the timing chart of FIG. 14 illustrates, as an example of a rolling shutter method of performing exposure a plurality of times, the rolling shutter method of performing exposure twice of long-time exposure (for low luminous intensity) and short-time exposure (for high luminous intensity) in one frame period. As illustrated in FIG. 14, a photoelectron accumulation period in the long-time exposure is set to be longer than a photoelectron accumulation period in the short-time exposure. As the exposure order in a 1-frame period, the order of the long-time exposure and the short-time exposure may be reversed. The setting of the photoelectron accumulation time in the long-time exposure and the short-time exposure may be independently and variably controlled.

In the read period for low luminous intensity from time t100 to time t101, the vertical scanning circuit 2 supplies the voltages illustrated in FIG. 3B to the control signal lines RST(0), TX1(0), TX2(0), FDSW1(0), FDSW2(0), and SEL (0) coupled to each of the pixel units PU in the zeroth row. By the operation, the reset level for low luminous intensity and the signal level for low luminous intensity are output from each of the pixel units PU in the zeroth row to the column circuit 31 in each of the columns. All of the voltages of the control signal lines in rows other than the zeroth row are set to the L level.

Similarly, in the read period for low luminous intensity from time t101 to time t102, the vertical scanning circuit 2 supplies the voltages illustrated in FIG. 3B to the control signal lines RST(1), TX1(1), TX2(1), FDSW1(1), FDSW2 (1), and SEL(1) coupled to each of the pixel units PU in the first row. All of the voltages of the control signal lines in rows other than the first row are set to the L level. The setting is similarly made also in the second to 16th rows.

In the read period for high luminous intensity from time t200 to time t201, the vertical scanning circuit 2 supplies the voltages illustrated in FIG. 3A to the control signal lines RST(0), TX1(0), TX2(0), FDSW1(0), FDSW2(0), and SEL (0) coupled to each of the pixel units PU in the zeroth row. By the operation, the reset level for high luminous intensity and the signal level for high luminous intensity are output from each of the pixel units PU in the zeroth row to the column circuit 31 in each of the columns. All of the voltages of the control signal lines in rows other than the zeroth row are set to the L level.

Similarly, in the read period for high luminous intensity from time t201 to time t202, the vertical scanning circuit 2 supplies the voltages illustrated in FIG. 3A to the control signal lines RST(1), TX1(1), TX2(1), FDSW1(1), FDSW2 (1), and SEL(1) coupled to each of the pixel units PU in the first row. All of the voltages of the control signal lines in rows other than the first row are set to the L level. The setting is similarly made also in the second to 16th rows.

The A/D converting circuit ADC provided for the column circuit 31 converts the reset level for low luminous intensity and the signal level for low luminous intensity to the digital reset signal DLR for low luminous intensity and the digital signal DLS for low luminous intensity, respectively, and outputs the resultant signals. Similarly, the A/D converting circuit ADC provided for the column circuit 31 converts the reset level for high luminous intensity and the signal level for high luminous intensity to the digital reset signal DHR for high luminous intensity and the digital signal DHS for high luminous intensity, respectively, and outputs the resultant signals.

A not-illustrated digital signal processing circuit provided at the post stage of the column circuit 31 can obtain an image of a wide dynamic range by performing HDR synthesis (High Dynamic Range Imaging synthesis) on the digital reset signal DLR for low luminous intensity, the digital signal DLS for low luminous intensity, the digital reset signal DHR for high luminous intensity, and the digital signal DHS for high luminous intensity.

Third Embodiment

Figure 15:
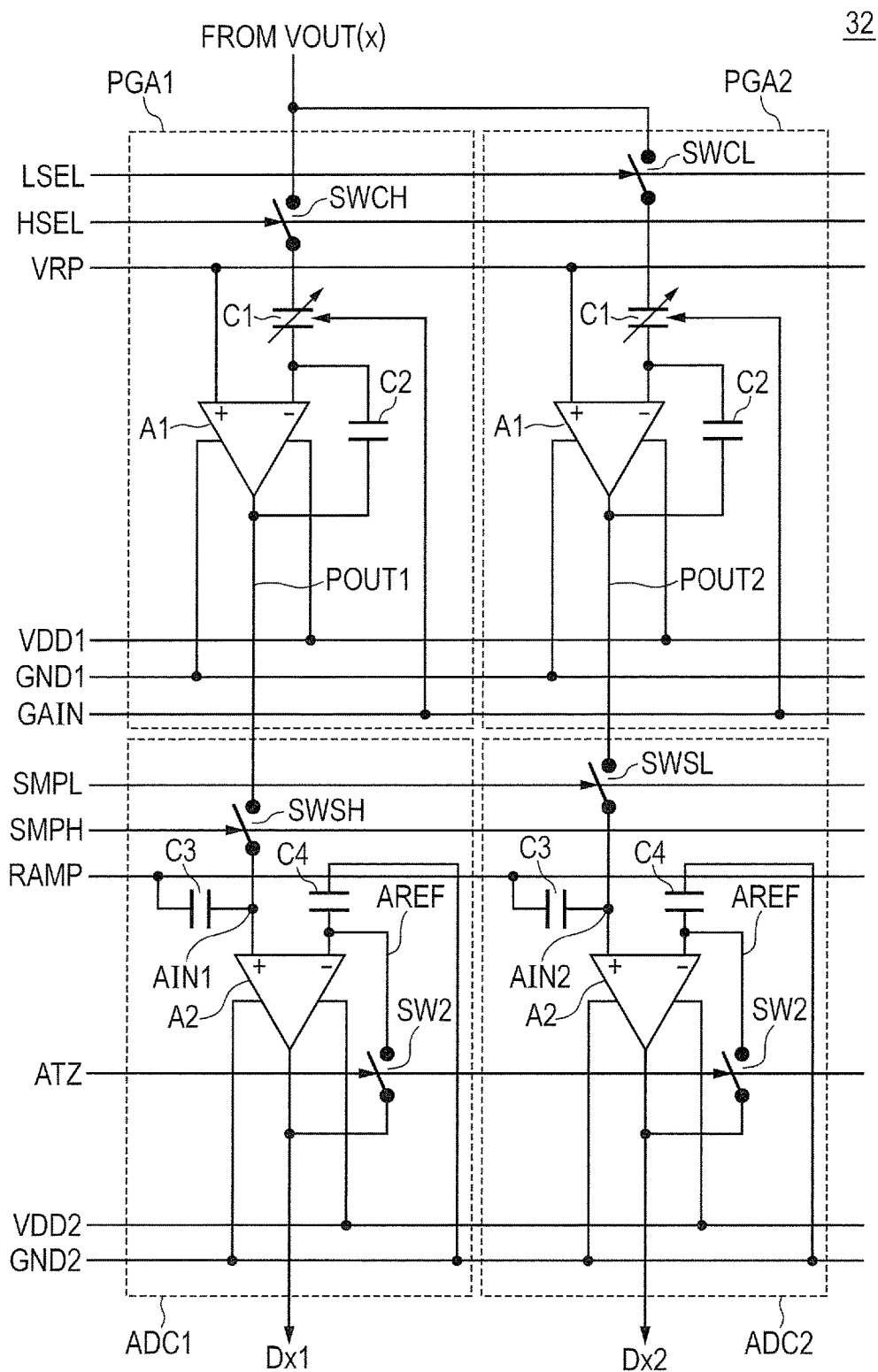
FIG. 15 is a circuit diagram of a column circuit used in an imaging device according to a third embodiment.

In an imaging device according to a third embodiment, in place of the column circuit 31 described with reference to FIGS. 8 and 9, a column circuit 32 illustrated in FIG. 15 is used. The column circuit 32 has a configuration that the column circuits 31 of FIG. 9 are arranged in parallel, and the reset level for high luminous intensity and the signal level for high luminous intensity and the reset level for low luminous intensity and the signal level for low luminous intensity can be A/D converted in parallel. Hereinbelow, concrete description will be given.

Configuration of Column Circuit

FIG. 15 is a circuit diagram of a column circuit used in an imaging device according to the third embodiment. Referring to FIG. 15, the column circuit 32 includes two programmable gain amplifiers PGA1 and PGA2 and two A/D converting circuits ADC1 and ADC2.

The programmable gain amplifier PGA1 includes a switch SWCH in addition to the configuration of the programmable gain amplifier PGA of FIG. 9. Similarly, the programmable gain amplifier PGA2 includes a switch SWCL in addition to the configuration of the programmable gain amplifier PGA of FIG. 9. By an output signal line VOUT(x), one end of the switch SWCH and one end of the switch SWCL are coupled. The other end of the switch SWCH is coupled to one end of the input capacitance C1 of the programmable gain amplifier PGA1, and the other end of the switch SWCL is coupled to one end of the input capacitance C1 of the programmable gain amplifier PGA2. The switches SWCH and SWCL are complementarily turned on/off by a column selection signal HSEL for high luminous intensity and a column selection signal LSEL for low luminous intensity, respectively.

The configuration of each of the A/D converting circuits ADC1 and ADC2 is the same as that of the A/D converting circuit ADC in FIG. 9. Concretely, an output POUT1 of the programmable gain amplifier PGA1 is input to a positive input terminal AIN1 of the A/D converting circuit ADC1 via a switch SWSH corresponding to the switch SW1 in FIG. 9. Similarly, an output POUT2 of the programmable gain amplifier PGA2 is input to a positive input terminal AIN2 of the A/D converting circuit ADC2 via a switch SWSL corresponding to the switch SW1 in FIG. 9. The open/close states of the switches SWSH and SWSL are controlled by sampling signals SMPH and SMPL, respectively. The A/D converting circuit ADC1 converts the signal applied to the positive input terminal AIN1 to a digital signal Dx1 and outputs the digital signal Dx1. The A/D converting circuit ADC2 converts the signal applied to the positive input terminal AIN2 to a digital signal Dx2 and outputs the digital signal Dx2.

Signal Waveform of Column Circuit

Figure 16:
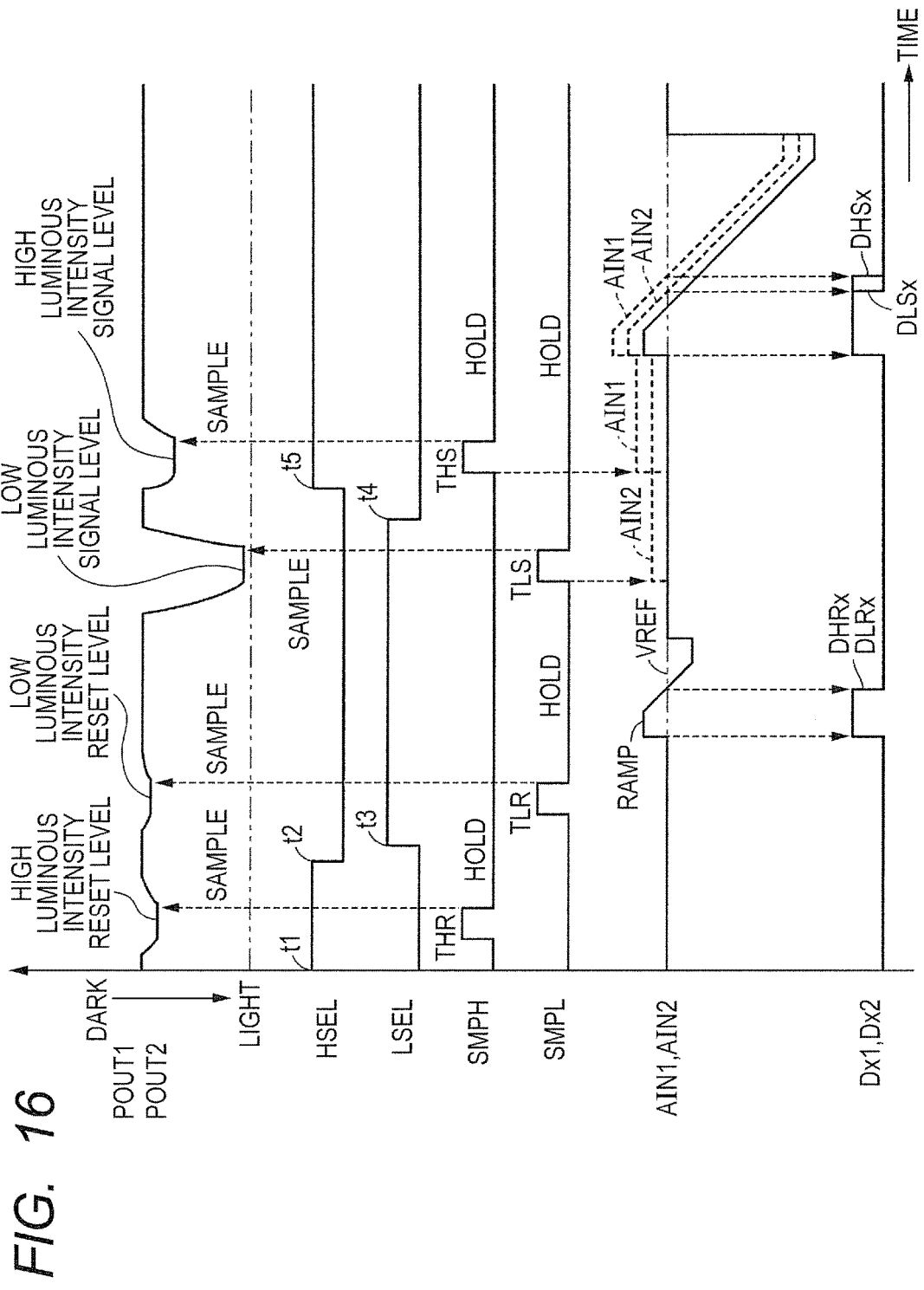
FIG. 16 is a timing chart for explaining signal waveforms of the column circuit illustrated in FIG. 15.

FIG. 16 is a timing chart for explaining signal waveforms of the column circuit illustrated in FIG. 15. In FIG. 16, waveforms in the case of reading the pixel unit PU by exposure of once are illustrated. The horizontal axis of FIG. 16 expresses time. On the vertical axis in FIG. 16, in order from the top, the output signals POUT1 and POUT2 of the programmable gain amplifiers PGA1 and PGA2, the column selection signal HSEL for high luminous intensity, the column selection signal LSEL for low luminous intensity, sampling signals SMPH and SMPL, potentials of the positive input terminals AIN1 and AIN2, and the output signals Dx1 and Dx2 of the A/D converting circuits ADC1 and ADC2 are illustrated. The output signals POUT1 and POUT2 illustrate that the higher the potential is, the darker light of imaging is.

Referring to FIGS. 15 and 16, between the time t1 to time t2, the column selection signal HSEL for high luminous intensity is set to the H level, and the column selection signal LSEL for low luminous intensity is set to the L level. When the sampling pulse THR is input in accordance with the reset level for high luminous intensity which is input during the period, the A/D converting circuit ADC1 holds the high-luminous-intensity reset level in the capacitance C3 coupled to the positive input terminal AIN1 of the comparator A2.

Between the next time t3 to time t4, the column selection signal HSEL for high luminous intensity is set to the L level, and the column selection signal LSEL for low luminous intensity is set to the H level. When the sampling pulse TLR is input in accordance with the reset level for low luminous intensity which is input during the period, the A/D converting circuit ADC2 holds the low-luminous-intensity reset level in the capacitance C3 coupled to the positive input terminal AIN2 of the comparator A2.

In the hold periods of the high-luminous-intensity reset level and the low-luminous-intensity reset level, each of the potential of the positive input terminal AIN1 of the A/D converting circuit ADC1 and the potential of the positive input terminal AIN2 of the A/D converting circuit ACD2 is once shifted to the high potential side by being superimposed with the ramp signal RAMP having a predetermined gradient and then decreases with a predetermined gradient. Each of the potentials of the positive input terminals AIN1 and AIN2 at this time is compared with the reference voltage VREF. In FIG. 16, the solid line indicates the ramp signal RAMP, and the alternate long and two dashes line indicates the reference voltage VREF. Since it is assumed that the high-luminous-intensity reset level and the low-luminous-intensity reset level have values slightly higher than the value of the reference voltage VREF, the reset levels are not illustrated to avoid complication of the waveform chart.

The A/D converting circuit ADC1 outputs the digital reset signal DHRx for high luminous intensity having a time width from time when the ramp signal RAMP starts rising to time when the reset level for high luminous intensity shifted by the ramp signal RAMP becomes lower than the reference voltage VREF. In parallel to the output, the A/D converting circuit ADC2 outputs the digital reset signal DLRx for low luminous intensity having a time width from time when the ramp signal RAMP starts rising to time when the reset level for low luminous intensity shifted by the ramp signal RAMP becomes lower than the reference voltage VREF.

Subsequently, in a state where the column selection signal HSEL for high luminous intensity is set to the L level and the column selection signal LSEL for low luminous intensity is set to the H level, the low-luminous-intensity signal level is input. When the sampling pulse TLS is input in accordance with the low-luminous-intensity signal level, the A/D converting circuit ADC2 holds the low-luminous-intensity signal level at the capacitance C3 coupled to the positive input terminal AIN2 of the comparator A2.

At and after the following time t5, the column selection signal HSEL for high luminous intensity is set to the H level, and the column selection signal LSEL for low luminous intensity is set to the L level. By inputting the sampling pulse THS in accordance with the high-luminous-intensity signal level which is input in the period, the A/D converting circuit ADC1 holds the high-luminous-intensity signal level in the capacitance C3 coupled to the positive input terminal AIN1 in the comparator A2.

During the hold periods of the low-luminous-intensity signal level and the high-luminous-intensity signal level, each of the potential of the positive input terminal AIN1 of the A/D converting circuit ADC1 and the potential of the positive input terminal AIN2 of the A/D converting circuit ACD2 is once shifted to the high potential side by being superimposed with the ramp signal RAMP having a predetermined gradient and then decreases with a predetermined gradient. Each of the potentials of the positive input terminals AIN1 and AIN2 at this time is compared with the reference voltage VREF. In FIG. 16, the solid line indicates the ramp signal RAMP, the alternate long and two dashes line indicates the reference voltage VREF, and the broken line indicates the signal level for high luminous intensity and the signal level for low luminous intensity shifted with the ramp signal RAMP.

The A/D converting circuit ADC2 outputs the digital signal DLSx for low luminous intensity having a time width from time when the ramp signal RAMP starts rising to time when the signal level for low luminous intensity shifted by the ramp signal RAMP becomes lower than the reference voltage VREF. In parallel to the output, the A/D converting circuit ADC1 outputs the digital signal DHSx for high luminous intensity having a time width from time when the ramp signal RAMP starts rising to time when the signal level for high luminous intensity shifted by the ramp signal RAMP becomes lower than the reference voltage VREF.

Effect of Third Embodiment

In the third embodiment described with reference to FIGS. 15 and 16, the column circuit 32 has the column circuit for high luminous intensity (the programmable gain amplifier PGA1 and the A/D converting circuit ADC1) and the column circuit for low luminous intensity (the programmable gain amplifier PGA2 and the A/D converting circuit ADC2) for each of the columns of the pixel units PU. Signals sequentially output from the output signal line VOUT are sequentially supplied to the column circuit for high luminous intensity and the column circuit for low luminous intensity by a multiplexer constructed by the switches SWCH and SWCL.

The process time of the column circuit 32 is dominated by the A/D converting circuits ADC1 and ADC2. Particularly, when the amplitude of a signal input to the A/D converting circuits ADC1 and ADC2 becomes large, increase of the process time of the column circuit 32 becomes more conspicuous. Even in the case of processing an input signal having such a large amplitude, by operating the A/D converting circuits ADC1 and ADC2 in parallel, the process time of the column circuit 32 can be shortened to about 40 percent of the process time of the column circuit 31 illustrated in FIG. 6. By increasing the speed of the column circuit 32, the image processing capability of the imaging device can be increased.

Fourth Embodiment

Configuration of Pixel Array

Figure 17:
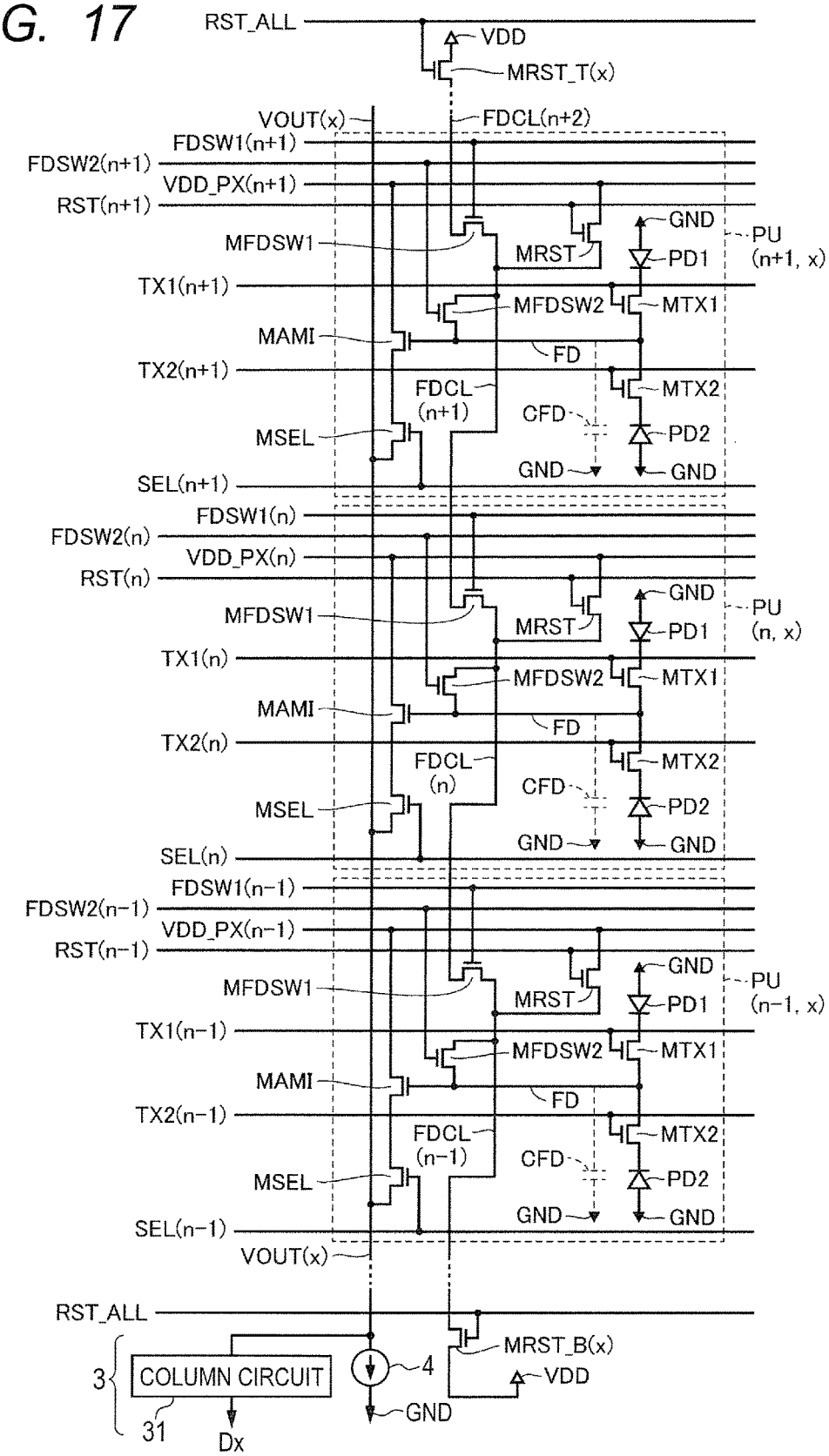
FIG. 17 is a circuit diagram illustrating the configuration of the x-th column in a pixel array in an imaging device according to a fourth embodiment.

FIG. 17 is a circuit diagram illustrating the configuration of the x-th column in a pixel array in an imaging device according to a fourth embodiment.

The pixel array of FIG. 17 is different from the pixel array of FIG. 8 with respect to the point that a top reset transistor MRST_T1(x) and a bottom reset transistor MRST_B(x) (which may be generally called all reset transistors) are further included in each column. The top reset transistor MRST_T(x) in each column is an NMOS transistor coupled between the FD coupling line FDCL at the uppermost end and the power supply node VDD. The bottom reset transistor MRST_B(x) in each column is an NMOS transistor coupled between the FD coupling line FDCL at the lowest end of each column and the power supply node VDD. To the gate of the top reset transistor MRST_T(x) and the gate of the bottom reset transistor MRST_B(x), an all reset signal RST_ALL is input from the vertical scanning circuit 2.

Since the other points of FIG. 17 are the same as FIG. 8, the same reference numeral is designated to the same or corresponding part, and its description will not be repeated.

Details of Reading Operation

Figure 18:
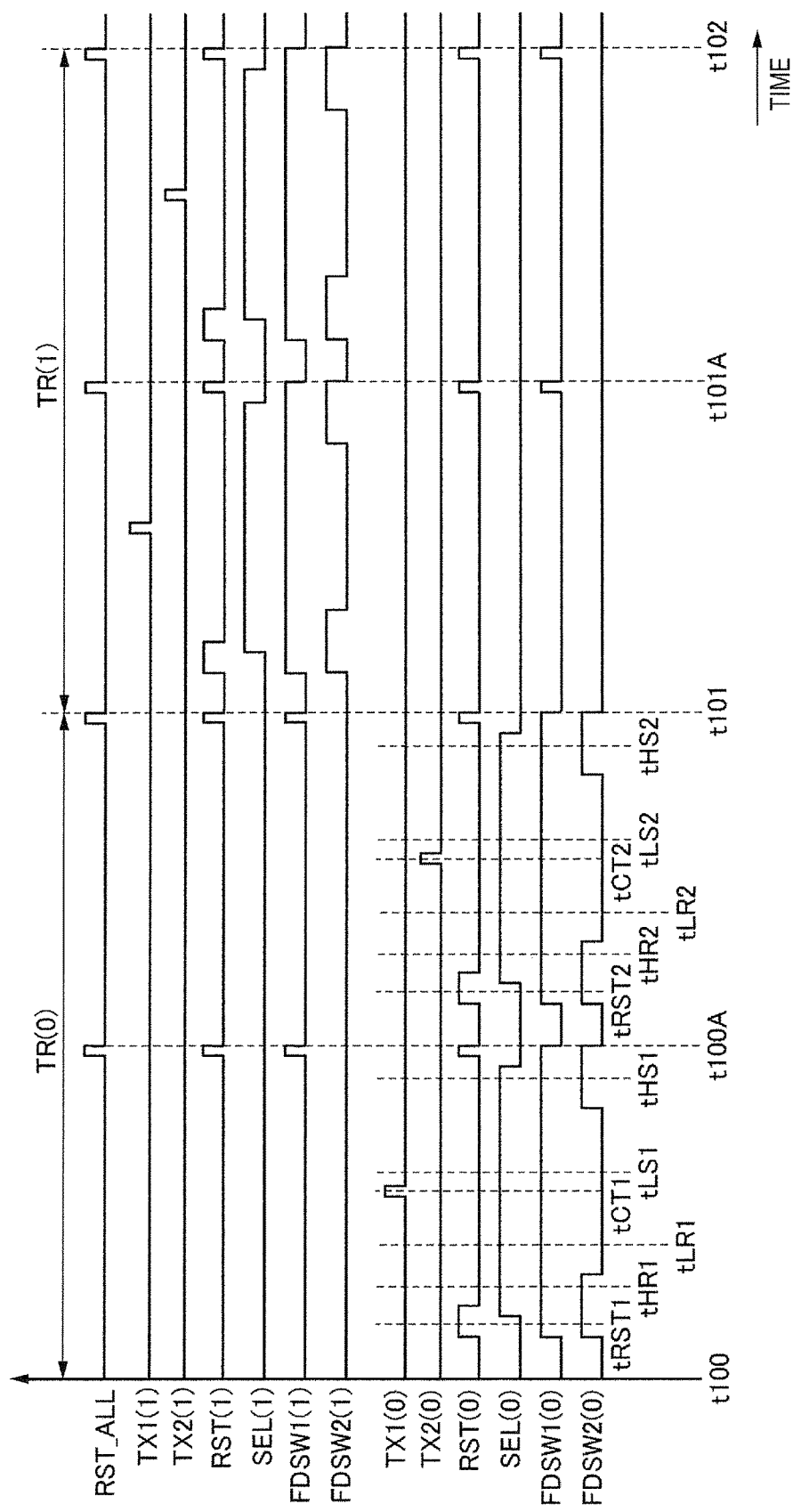
FIG. 18 is a timing chart for explaining reading operation of each pixel unit in FIG. 17.

FIG. 18 is a timing chart for explaining reading operation of each pixel unit in FIG. 17. The timing chart of FIG. 18 is basically the same as that of FIG. 11 except for the following points. It is assumed that rows of the pixel array are provided from the zeroth row to the 16th row as illustrated in FIG. 10.

First, just before time t100A when the first half of the read period TR(0) is finished and just before time t101 when the latter half is finished, the vertical scanning circuit 2 outputs a one-shot pulse as the all reset signal RST_ALL and outputs a one-shot pulse to the control signal lines RST(0) to RST(16) and the control signal lines FDSW1(1) to FDSW1 (16). During this period, the control signal lines FDSW1(0) and FDSW2(0) are maintained at the H level.

Similarly, also with respect to the other read periods TR(i) (where $0 \leq i \leq 16$), just before the first half of the read period TR(i) is finished and just before the latter half is finished, the vertical scanning circuit 2 outputs a one-shot pulse as the all reset signal RST_ALL, outputs a one-shot pulse to the control signal lines RST(0) to RST(16), and outputs a one-shot pulse to the control signal lines FDSW1 except for the i-th row. During this period, the control signal lines FDSW1(i) and FDSW2(i) are maintained at the H level.

By the above control, just before the first half and the latter half of each of the read periods are finished, residual charges in all of the FD coupling lines FDCL(0) to FDCL (17) can be promptly ejected via the top reset transistor MRST_T(x) and the bottom reset transistor MRST_B(x). As a result, higher operation as compared with that of the imaging device having the pixel array of the configuration of FIG. 8 can be realized.

Fifth Embodiment

General Configuration of Imaging Device

Figure 19:
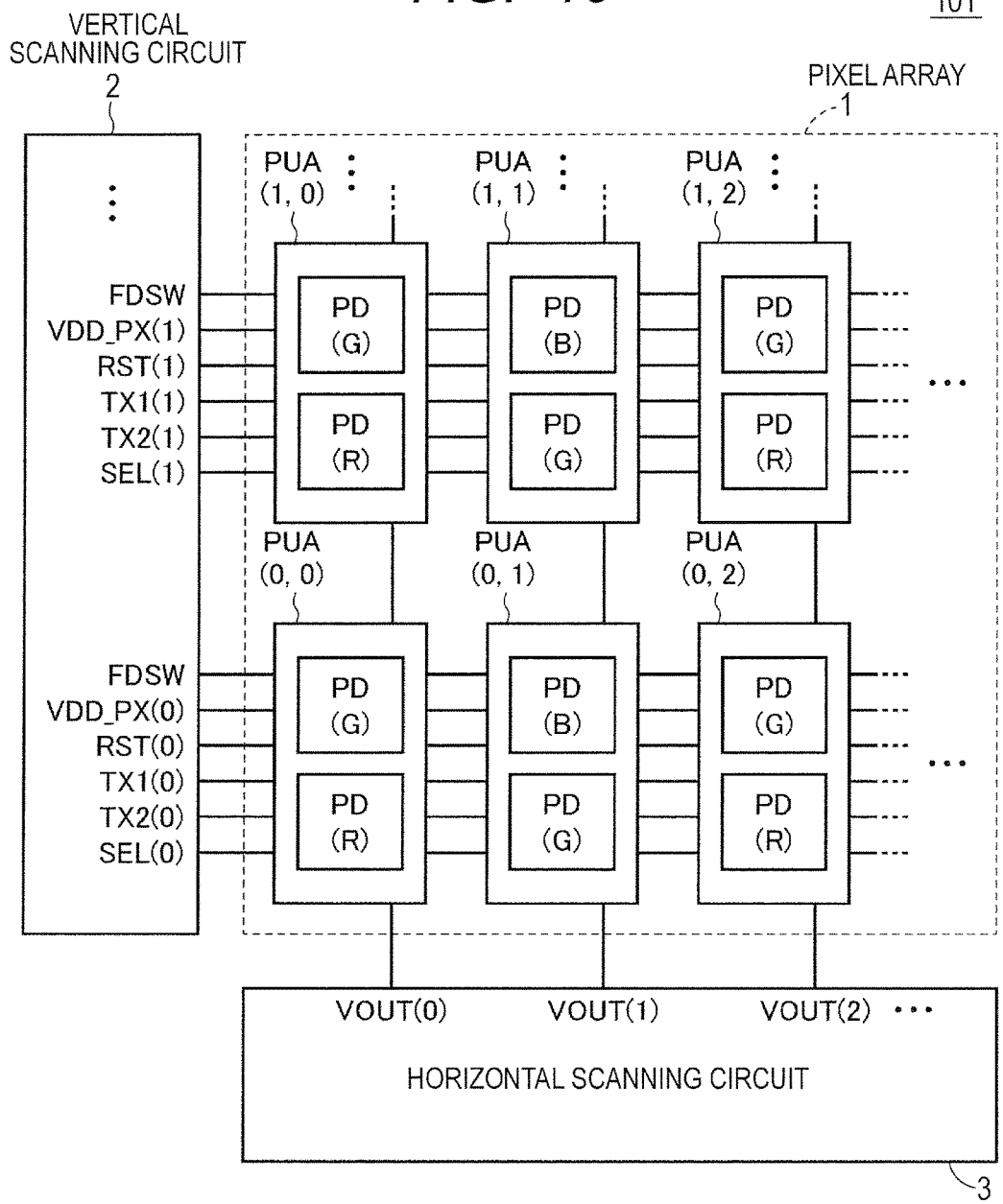
FIG. 19 is a block diagram illustrating the configuration of an imaging device according to a fifth embodiment.

FIG. 19 is a block diagram illustrating the configuration of an imaging device according to a fifth embodiment. An imaging device 101 of FIG. 19 is different from the imaging device 100 of FIG. 1 with respect to the point that the control signal lines FDSW1 and FDSW2 coupled to the rows of the pixel array 1 are replaced by one control signal line FDSW. Further, as will be described with FIG. 20, the configuration of each of the pixel units PU is different from that of the pixel unit PU of FIG. 2. Since the other points of FIG. 19 are the same as the case of FIG. 1, the same reference numeral is designated to the same or corresponding part and its description will not be repeated.

Configuration of Pixel Unit

Figure 20:
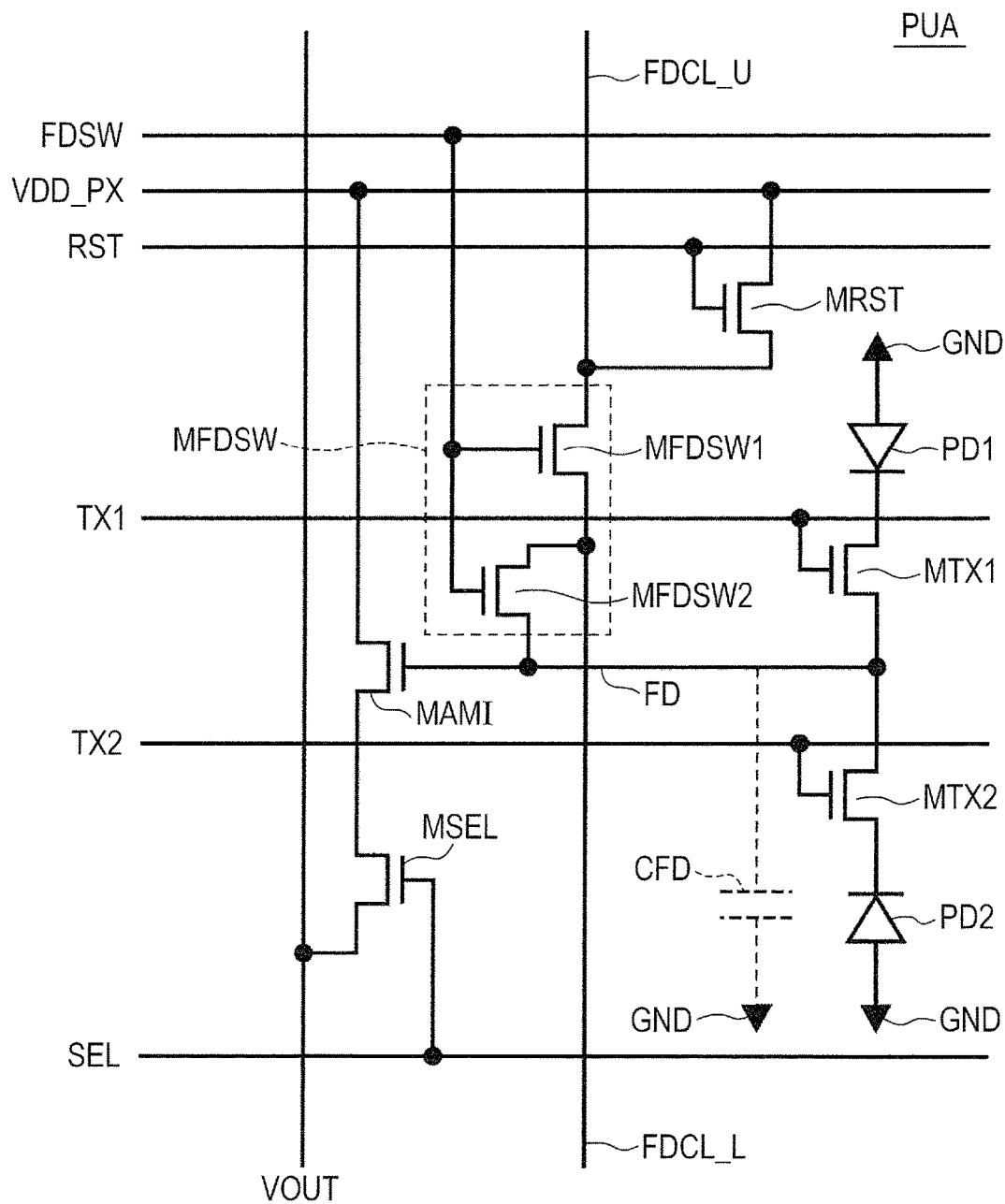
FIG. 20 is an equivalent circuit diagram of each pixel unit in FIG. 19.

FIG. 20 is an equivalent circuit diagram of each pixel unit in FIG. 19. In FIG. 20, one pixel unit PUA coupled to the control signals FDSW, RST, TX1, TX2, and SEL and the output signal line VOUT in FIG. 19 is illustrated.

The pixel unit PUA includes the two photodiodes PD1 and PD2, the two transfer transistors MTX1 and MTX2, the reset transistor MRST, the amplification transistor MAMI, and the selection transistor MSEL. The pixel unit PUA further includes the FD coupling lines FDCL_U and FDCL_L and the FD switching transistors MFDSW1 and MFDSW2. The FD coupling lines FDCL_U and FDCL_L are commonly shared by upper and lower pixel units PUA in the column direction. Those components are the same as those of FIG. 2.

The pixel unit PUA of FIG. 20 is different from the case of FIG. 2 with respect to points that the gate of the FD switching transistor MFDSW1 and the gate of the FD switching transistor MFDSW2 are coupled to each other, and those gates are coupled to a common control signal line FDSW. Usually, the gate electrodes of the FD switching transistors MFDSW1 and MFDSW2 are integrally formed to reduce the area. In the following, the FD switching transistors MFDSW1 and MFDSW2 will be collectively called the FD switching unit MFDSW.

In the case of FIG. 20, the reset transistor MRST is coupled between the FD coupling line FDCL_U and the power supply line VDD_PX. Since the other points of FIG. 20 are the same as the case of FIG. 2, the same reference numeral is designated to the same or corresponding part and its description will not be repeated.

Operation of Pixel Unit

Figure 21A:
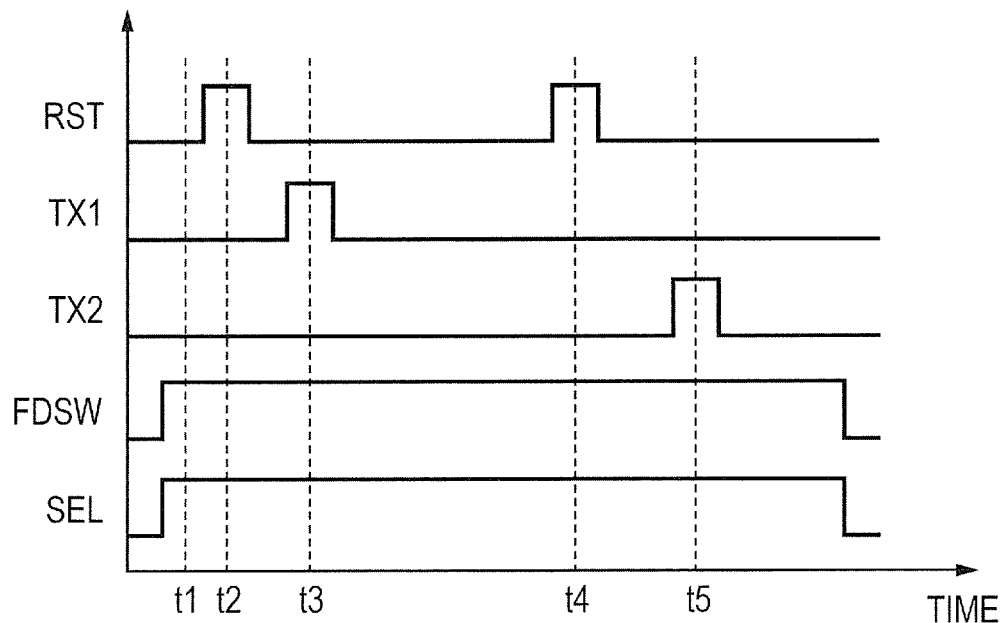
FIGS. 21A and 21B are timing charts illustrating reading operation of the pixel unit of FIG. 20.
Figure 21B:
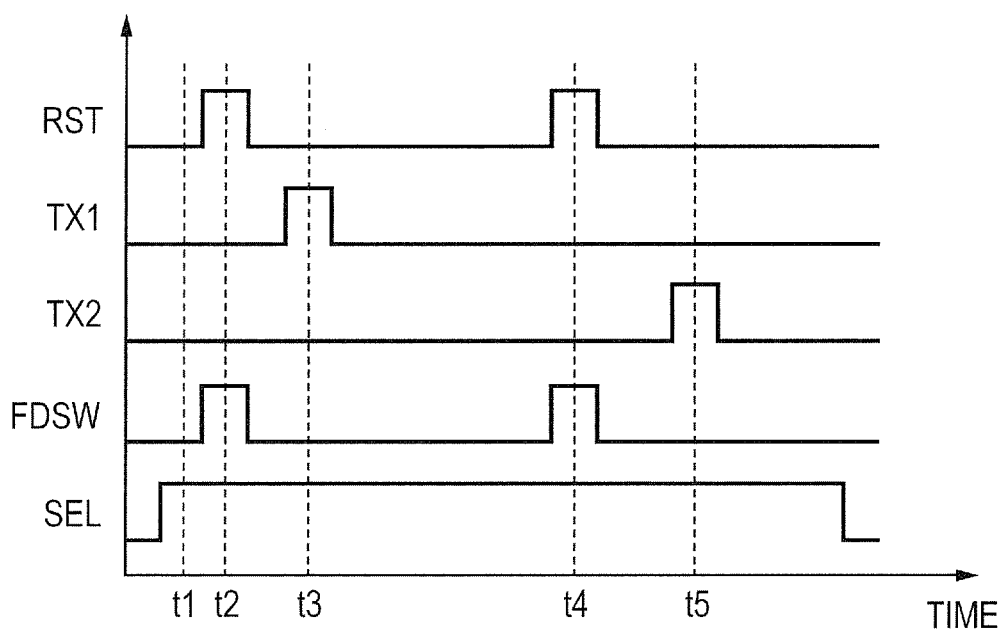

FIGS. 21A and 21B are timing charts illustrating reading operation of the pixel unit of FIG. 20. In a manner similar to the case of FIGS. 3A and 3B, the reading operation is performed in two kinds of operation modes; an FDSW-on mode (high-luminous-intensity imaging mode) and an FDSW-off mode (low-luminous-intensity imaging mode).

In the FDSW-on mode, by setting the control signal line FDSW to the H level at the time of signal reading, the vertical scanning circuit 2 sets the FD switching transistors MFDSW1 and MFDSW2 to the on state. By the operation, signal reading is performed in a state where the floating diffusion FD and the FD coupling lines FDCL_L and FDCL_U are coupled. Consequently, imaging with low ISO speed becomes possible at relatively high luminous intensity. On the other hand, in the FDSW-off mode, by setting the control signal line FDSW to the L level at the time of signal reading, the vertical scanning circuit 2 sets the FD switching transistors MFDSW1 and MFDSW2 to the off state. By the operation, signal reading is performed in a state where the floating diffusion FD is isolated from the FD coupling lines FDCL_L and FDCL_U. Consequently, imaging with high ISO speed can be realized at relatively low luminous intensity. In this case, the amplification factor at the first-stage amplifier can be made high, so that noise reduction effect can be also expected.

Hereinbelow, the operations of the pixel unit in the operation modes will be described in time order. In FIGS. 21A and 21B, voltage waveforms of the control signals RST, TX1, TX2, FDSW, and SEL are indicated in order from the top.

1. Case in FDSW-On Mode, that is, High-Luminous-Intensity Imaging Mode

With reference to FIGS. 20 and 21A, the reading operation in the FDSW-on mode (high-luminous-intensity imaging mode) will be described.

At time t1, the vertical scanning circuit 2 sets the voltage of the control signal line FDSW to the H level, thereby coupling the capacitance of the FD coupling lines FDCL_L and FDCL_U to the capacitance CFD of the floating diffusion FD. At time t1, the vertical scanning circuit 2 further sets the voltage of the control signal line SEL to the high level (H level), thereby selecting a pixel unit PUA in a row as a signal reading object. The voltage of the control signal lines FDSW and SEL is always set to the H level in the reading operation.

At the next time t2, the vertical scanning circuit 2 sets the voltage of the control signal line RST to the H level, thereby resetting the voltage of the floating diffusion FD and the FD coupling lines FDCL_L and FDCL_U. By the operation, the reset level (dark-time level) of the potential of the floating diffusion FD is determined. The potential at the dark-time level is output to the horizontal scanning circuit 3 via the output signal line VOUT of each column.

The vertical scanning circuit 2 resets the voltage of the control signal line RST to the L level and, after that, sets the voltage of the control signal line TX1 to the H level at the following time t3, thereby transferring electrons accumulated in the photodiode PD1 to the floating diffusion FD. Consequently, the potential of the floating diffusion FD changes in proportion to the number of electrons accumulated in the photodiode PD1, thereby changing from the reset level to the signal level of the photodiode PD1 (PD signal level). After the transfer, the voltage of the control signal line TX1 is reset to the L level. The PD signal level is output to the horizontal scanning circuit 3 via the output signal line VOUT.

At the following time t4, to read a signal of the photodiode PD2, the vertical scanning circuit 2 sets the voltage of the control signal line RST to the H level, thereby resetting the voltage of the floating diffusion FD and the FD coupling lines FDCL_L and FDCL_U. In such a manner, the reset level of the potential of the floating diffusion FD is determined.

The vertical scanning circuit 2 resets the voltage of the control signal line RST to the L level and, at the following time t5, sets the voltage of the control signal line TX2 to the H level, thereby transferring electrons accumulated in the photodiode PD2 to the floating diffusion FD. Consequently, the potential of the floating diffusion FD changes from the reset level to the signal level of the photodiode PD2. After the transfer, the voltage of the control signal line TX2 is reset to the L level. The PD signal level is output to the horizontal scanning circuit 3 via the output signal line VOUT row by row.

2. Case in FDSW-Off Mode, that is, Low-Luminous-Intensity Imaging Mode

With reference to FIGS. 20 and 21B, the operation in the FDSW-off mode (low-luminous-intensity imaging mode) will be described.

At time t1, the vertical scanning circuit 2 sets the voltage of the control signal line SEL to the H level, thereby selecting the pixel unit PUA in a row as a signal reading object. The voltage of the control signal line SEL is always set to the H level in the reading operation.

At the next time t2, the vertical scanning circuit 2 sets the voltage of the control signal lines RST and FDSW to the H level, thereby resetting the voltage of the floating diffusion FD. By the operation, the reset level (dark-time level) of the potential of the floating diffusion FD is determined. The potential at the dark-time level is output to the horizontal scanning circuit 3 via the output signal line VOUT row by row.

The vertical scanning circuit 2 resets the voltage of the control signal lines RST and FDSW to the L level and, after that, sets the voltage of the control signal line TX1 to the H level at the following time t3, thereby transferring electrons accumulated in the photodiode PD1 to the floating diffusion FD. Consequently, the potential of the floating diffusion FD changes from the reset level to the signal level of the photodiode PD1 (PD signal level). After the transfer, the voltage of the control signal line TX1 is reset to the L level. The PD signal level is output to the horizontal scanning circuit 3 via the output signal line VOUT row by row.

At the following time t4, to read a signal of the photodiode PD2, the vertical scanning circuit 2 sets the voltage of the control signal lines RST and FDSW to the H level, thereby resetting the voltage of the floating diffusion FD. In such a manner, the reset level of the potential of the floating diffusion FD is determined.

The vertical scanning circuit 2 resets the voltage of the control signal lines RST and FDSW to the L level and, at the following time t5, sets the voltage of the control signal line TX2 to the H level, thereby transferring electrons accumulated in the photodiode PD2 to the floating diffusion FD. Consequently, the potential of the floating diffusion FD changes from the reset level to the signal level of the photodiode PD2. After the transfer, the voltage of the control signal line TX2 is reset to the L level. The PD signal level is output to the horizontal scanning circuit 3 via the output signal line VOUT row by row.

The characteristic of the FDSW-off mode in comparison to the FDSW-on mode is as follows. In the FDSW-on mode, to reset the floating diffusion FD, the voltage of the control signal line RST is switched from the low level (L level) to the H level. The control signal line FDSW is always at the H level. In contrast, in the FDSW-off mode, by switching the voltage of both of the control signal lines FDSW and RST from the L level to the H level, the floating diffusion FD is reset. That is, in the FDSW-off mode, the role of resetting the floating diffusion FD is played by both of the reset transistor MRST and the FD switching transistors MFDSW1 and MFDSW2, not only by the reset transistor MRST.

Layout of Pixel Unit

Figure 22:
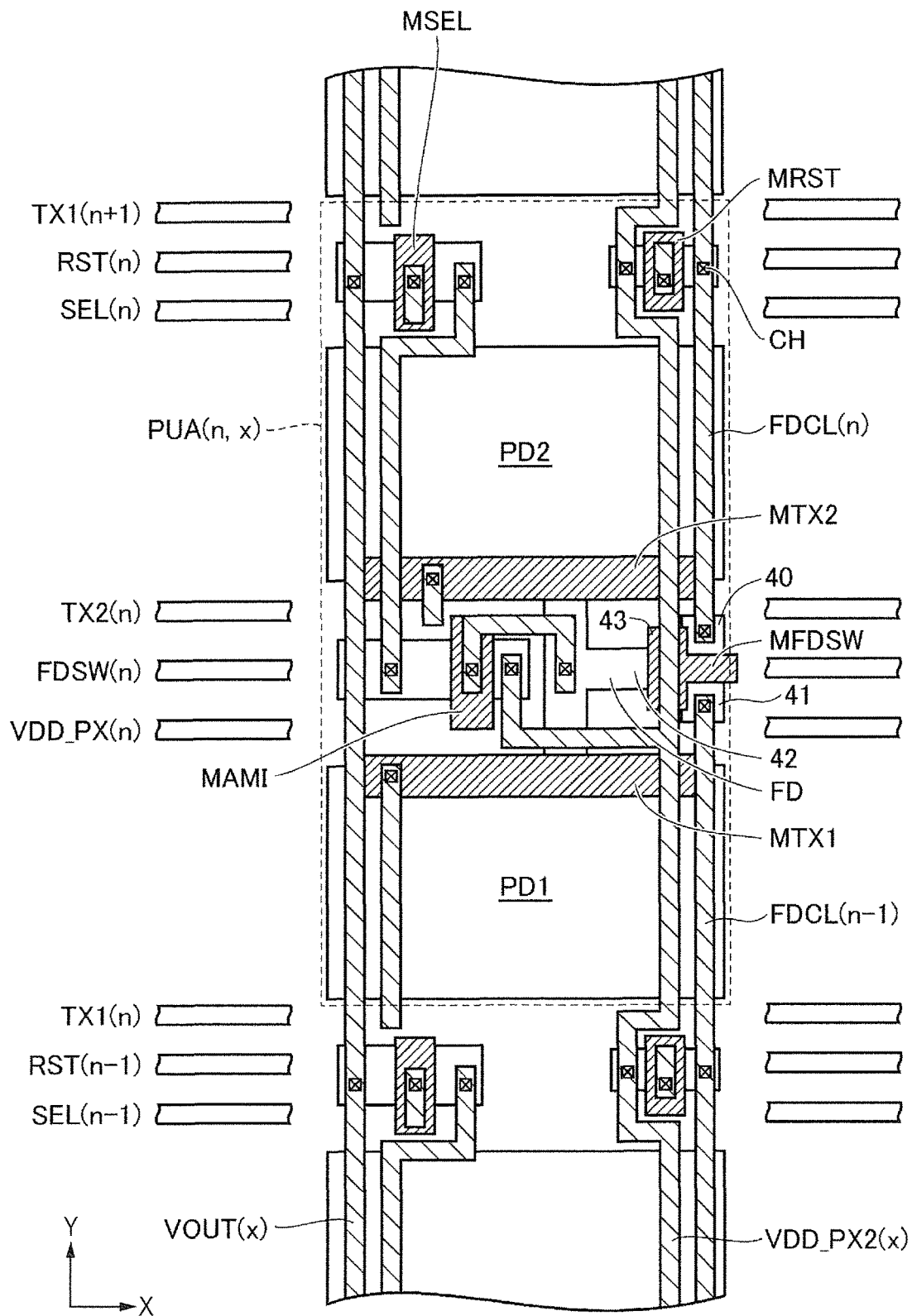
FIG. 22 is a plan view schematically illustrating a layout of a pixel unit from a substrate to a first metal wiring layer in the fifth embodiment.
Figure 23:
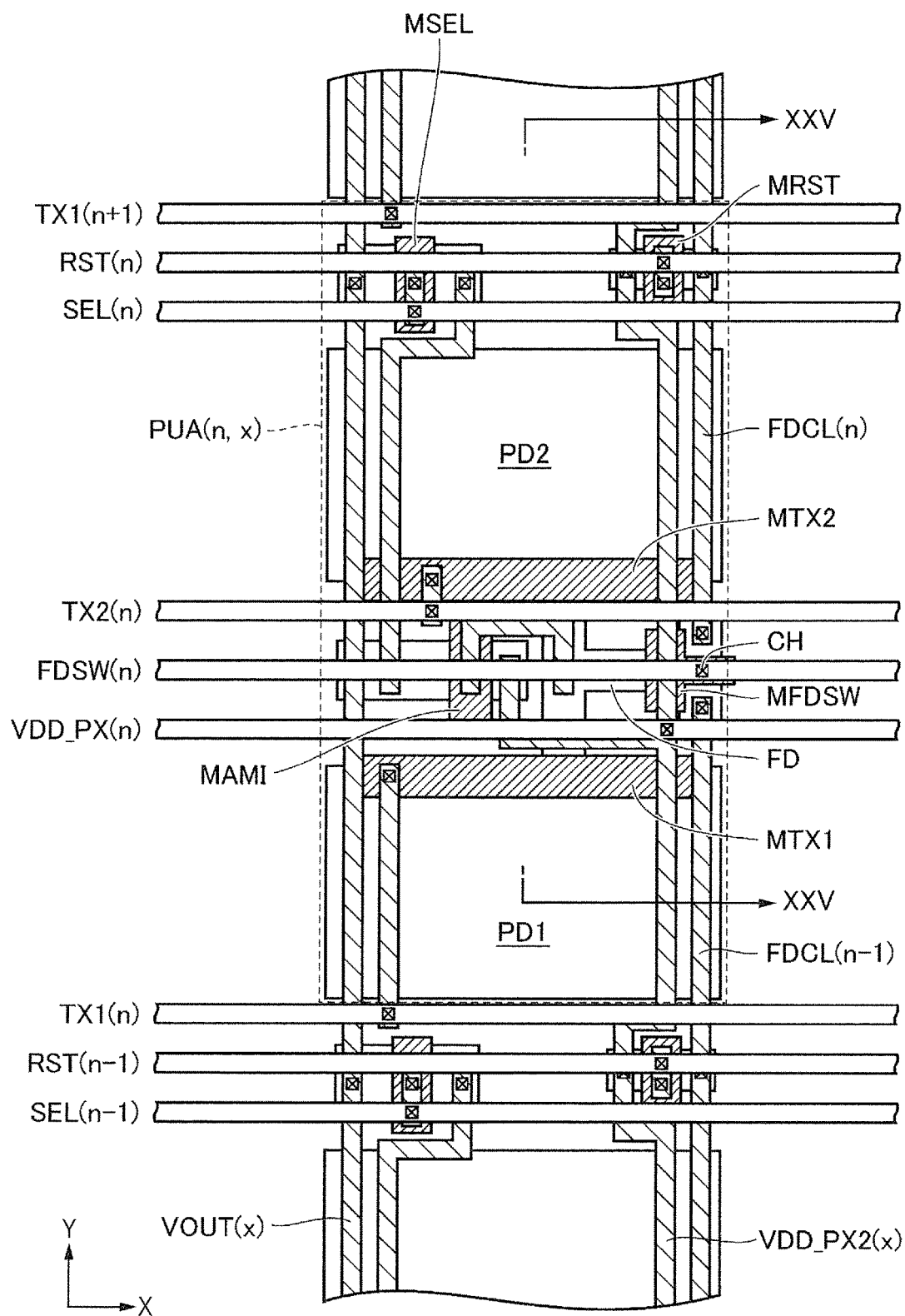
FIG. 23 is a plan view schematically illustrating a layout of a pixel unit from a substrate to a second metal wiring layer in the fifth embodiment.
Figure 24:
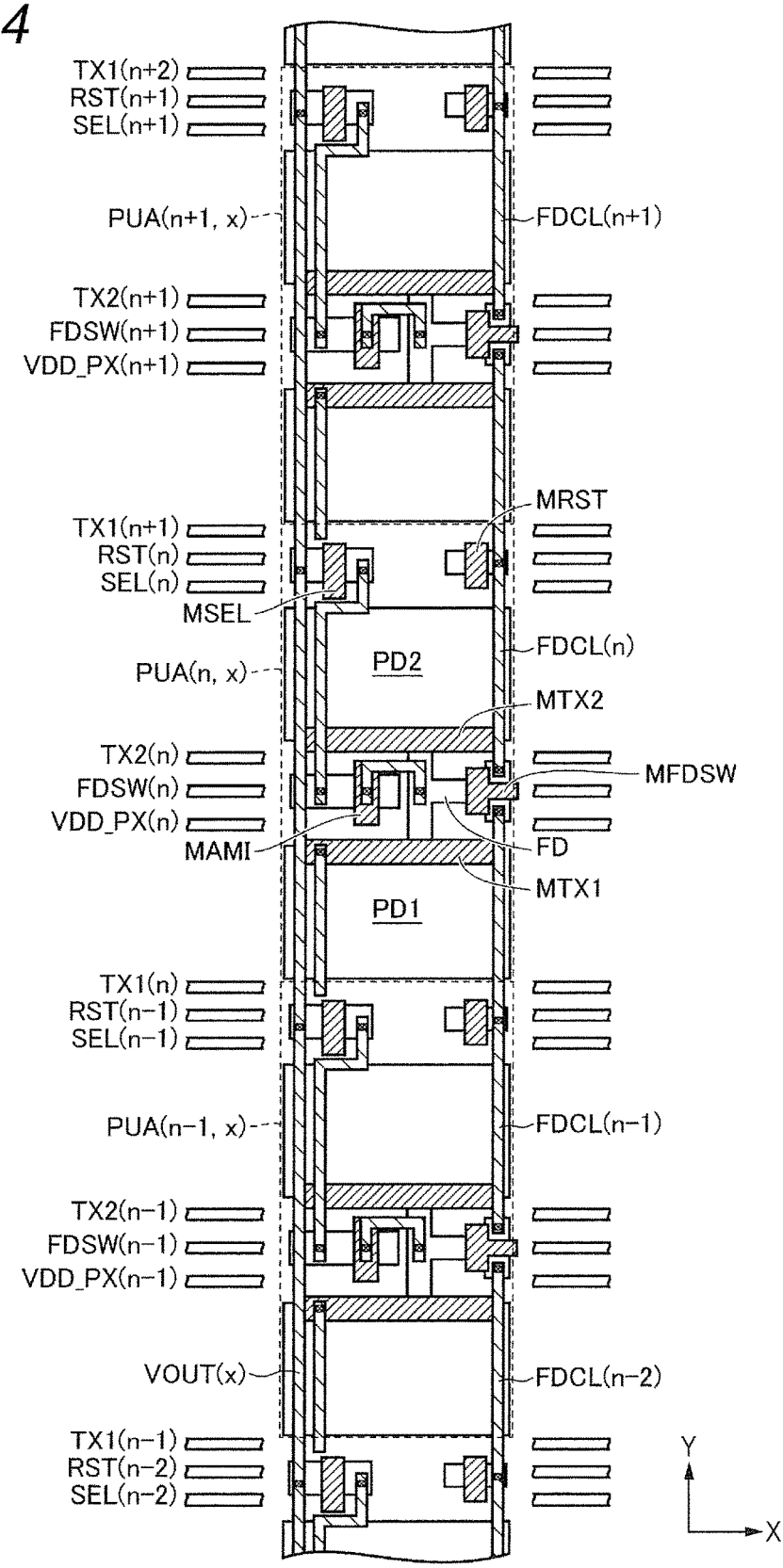
FIG. 24 is a plan view schematically illustrating a layout from a substrate to a first metal wiring layer of three pixel units adjacent in the column direction in the fifth embodiment.

FIG. 22 is a plan view schematically illustrating a layout of a pixel unit from a substrate to a first metal wiring layer in the fifth embodiment. In FIG. 22, only a schematic layout of the second metal wiring layer over the first metal wiring layer is illustrated. FIG. 23 is a plan view schematically illustrating a layout of a pixel unit from a substrate to a second metal wiring layer in the fifth embodiment. FIG. 24 is a plan view schematically illustrating a layout from a substrate to a first metal wiring layer of three pixel units adjacent in the column direction in the fifth embodiment. In FIG. 24, to facilitate graphic explanation, a part of the first metal wiring layer is not illustrated.

In FIGS. 22 to 24, the row direction of the pixel array is set as an X-axis direction, and the column direction is set as a Y-axis direction. In the case of discriminating upper and lower directions of the drawing sheet in the Y-axis direction, positive and negative signs are designated as +Y direction and −Y direction. The upper and lower directions are discriminated similarly also in the X-axis direction. Reference numerals expressing the NMOS transistors illustrated in FIG. 20 are designated to gate electrodes. To facilitate graphic explanation, the gate electrode layer and the first metal wiring layer are hatched.

Referring to FIGS. 22 to 24, the phototransistors PD1 and PD2 constructing the pixel unit PUA(n, x) are arranged so as to be lined in the Y-axis direction. Between the phototransistors PD1 and PD2, an N-type impurity region is formed as a floating diffusion FD. A gate electrode for the transfer transistor MTX1 is formed so as to cover a channel region between the floating diffusion FD and the phototransistor PD1. Similarly, a gate electrode for the transfer transistor MTX2 is formed so as to cover a channel region between the floating diffusion FD and the phototransistor PD2.

The FD switching unit MFDSW is arranged adjacent to the floating diffusion FD in the +X direction. The FD switching unit MFDSW has a structure that gaps among three impurity regions made by impurity regions 40 and 41 and an impurity region 42 also used as the floating diffusion FD are covered with a gate electrode part 43. The impurity region 40 is coupled to an FD coupling line FDCL(n) formed by the first metal wiring layer and coupled to the FD coupling line FDCL(n) extending in the +Y direction via the contact hole CH. The FD coupling line FDCL(n) is coupled to the impurity region 41 of the FD switching unit MFDSW of the pixel unit PUA(n+1, x) via the contact hole CH. The impurity region 41 is formed by the first metal wiring layer and coupled to the FD coupling line FDCL (n−1) extending in the −Y direction via the contact hole. The FD coupling line FDCL(n−1) is coupled to the impurity region 40 of the FD switching unit MFDSW of the pixel unit PUA(n−1, x). An equivalent circuit of the FD switching unit MFDSW will be described with reference to FIGS. 26 to 28.

The amplification transistor MAMI is arranged adjacent to the floating diffusion FD in the −X direction. The first impurity region in the amplification transistor MAMI is coupled to a power supply line VDD_PX2(x) which is formed by the first metal wiring layer and extends almost in the Y-axis direction via a wire of the first metal wiring layer. The gate electrode of the amplification transistor MAMI is coupled to the floating diffusion FD via the wiring of the first metal wiring layer.

On the side opposite to the floating diffusion FD while sandwiching the phototransistor PD2 (that is, between the phototransistor PD2 of the pixel unit PUA(n, x) and the phototransistor PD1 of the pixel unit PUA(n+1, x)), the reset transistor MRST and the selection transistor MSEL are arranged so as to be lined in the X-axis direction. The reset transistor MRST is arranged on the +X direction side. The first impurity region in the reset transistor MRST is coupled to the FD coupling line FDCL(n) via the contact hole CH. The second impurity region in the reset transistor MRST is coupled to the power supply line VDD_PX2 via the contact hole CH.

The first impurity region in the selection transistor MSEL is coupled to the second impurity region in the amplification transistor MAMI via a metal wire which is formed by the first metal wiring layer and extends almost in the −Y direction (the metal wire crossovers an end of the photodiode PD2). The second impurity region in the selection transistor MSEL is coupled to the output signal line VOUT (x) which is formed by the first metal wiring layer and extends in the Y-axis direction via the contact hole CH.

The control signal lines FDSW1(n), RST(n), TX1(n), TX2(n), and SEL(n) and the power supply line VDD_PX(n) are formed by using a second metal wiring layer. The control signal line FDSW(n) is coupled to the gate electrode unit 43 of the FD switching unit MFDSW via the contact hole CH. The control signal line RST(n) is coupled to the gate electrode of the reset transistor MRST via the metal line formed by the first metal wiring layer. The control signal lines TX1(n) and TX2(n) are coupled to the gate electrodes of the transfer transistors MTX1 and MTX2, respectively, via a metal line formed by the first metal wiring layer. The control signal line SEL(n) is coupled to the gate electrode of the selection transistor MSEL via a metal line formed by the first metal wiring layer. The power supply line VDD_PX(n) is coupled to the power supply line VDD_PX2(x) which is formed by the first metal wiring layer and extends almost in the Y-axis direction via the contact hole CH.

Figure 25:
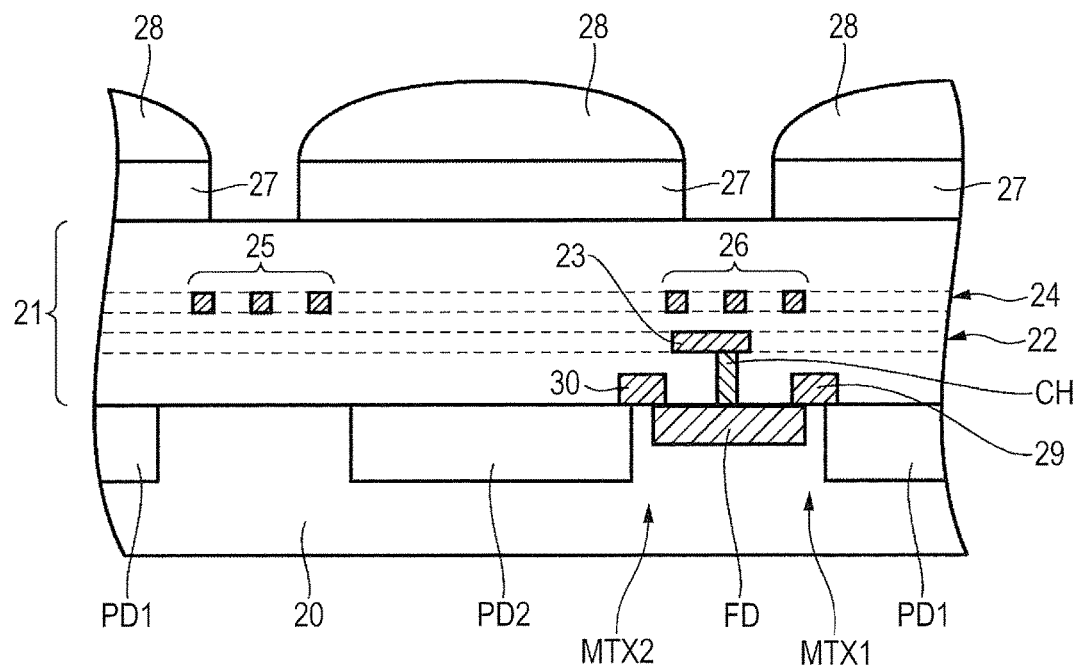
FIG. 25 is a cross section taken along line XXV-XXV in FIG. 23.

FIG. 25 is a cross section taken along line XXV-XXV in FIG. 23.

Referring to FIG. 25, in the semiconductor substrate 20, the photodiodes PD1 and PD2, the floating diffusion FD, and impurity regions (the source region and the drain region) of a not-illustrated transistor are formed.

The interlayer insulating layer 21 is formed on the semiconductor substrate 20, and the plurality of color filters 27 are formed on the interlayer insulating layer 21. Further, the plurality of micro lenses 28 are formed on the plurality of color filters 27. The color filters 27 and the micro lenses 28 are formed above the corresponding photodiode PD1 or PD2.

In the interlayer insulating layer 21, the gate electrodes 29 and 30, the first metal wiring layer 22, and the second metal wiring layer 24 are formed in order from the side of the substrate 20. Between the gate electrodes 29 and 30 and a channel region, a not-illustrated gate insulating film is formed. A metal wire (such as 23) formed in the first metal wiring layer 22 is coupled to the floating diffusion FD or an impurity region or a gate electrode of a transistor via the contact hole CH. The metal wires 25 and 26 formed in the second metal wiring layer 24 correspond to the control signal lines FDSW(n), RST(n), TX1(n+1), TX2(n), and SEL(n) and the power supply line VDD_PX(n). The metal wires 25 and 26 are coupled to a metal wire formed in the first metal wiring layer via the contact hole CH.

Equivalent Circuit of FD Switching Unit

Figure 26A:
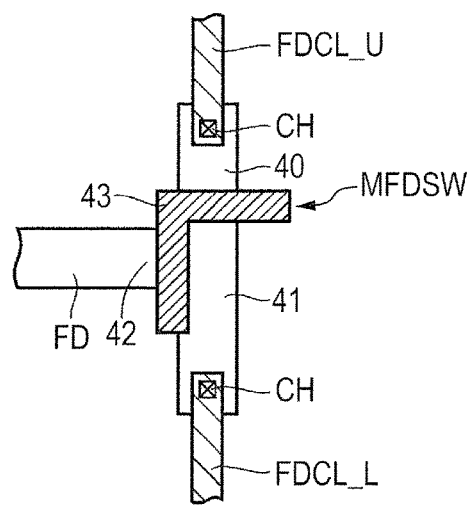
FIGS. 26A and 26B are diagrams for explaining the configuration of an FD switching unit illustrated in FIGS. 22 to 24.
Figure 26B:
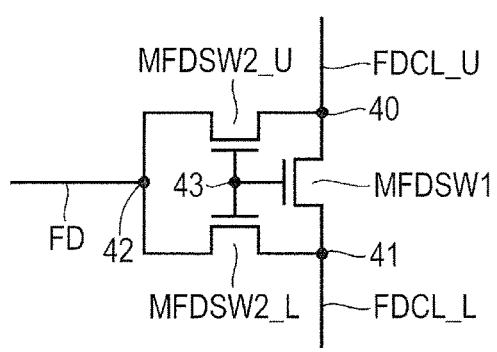

FIGS. 26A and 26B are diagrams for explaining the configuration of the FD switching unit illustrated in FIGS. 22 to 24. FIG. 26A schematically illustrates a layout of the FD switching unit MFDSW and FIG. 26B is a circuit diagram corresponding to the layout of FIG. 26A.

Referring to FIG. 26A, the FD switching unit MFDSW has a structure that gaps among three impurity regions made by the impurity regions 40 and 41 and the impurity region 42 also used as the floating diffusion FD are covered with the gate electrode part 43. The impurity region 40 is coupled to the FD coupling line FDCL_U via the contact hole CH, and the impurity region 41 is coupled to the FD coupling line FDCL_L via the contact hole CH.

As illustrated in FIG. 26B, the FD switching unit MFDSW in FIG. 26A has a structure that three NMOS transistors MFDSW2_U, MFDSW2_L, and MFDSW1 are coupled. The NMOS transistor MFDSW2_U is coupled between the floating diffusion FD and the FD coupling line FDCL_U. The NMOS transistor MFDSW2_L is coupled between the floating diffusion FD and the FD coupling line FDCL_U. The NMOS transistor MFDSW1 is coupled between the FD coupling lines FDCL_U and FDCL_L.

The gates of the NMOS transistors MFDSW2_U, MFDSW2_L, and MFDSW1 are integrally formed as the gate electrode unit 43 in FIG. 26A, so that they are mutually electrically coupled. Therefore, by a control signal supplied to the common control signal line FDSW, electric connection and electric isolation among the three nodes 40, 41, and 42 (which are coupled to the FD coupling lines FDCL_U and FDCL_L and the floating diffusion FD, respectively) is controlled.

Figure 27A:
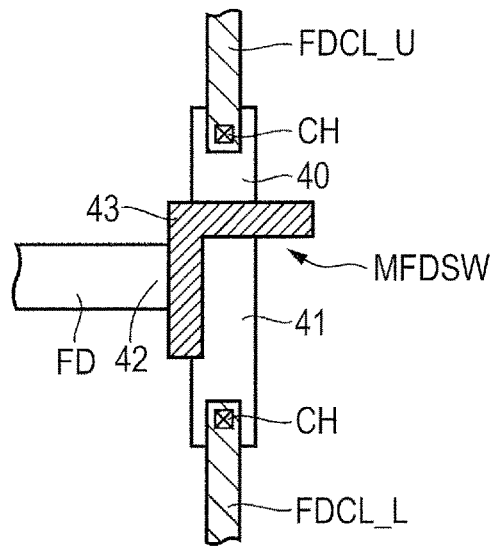
FIGS. 27A and 27B are diagrams illustrating a first modification of the FD switching unit of FIGS. 26A and 26B.
Figure 27B:
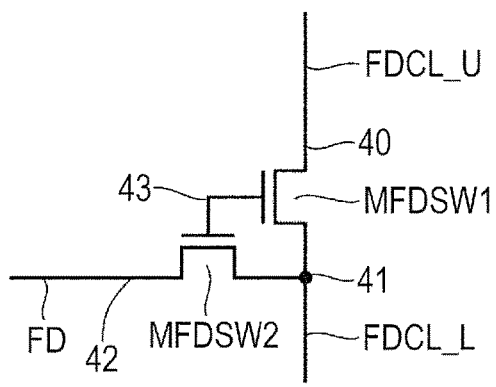

FIGS. 27A and 27B are diagrams illustrating a first modification of the FD switching unit of FIGS. 26A and 26B. FIG. 27A schematically illustrates a layout of the FD switching unit MFDSW and FIG. 27B is a circuit diagram corresponding to the layout of FIG. 27A.

As illustrated in FIG. 27A, the FD switching unit MFDSW in FIG. 27A has a structure that the two NMOS transistors MFDSW1 and MFDSW2 are coupled and the structure is the same as the circuit diagram of FIG. 20. The NMOS transistor MFDSW2 is coupled between the floating diffusion FD and the FD coupling line FDCL_L. The NMOS transistor MFDSW1 is coupled between the FD coupling lines FDCL_U and FDCL_L.

The gates of the NMOS transistors MFDSW1 and MFDSW2 are integrally formed as the gate electrode unit 43 in FIG. 27A, so that they are mutually electrically coupled. Therefore, by a control signal supplied to the common control signal line FDSW, electric connection and electric isolation among the three nodes 40, 41, and 42 (which are coupled to the FD coupling lines FDCL_U and FDCL_L and the floating diffusion FD, respectively) is controlled.

Figure 28A:
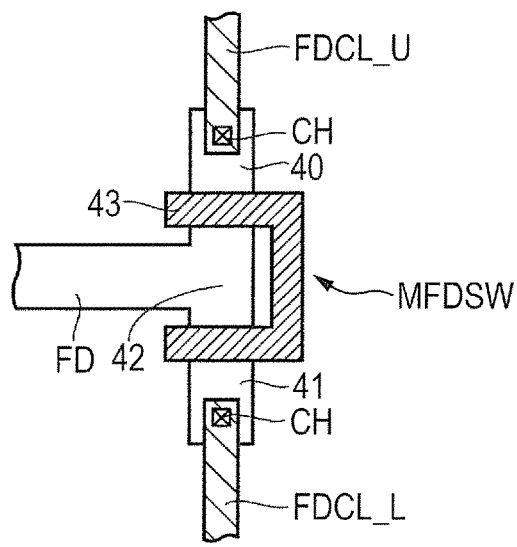
FIGS. 28A and 28B are diagrams illustrating a second modification of the FD switching unit of FIGS. 26A and 26B.
Figure 28B:
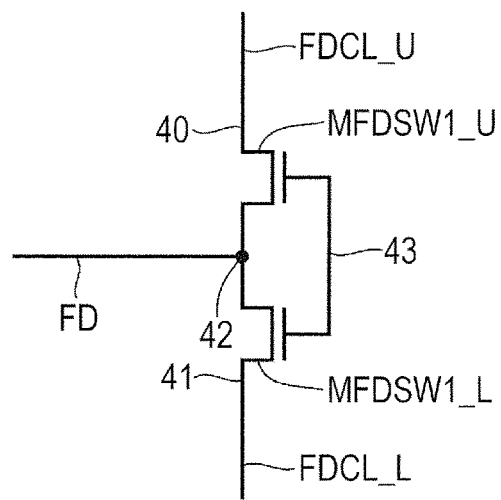

FIGS. 28A and 28B are diagrams illustrating a second modification of the FD switching unit of FIGS. 26A and 26B. FIG. 28A schematically illustrates a layout of the FD switching unit MFDSW and FIG. 28B is a circuit diagram corresponding to the layout of FIG. 28A.

As illustrated in FIG. 28B, the FD switching unit MFDSW in FIG. 28A has a structure that the two NMOS transistors MFDSW1_U and MFDSW1_L are coupled. The NMOS transistors MFDSW1_U and MFDSW1_L are coupled in series between the FD coupling lines FDCL_U and FDCL_L. The floating diffusion FD is coupled to the connection node 42 of the NMOS transistors MFDSW1_U and MFDSW1_L.

The gates of the NMOS transistors MFDSW1_U and MFDSW1_L are integrally formed as the gate electrode unit 43 in FIG. 28A, so that they are mutually electrically coupled. Therefore, by a control signal supplied to the common control signal line FDSW, electric connection and electric isolation among the three nodes 40, 41, and 42 (which are coupled to the FD coupling lines FDCL_U and FDCL_L and the floating diffusion FD, respectively) is controlled.

Effects of Fifth Embodiment

According to the fifth embodiment, by mutually coupling the gates of the two FD switching transistors MFDSW1 and MFDSW2 in the first embodiment, the transistors are controlled by one control signal line. More generally, each pixel unit includes the FD switching unit MFDSW which electrically couples or electrically isolates the first to third nodes in response to a common control signal. The first and second nodes are coupled to the FD coupling lines on the upper and lower sides, respectively, which are adjacent to each other in the column direction. The third node is coupled to the floating diffusion FD.

Therefore, the number of control signal lines can be reduced as compared with that in the first embodiment. Further, the aperture ratio becomes higher as in the sectional structure of the pixel of FIG. 25 from the pixel sectional structure in the case of the first embodiment illustrated in FIG. 7 by reduction in the number of control lines, so that deterioration in the sensitivity characteristic can be suppressed. Since the gate electrodes of the two FD switching transistors MFDSW1 and MFDSW2 (that is, a plurality of transistors constructing the FD switching unit) are integrally formed, the area necessary for disposition of the transistors can be reduced. Therefore, the flexibility in disposition of each of the transistors included in the pixel unit increases.

Modifications

It is not always necessary to provide the FD switching transistor MFDSW1 for each pixel unit PUA. Generally, the plurality of switching transistors MFDSW1 are provided in correspondence with at least a part of the plurality of pixel units PUA provided for the columns. In this case, the switching transistors MFDSW1 are arranged so as to couple the plurality of FD coupling lines FDCL extending in the column direction. The FD switching transistor MFDSW2 provided for each pixel unit PUA is coupled between any of the plurality of FD coupling lines provided in the same column and the floating diffusion FD. The gate of each switching transistor MFDSW1 is electrically coupled to the gate of the switching transistor MFDSW2 of a corresponding pixel unit PUA. Preferably, the gate electrode of each switching transistor MFDSW1 and the gate electrode of the corresponding switching transistor MFDSW2 are integrally formed.

In the case of the above configuration, the reset transistor MRST does not always have to be provided for each pixel unit PUA but may be provided in correspondence with each of a plurality of FD coupling lines FDCL.

In place of the FD switching transistor MFDSW1, an FD switching unit MFDSW electrically coupling or electrically isolating the first to third nodes may be provided. Each of a plurality of FD switching units MFDSW is coupled between adjacent FD coupling lines FDCL. The first node of each of the FD switching units MFDSW is coupled to the floating diffusion FD of the corresponding pixel unit PUA. The second and third nodes of each FD switching unit MFDSW are coupled to FD coupling lines FDCL adjacent on the upper and lower sides in the column direction.

Sixth Embodiment

In a sixth embodiment, during a reading period by exposure of once in the rolling shutter method, both of a read signal in the FDSW-on mode (high-luminous-intensity imaging mode) described in the fifth embodiment and a read signal in the FDSW-off mode (low-luminous-intensity imaging mode) are detected. Therefore, there is an advantage that it is unnecessary to set an operation mode in accordance with illuminous intensity of light from a subject in advance.

Since the rolling shutter method is the same as that described with reference to FIG. 10, its description will not be repeated.

Configuration of Pixel Array

Figure 29:
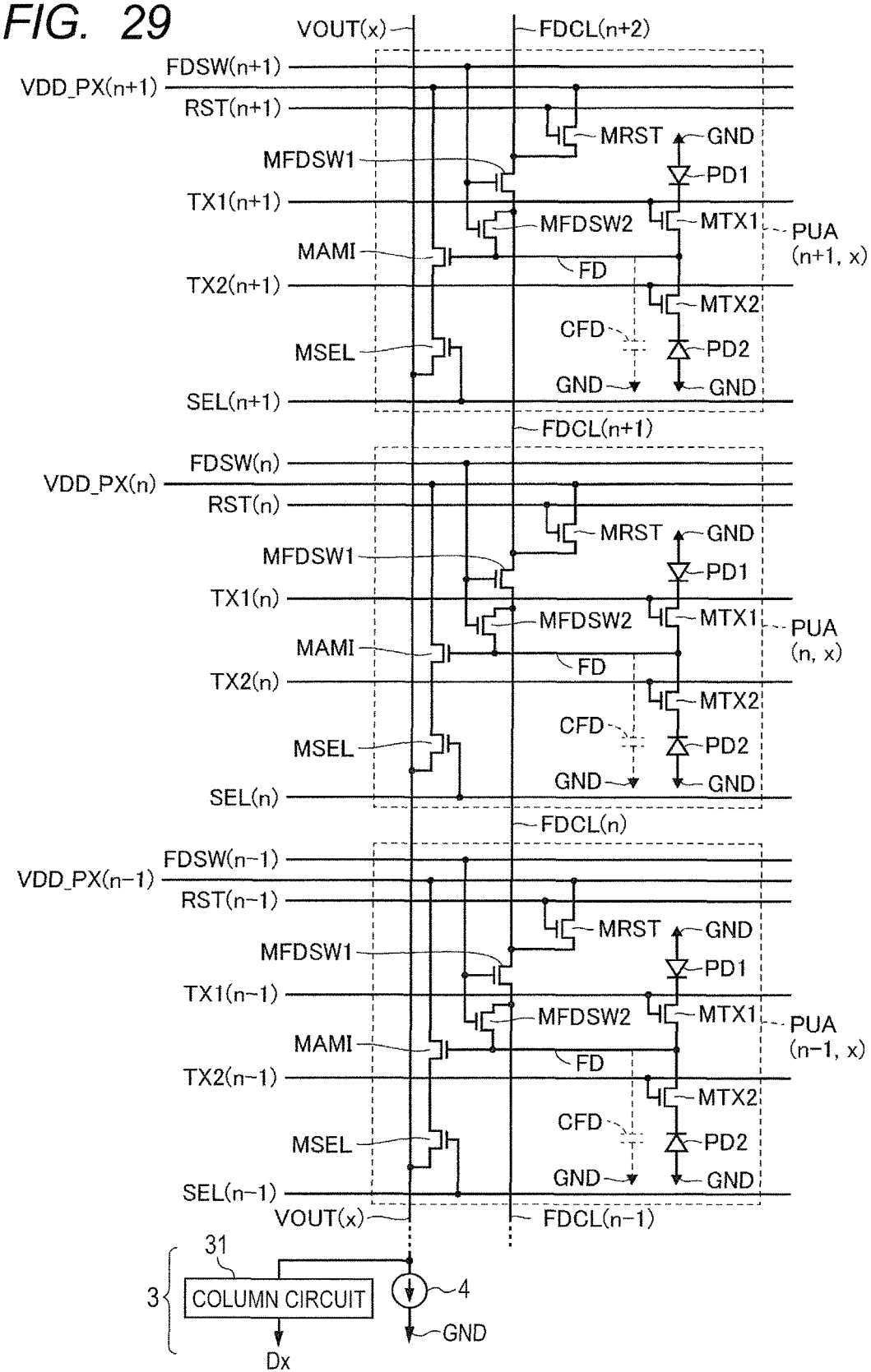
FIG. 29 is a circuit diagram illustrating the configuration of the X-th column in a pixel array in an imaging device according to a sixth embodiment.

FIG. 29 is a circuit diagram illustrating the configuration of the x-th column in a pixel array in an imaging device according to a sixth embodiment. In FIG. 29, a circuit diagram of three pixel units PUA(n−1, x), PUA(n, x), and PUA(n+1, x) adjacent in the column direction is representatively illustrated. Since the circuit configuration of each of the pixel units PUA is the same as that in the case of the first embodiment, its description will not be repeated. In FIG. 29, an FD coupling line coupled to the floating diffusion FD provided for the PUA(n, x) in the n-th row via the FD switching transistor MFDSW2 is written as FDCL(n).

In the imaging device of FIG. 29, a further detailed configuration of the horizontal scanning circuit 3 is illustrated. Since the concrete configuration is the same as that described with reference to FIGS. 8 and 9, its detailed description will not be repeated. In place of the column circuit 31 in FIG. 29, the column circuit 32 described with reference to FIG. 15 may be provided.

Details of Reading Operation

Figure 30:
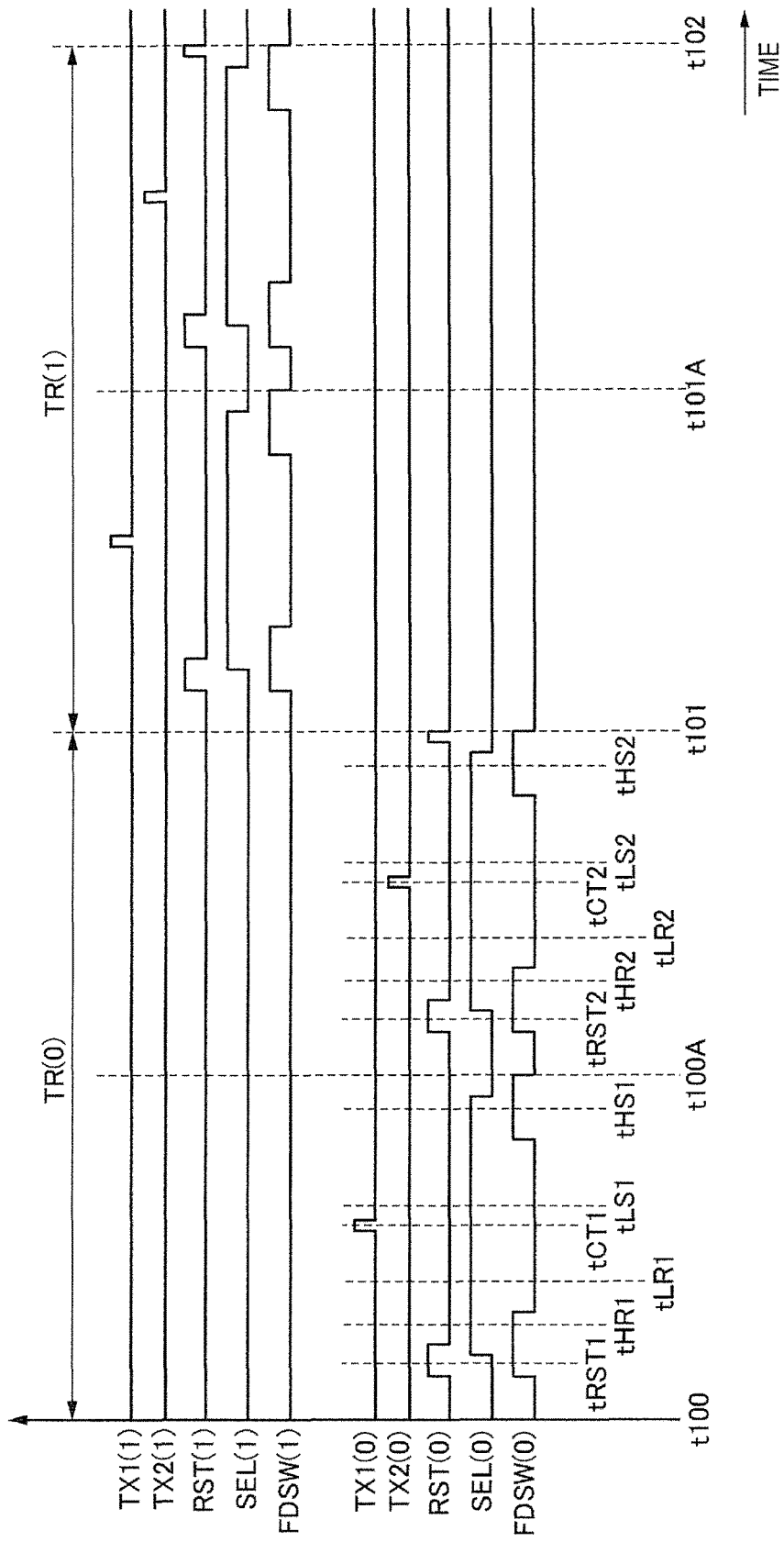
FIG. 30 is a timing chart for explaining reading operation of each pixel unit in FIG. 29.

FIG. 30 is a timing chart illustrating reading operation of each pixel unit in FIG. 29. To simplify description, it is assumed that (N+1) pieces of pixel units PU are arranged in each of total 17 rows from the zeroth row (Row0) to the 16th row (Row16) in the pixel array.

In each of the read periods started after completion of the photoelectron accumulation period described in FIG. 10, in response to control signals output from the vertical scanning circuit 2 to the control signal lines TX1, TX2, RST, SEL, and FDSW, the accumulated charges in the photodiodes PD1 and PD2 of the pixel units PU in the rows are read.

Concretely, in a read period TR(0) in FIG. 30, the vertical scanning circuit 2 reads data simultaneously from N+1 pieces of pixel units PUA(0,0) to PUA(0,N) arranged in the zeroth row (Row0) by control signals output to control signal lines TX1(0), TX2(0), RST(0), SEL(0), and FDSW (0). The output data of the pixel units PUA arranged in the zeroth row in the pixel array 1 is input to corresponding column circuits 31 via the output signal lines VOUT coupled to the pixel units PUA. Similarly, in each of read periods TR(1) to TR(16), data of the pixel units PUA arranged from the first row to the 16th row is read.

Hereinbelow, referring to FIGS. 29 and 30, the procedure of reading data from the pixel units PUA arranged in the zeroth row in the pixel array 1 will be described. The read period TR(0) (from time t100 to time t101) is divided into the first half (t100 to t100A) and the latter half (t100A to t101). In the first half of the read period TR(0), charges accumulated in the photodiodes PD1 of the pixel units PUA in the zeroth row are read. In the latter half of the read period TR(0), charges accumulated in the photodiodes PD2 of the pixel units PUA in the zeroth row are read.

1. Reset of Floating Diffusion FD and FD Coupling Line FDCL

Between the time t100 and time rRST1, the vertical scanning circuit 2 changes the voltage of the control signal lines FDSW(0) and RST(0) from the L level to the H level, thereby setting the FD switching transistors MFDSW and the reset transistor MRST in each of the pixel units PUA in the zeroth row to the on state. As a result, the floating diffusion FD provided in each of the pixel units PUA in the zeroth row and the FD coupling lines FDCL(0) and FDCL (1) of each column are reset. Since the control signal lines TX1(0), TX2(0), and SEL(0) are at the L level at this time, the transfer transistors MTX1 and MTX2 and the selection transistor MSEL of the pixel unit PUA(0,x) are in the off state. In the example illustrated in FIG. 30, all of the voltages of the control signal lines other than the zeroth row are set to the L level.

2. Reading of Reset Level for High Luminous Intensity

By changing the voltage of the control signal line RST(0) from the H level to the L level between the time tRST1 and the next time tHR1, the vertical scanning circuit 2 cancels reset by setting the reset transistor MRST provided for each of the pixel units PUA in the zeroth row to the off state. As a result, charges which become a cause of the reset noise for high luminous intensity are accumulated in the capacitance CFD of the floating diffusion FD and the capacitances of the FD coupling lines FDCL(0) and FDCL(1).

By further changing the voltage of the control signal line SEL(0) from the L level to the H level between the time tRST1 and the next time tHR1, the vertical scanning circuit 2 sets the selection transistor MSEL provided for each of the pixel units PUA in the zeroth row to the on state (that is, the zeroth line of the pixel array 1 becomes a selection state). As a result, the reset noise for high luminous intensity is amplified by the amplification transistor MAMI, and the amplified noise is output to the column circuit 31 via the selection transistor MSEL and the output signal line VOUT.

At the next time tHR1, the programmable gain amplifier PGA included in the column circuit 31 amplifies the reset noise for high luminous intensity output from the amplification transistor MAMI and outputs the reset level for high luminous intensity generated by the amplification as the PGA output signal POUT.

3. Reading of Reset Level for Low Luminous Intensity

By changing the voltage of the control signal line FDSW(0) from the H level to the L level between the time tHR1 and the next time tLR1, the vertical scanning circuit 2 sets the FD switching transistors MFDSW1 and MFDSW2 provided for each of the pixel units PUA in the zeroth row to the off state. As a result, the capacitance of the FD coupling lines FDCL(0) and FDCL(1) is isolated from the capacitance CFD of the floating diffusion FD. Since the voltage of the control signal line SEL(0) is maintained at the H level, the reset noise for low luminous intensity caused only by the floating diffusion FD is amplified by the amplification transistor MAMI. The amplified reset noise for low luminous intensity is input to the column circuit 31 via the selection transistor MSEL and the output signal line VOUT.

At the next time tLR1, the programmable gain amplifier PGA included in the column circuit 31 amplifies the reset noise for low luminous intensity output from the amplification transistor MAMI and outputs the reset level for low luminous intensity generated by the amplification as the PGA output signal POUT.

4. Photo-Charge Transfer

At the next time tCT1, the vertical scanning circuit 2 outputs a one-shot pulse which becomes the H level for only a predetermined period to the control signal line TX1(0). At this time, the voltage of other control signal lines coupled to the pixel units PUA in the zeroth row maintains the value at the time tLR. Therefore, in the period that the voltage of the control signal line TX1(0) is at the H level, the photo-charges (electrons) accumulated in the photodiode PD1 are transferred to the floating diffusion FD. In high-luminous-intensity imaging, there is a case that a part of the photo-charges overflows from the floating diffusion FD and is held in the capacitance of the FD coupling line FDCL.

5. Reading of Signal Level for Low Luminous Intensity

After outputting the one-shot pulse to the control signal line TX1(0) at the time tCT1, the floating diffusion FD holds a mixture signal for low luminous intensity obtained by mixing the charges as a cause of the reset noise for low luminous intensity and the charges transferred from the photodiode PD1. The mixture signal for low luminous intensity is amplified by the amplification transistor MAMI and, after that, the amplified mixture signal for low luminous intensity is input to the column circuit 31 via the selection transistor MSEL and the output signal line VOUT.

At the next time tLS1, the programmable gain amplifier PGA included in the column circuit 31 amplifies the mixture signal for low luminous intensity output from the amplification transistor MAMI and outputs the signal level for low luminous intensity generated by the amplification as the PGA output signal POUT. In high-luminous-intensity imaging, there is a case that the signal level for low luminous intensity reaches a saturation voltage.

6. Reading of Signal Level for High Luminous Intensity

By changing the voltage of the control signal line FDSW(0) from the L level to the H level between the time tLS1 and the next time tHS1, the vertical scanning circuit 2 sets the FD switching transistors MFDSW1 and MFDSW2 provided for each of the pixel units PUA in the zeroth row to the on state. As a result, the floating diffusion FD and the FD coupling lines FDCL(0) and FDCL(1) are coupled. Consequently, the charges held in the floating diffusion FD and the charges held in the FD coupling lines FDCL(0) and FDCL(1) are mixed. The mixed charges are held in the entire of the floating diffusion FD and the FD coupling lines FDCL(0) and FDCL(1). The voltage value (mixture signal for high luminous intensity) of the floating diffusion FD and the FD coupling lines FDCL(0) and FDCL(1) at this time is amplified by the amplification transistor MAMI and, after that, the amplified mixture signal for high luminous intensity is input to the column circuit 31 via the selection transistor MSEL and the output signal line VOUT.

At the next time tHS1, the programmable gain amplifier PGA included in the column circuit 31 amplifies the mixture signal for high luminous intensity output from the amplification transistor MAMI and outputs the signal level for high luminous intensity generated by the amplification as the PGA output signal POUT.

7. End of First Half of Read Period TR(0)

After completion of the reading of the signal level for high luminous intensity, the vertical scanning circuit 2 changes the voltage of the control signal line SEL(0) from the H level to the L level, thereby setting the selection transistor MSEL provided for each of the pixel units PUA in the zeroth row to the off state (that is, selection of the zeroth row in the pixel array 1 is finished). At time t100A, the vertical scanning circuit 2 changes the voltage of the control signal line FDSW(0) from the H level to the L level, thereby completing the first half of the read period TR(0).

8. Latter Half of Read Period TR(0)

The voltage changes in the control signals TX1(0), TX2(0), RST(0), SEL(0), and FDSW(0) in the latter half of the read period TR(0) from the time t100A to the time t101 are the same as those in the first half except for the following two points. In FIG. 30, the times tRST1, tHR1, tLR1, tCT1, tLS1, and tHS1 in the first half correspond to the times tRST2, tHR2, tLR2, tCT2, tLS2, and tHS2 in the latter half, respectively.

First, at time tCT2, the vertical scanning circuit 2 outputs the one-shot pulse which becomes the H level only for a predetermined period to the control signal line TX2(0) in place of the control signal line TX1(0). As a result, in the period in which the voltage of the control signal line TX2(0) is at the H level, the photo-charges (electrons) accumulated in the photodiode PD2 are transferred to the floating diffusion FD. As described above, in the case of high-luminous-intensity imaging, there is the possibility that a part of the photo-charges overflows from the floating diffusion FD and is held in the capacitance of the FD coupling line FDCL.

Further, between the time tHS2 to the time t101, the vertical scanning circuit 2 changes the voltage of the control signal line SEL(0) from the H level to the L level and, after that, changes the voltage of the control signal line RST(0) from the L level to the H level. By the operation, the voltage of the floating diffusion FD provided for the pixel units PUA in the zeroth row and the voltage of the FD coupling lines FDCL(0) and FDCL(1) in each column are reset. After that, the vertical scanning circuit 2 resets the voltage of the control signal line RST(0) to the L level at the time t101.

Effect of Sixth Embodiment

In the sixth embodiment, during the read period by the rolling shutter method with one exposure, both the reset level for high luminous intensity and the high-luminous-intensity signal level obtained by setting each of the FD switching units MFDSW to the on state and the reset level for low luminous intensity and the low-luminous-intensity signal level obtained by setting each of the FD switching units MFDSW to the off state can be detected. Therefore, there is an advantage that it is unnecessary to set the operation mode (high-luminous-intensity imaging mode or low-luminous-intensity imaging mode) in accordance with the luminous intensity of light from the subject in advance as performed in the fifth embodiment.

First Modification of Sixth Embodiment

A rolling shutter method with twice-exposure illustrated in FIG. 14 can be applied to the imaging device of the fifth embodiment.

Concretely, in the read period for low luminous intensity from time t100 to time t101 in FIG. 14, the vertical scanning circuit 2 supplies the voltage signals illustrated in FIG. 21B to the control signal lines RST(0), TX1(0), TX2(0), FDSW (0), and SEL(0) coupled to each of the pixel units PUA in the zeroth row. By the operation, the reset level for low luminous intensity and the signal level for low luminous intensity are output from each of the pixel units PUA in the zeroth row to the column circuit 31 in each of the columns. All of the voltages of the control signal lines in rows other than the zeroth row are set to the L level. The setting is similarly made also in the first to 16th rows.

In the read period for high luminous intensity from time t200 to time t201, the vertical scanning circuit 2 supplies the voltage signals illustrated in FIG. 21A to the control signal lines RST(0), TX1(0), TX2(0), FDSW(0), and SEL(0) coupled to each of the pixel units PUA in the zeroth row. By the operation, the reset level for high luminous intensity and the signal level for high luminous intensity are output from each of the pixel units PUA in the zeroth row to the column circuit 31 in each of the columns. All of the voltages of the control signal lines in rows other than the zeroth row are set to the L level. The setting is similarly made also in the first to 16th rows.

Second Modification of Sixth Embodiment

The top reset transistor MRST_T(x) and the bottom reset transistor MRST_B(x) described in the fourth embodiment can be combined to the circuit diagram of FIG. 29. Specifically, the top reset transistor MRST_T(x) in each column is coupled between the FD coupling line FDCL at the uppermost end and the power supply node VDD. The bottom reset transistor MRST_B(x) in each column is coupled between the FD coupling line FDCL at the lowest end of each column and the power supply node VDD. To the gate of the top reset transistor MRST_T(x) and the gate of the bottom reset transistor MRST_B(x), the all reset signal RST ALL is input from the vertical scanning circuit 2.

Figure 31:
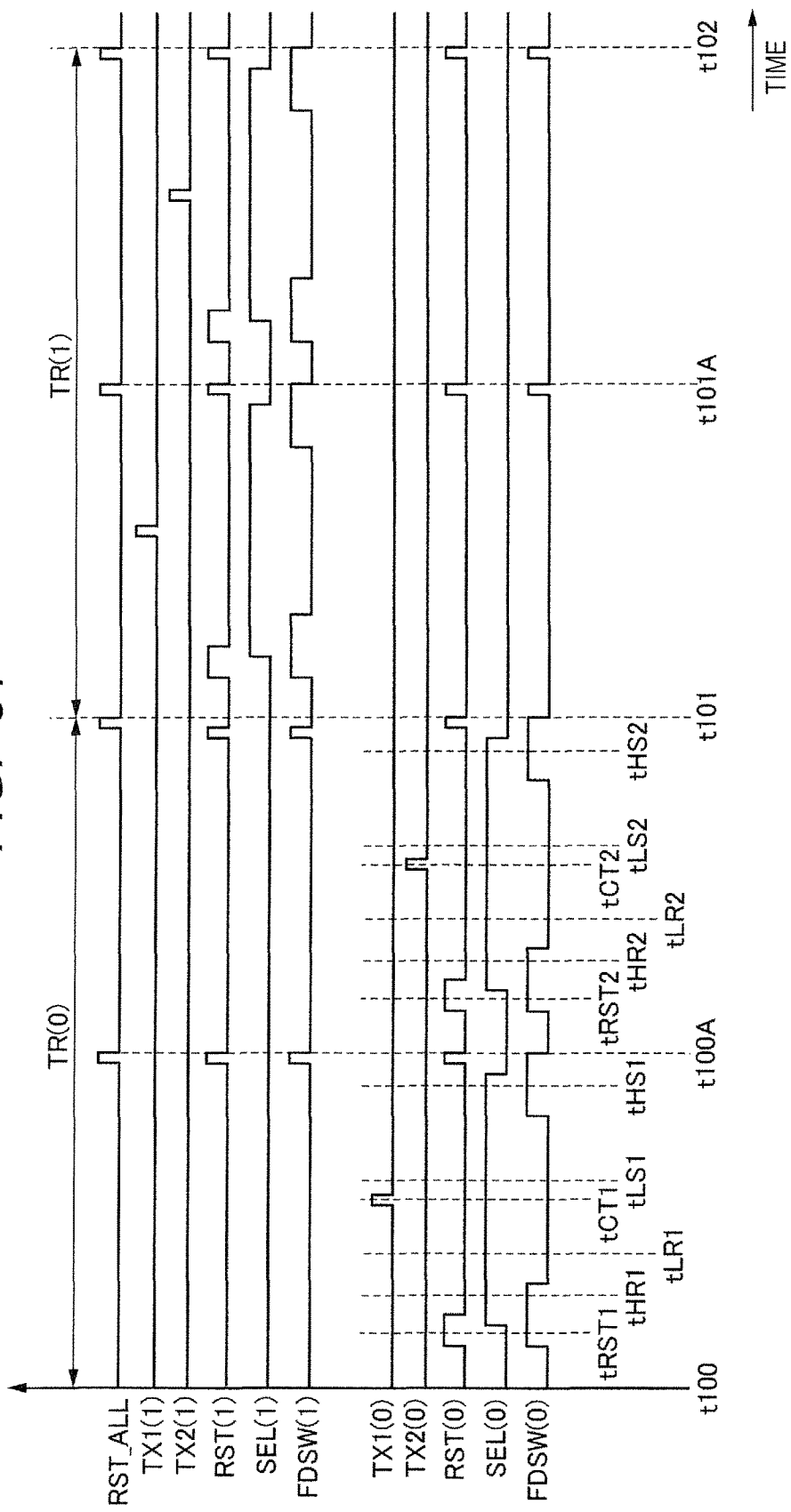
FIG. 31 is a timing chart for explaining reading operation of each pixel unit in an imaging device obtained by assembling a reset transistor of the fourth embodiment to the sixth embodiment.

FIG. 31 is a timing chart for explaining reading operation of each pixel unit in an imaging device obtained by assembling the reset transistors of the fourth embodiment to the sixth embodiment. As described in FIG. 18, just before the first half of the read period TR(i) (where 0≤i≤16) is finished and just before the latter half is finished, the vertical scanning circuit 2 outputs a one-shot pulse as the all reset signal RST_ALL, outputs a one-shot pulse to the control signal lines RST(0) to RST(16), and outputs a one-shot pulse to the control signal lines FDSW except for the i-th row. During this period, the control signal lines FDSW(i) are maintained at the H level.

By the above control, just before the first half and the latter half of each of the read periods are finished, residual charges in all of the FD coupling lines FDCL(0) to FDCL (17) and all of the floating diffusion FD can be promptly ejected via the top reset transistor MRST_T(x) and the bottom reset transistor MRST_B(x). As a result, high-speed operation can be realized.

Although the present invention achieved by the inventors herein has been concretely described on the basis of the embodiments, obviously, the present invention is not limited to the foregoing embodiments and can be variously changed without departing from the gist.

The invention claimed is:

1. An imaging device comprising a plurality of pixel units arranged along a first direction,
    wherein each of the pixel units includes
    one or plural photoelectric converting elements and
    a charge accumulation part to which charges generated by the one or plural photoelectric converting elements are transferred,
    wherein the imaging device further comprises
    a plurality of coupling switching units provided in correspondence with at least apart of the plurality of pixel units and each having first to third nodes, and
    a plurality of coupling lines coupled via the plurality of coupling switching units and extending in the first direction,
    wherein the first node is coupled to the charge accumulation part in the corresponding pixel unit,
    wherein the second and third nodes are coupled to the adjacent coupling lines, and
    wherein each of the coupling switching units is configured to electrically couple or electrically isolate the first to third nodes in response to a control signal.

2. The imaging device according to claim 1, further comprising an output signal line extending in the first direction,
    wherein each of the pixel units further includes:
    one or plural transfer transistors corresponding to the one or plural photoelectric converting elements and each coupled between the corresponding photoelectric converting element and the charge accumulation part;
    an amplification transistor for amplifying voltage of the charge accumulation part; and
    a selection transistor coupled between the amplification transistor and the output signal line.

3. The imaging device according to claim 2, wherein the plurality of coupling switching units are provided for the plurality of pixel units, respectively, and
    wherein each of the pixel units further includes a reset transistor coupled between the coupling line coupled to the second node and a power supply node.

4. The imaging device according to claim 3, further comprising a vertical scanning circuit controlling the coupling switching unit, the one or plural transfer transistors, the selection transistor, and the reset transistor by a plurality of control signal lines extending in a second direction which crosses the first direction,
    wherein before charges accumulated in the photoelectric converting element to be read are transferred to the charge accumulation part via a corresponding transfer transistor, in a state the first to third nodes of the coupling switching unit are electrically coupled, the vertical scanning circuit sets the reset transistor to an on state, thereby performing a reset process of ejecting the charges accumulated in the charge accumulation part.

5. The imaging device according to claim 4, wherein the imaging device has first and second operation modes,
    wherein in the first operation mode, after the reset process, in a state where the first to third nodes of the coupling switching unit are electrically isolated, the vertical scanning circuit transfers charges accumulated in the photoelectric converting element to be read to the charge accumulation part via the corresponding transfer transistor, and outputs a voltage level of the charge accumulation part after the transfer to the output signal line via the selection transistor, and wherein in the second operation mode, after the reset process, in a state where the first to third nodes of the coupling switching unit are electrically coupled, the vertical scanning circuit transfers charges accumulated in the photoelectric converting element to be read to the charge accumulation part via the corresponding transfer transistor, and outputs a voltage level of the charge accumulation part after the transfer to the output signal line via the selection transistor.

6. The imaging device according to claim 4, wherein the vertical scanning circuit outputs, after the reset process, a first noise level of the charge accumulation part to the output signal line via the selection transistor in a state where the first to third nodes of the coupling switching unit are electrically coupled, after that, outputs a second noise level of the charge accumulation part to the output signal line via the selection transistor in a state where the first to third nodes of the coupling switching unit are electrically isolated, after that, transfers charges accumulated in the photoelectric converting element to be read to the charge accumulation part via a corresponding transfer transistor in a state where the first to third nodes of the coupling switching unit are electrically isolated and outputs a first voltage level of the charge accumulation part after the transfer to the output signal line via the selection transistor, and after that, outputs a second voltage level of the charge accumulation part to the output signal line via the selection transistor in a state where the first to third nodes of the coupling switching unit are electrically coupled.

7. The imaging device according to claim 6, further comprising a column circuit coupled to the output signal line, wherein the column circuit includes
a first A/D converting circuit A/D (Analog to Digital) converting the first noise level and the second voltage level and
a second A/D converting circuit A/D converting the second noise level and the first voltage level.

8. The imaging device according to claim 1, further comprising first and second all reset transistors coupled between ends of coupling lines at both ends of the plurality of coupling lines and a power supply node.

9. The imaging device according to claim 1, wherein a pixel unit which is not provided with the plurality of coupling switching units includes a switching transistor for coupling the charge accumulation part and any one of the plurality of coupling lines.

10. The imaging device according to claim 1, wherein the coupling switching unit includes
a first switching transistor coupled between the first and second nodes and
a second switching transistor coupled between the second and third nodes, and wherein a control electrode of the first switching transistor and a control electrode of the second switching transistor are mutually coupled.

11. The imaging device according to claim 10, wherein the coupling switching unit further includes a third switching transistor coupled between the first and third nodes, and wherein a control electrode of the third switching transistor is electrically mutually coupled to the control electrodes of the first and second switching transistors.

12. The imaging device according to claim 10, wherein the coupling switching unit includes
a first switching transistor coupled between the first and second nodes and
a second switching transistor coupled between the first and third nodes, and wherein a control electrode of the first switching transistor and a control electrode of the second switching transistor are mutually coupled.

13. The imaging device according to claim 3, wherein the imaging device is formed on a semiconductor substrate, wherein each of the pixel units includes, as the one or plural photoelectric converting elements, first and second photodiodes, the first and second photodiodes are arranged so as to be lined in the first direction, wherein the charge accumulation part is arranged between the first and second photodiodes, wherein the coupling switching unit is arranged adjacent to the charge accumulation part in a second direction crossing the first direction, wherein the amplification transistor is arranged on the side opposite to the coupling switching unit while sandwiching the charge accumulation part, and wherein the reset transistor and the selection transistor are arranged so as to be lined in the second direction on the side opposite to the charge accumulation part while sandwiching the second photodiode.

14. The imaging device according to claim 13, wherein the coupling switching unit includes
a first impurity region also used as the charge accumulation part and constructing the first node,
a second impurity region constructing the second node,
a third impurity region constructing the third node, and
a gate electrode formed so as to cover gaps among the first to third impurity regions.

15. An imaging device comprising:
a plurality of pixel units arranged along a first direction,
a plurality of first switching transistors provided in correspondence with at least a part of the plurality of pixel units; and
a plurality of coupling lines coupled via the plurality of first switching transistors and extending in the first direction, wherein each of the pixel units includes
one or plural photoelectric converting elements,
a charge accumulation part to which charges generated by the one or plural photoelectric converting elements are transferred, and
a second switching transistor coupling the charge accumulation part and any of the plurality of coupling lines, and wherein a control electrode of each of the first switching transistor is coupled to a control electrode of the second switching transistor provided for a corresponding pixel unit.

* * * * *